US009971215B2

(12) United States Patent
Hara et al.

(10) Patent No.: US 9,971,215 B2
(45) Date of Patent: May 15, 2018

(54) DISPLAY DEVICE

(71) Applicant: Sharp Kabushiki Kaisha, Osaka-shi, Osaka (JP)

(72) Inventors: Kengo Hara, Osaka (JP); Yoshihito Hara, Osaka (JP); Yukinobu Nakata, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days. days.

(21) Appl. No.: 15/035,263

(22) PCT Filed: Jul. 30, 2014

(86) PCT No.: PCT/JP2014/070029
§ 371 (c)(1),
(2) Date: May 9, 2016

(87) PCT Pub. No.: WO2015/075972
PCT Pub. Date: May 28, 2015

(65) Prior Publication Data
US 2016/0291366 A1    Oct. 6, 2016

(30) Foreign Application Priority Data

Nov. 21, 2013    (JP) ................................ 2013-241045

(51) Int. Cl.
*G02F 1/1345*    (2006.01)
*G02F 1/1368*    (2006.01)
(Continued)

(52) U.S. Cl.
CPC .......... *G02F 1/1345* (2013.01); *G02F 1/1339* (2013.01); *G02F 1/1368* (2013.01);
(Continued)

(58) Field of Classification Search
CPC ............. G02F 1/1345; G02F 1/133345; G02F 1/1339; G02F 1/13439; G02F 1/1368
See application file for complete search history.

(56) References Cited

U.S. PATENT DOCUMENTS 5,835,177 A * 11/1998 Dohjo ................... G02F 1/1345
257/59
6,049,365 A *  4/2000 Nakashima ........... G02F 1/1345
349/139
(Continued)

FOREIGN PATENT DOCUMENTS

JP    2010-134428 A    6/2010
JP    2010-164653 A    7/2010
(Continued)

OTHER PUBLICATIONS

Official Communication issued in International Patent Application No. PCT/JP2014/070029, dated Oct. 14, 2014.

*Primary Examiner* — James Dudek
(74) *Attorney, Agent, or Firm* — Keating & Bennett, LLP

(57) ABSTRACT

A liquid crystal panel includes an array substrate, a row control circuit, a first trace, a second trace, a gate insulating film, and an organic insulating film. The array substrate $11b$ includes a display area and a non-display area. The row control circuit is arranged in the non-display area. The first trace is a component of the row control circuit. The second trace is a component of the row control circuit and arranged over the first trace so as to cross the first trace. The gate insulating film is arranged between the first trace and the second trace. The organic insulating film includes a hole formed in an area that overlaps at least crossing portions of the first trace and the second trace. The organic insulating film is made of organic resin.

19 Claims, 34 Drawing Sheets

(51) Int. Cl.
    *G02F 1/1333*     (2006.01)
    *G02F 1/1339*     (2006.01)
    *G02F 1/1343*     (2006.01)
    *H01L 27/12*     (2006.01)

(52) U.S. Cl.
    CPC .... G02F 1/13439 (2013.01); G02F 1/133345 (2013.01); H01L 27/124 (2013.01); *G02F 2202/10* (2013.01); *H01L 27/1225* (2013.01)

(56) References Cited

U.S. PATENT DOCUMENTS

| | | |
|---|---|---|
| 2002/0074549 A1 | 6/2002 | Park et al. |
| 2010/0134745 A1 | 6/2010 | Lee et al. |
| 2013/0027648 A1 | 1/2013 | Moriwaki |
| 2015/0131041 A1* | 5/2015 | Moriwaki ............. G02F 1/1337 349/106 |

FOREIGN PATENT DOCUMENTS

| | | |
|---|---|---|
| JP | 2011-34105 A | 2/2011 |
| WO | 2011/129065 A1 | 10/2011 |

* cited by examiner

DISPLAY DEVICE

TECHNICAL FIELD

The present invention relates to a display device.

BACKGROUND ART

A liquid crystal panel that is a main component of a known liquid crystal display device has the following configuration. The liquid crystal panel includes a pair of glass substrates and liquid crystals that are sandwiched between the glass substrates and sealed with a sealing member provided around the liquid crystals. The substrates are an array substrate and a CF substrate. TFTs that are switching components, pixel electrodes, and traces are formed on the array substrate. Color filters are formed on the CF substrate. A liquid crystal panel disclosed in Patent Document 1 has been known as an example of such a liquid crystal panel.

RELATED ART DOCUMENT

Patent Document

Patent Document 1: Japanese Unexamined Patent Application Publication No. 2010-164653

Problem to be Solved by the Invention

A monolithic circuit section including a gate driver circuit is formed in a non-display area of the array substrate in Patent Document 1 around a display area that is for displaying images. The circuit section is located closer to the sealing member than the TFTs disposed in the display area. If moisture that exits outside the sealing member passes through the sealing member, the circuit section is more likely to be subject to the moisture. Specifically, at crossing portions of traces which cross other traces via an insulating film in the circuit section, electric fields are created when the traces are conducted. If metal ions are generated at the crossing portions due to the moisture, the metal ions may move under the influence of the electric field, that is, an ion migration (electrochemical migration) may occur. If the ion migration occurs, a short circuit may occur between the traces at the crossing portion and thus operation reliability of the circuit section may decrease. Specifically in a liquid crystal panel that includes a narrowed frame, a non-display area and an area in which the circuit section is arranged are narrow and thus distribution density of the traces is high. Due to the high distribution density of the traces, the ion migration is more likely to occur between the traces at the crossing portion.

DISCLOSURE OF THE PRESENT INVENTION

The technology disclosed in this description was made in view of the above circumstances. An object is to improve operation reliability.

Means for Solving the Problem

A display device according to the technology described herein includes a substrate, a circuit, a first trace, a second trace, an insulating film, and an organic insulating film. The substrate includes a display area and a non-display area. The display area is for displaying images and located in a central portion of the substrate. The non-display area is located in an outer portion of the substrate and surrounds the display area. The circuit is arranged in the non-display area. The first trace is a component of the circuit. The second trace is a component of the circuit arranged over the first trace so as to cross the first trace. The insulating film is arranged between the first trace and the second trace. The organic insulating film is arranged over the second trance and includes a hole in an area overlapping at least crossing portions of the first trace and the second trace. The organic insulating film is made of organic resin.

In the circuit, the first trace and the second trace arranged over the first trace are arrange so as to cross each other via the insulating film. When the traces are electrically conducted, an electric field is generated around the crossing portion. The non-display area is located in the outer area of the substrate and surrounds the display area in the central portion of the substrate. Therefore, in comparison to the display area, the circuit arranged in the non-display area is subject to moisture that exists outside. In the circuit, the organic insulating film made of organic resin is arranged over the second trace. The organic resin tends to absorb moisture. Therefore, metal ions may be produced at the crossing portion, at which the traces cross each other, due to the moisture in the organic insulating film. The metal ions may be attracted by the electric fields and move, that is, so-called ion migration (or electrochemical migration) may occur. In some cases, short circuits may occur among crossing portions. If the frame of the liquid crystal panel 11 is further narrowed and the non-display areas and the area in which the circuit is arranged are reduced or the definition is further improved, the distribution density of the traces and increases. Therefore, the ion migration is more likely to occur at the crossing portions of the traces. Because the organic insulating film includes the hole formed in the area that overlaps the crossing portion at which the first trace and the second trace crosses each other, the moisture contained in the organic insulating film is less likely to affect the crossing portion of the traces. Therefore, the ion migration is less likely to occur at the crossing portions of the traces and thus the short circuit is less likely to occur between the crossing portions. According to the configuration, a malfunction of the circuit is less likely to occur and thus the operation reliability thereof improves. This is preferable for the display device with the frame that is further narrowed or with the definition that is further improved.

Preferable embodiments of the display device may include the following configurations.

(1) The hole of the organic insulating film is formed in an area larger than the area that overlaps at least the crossing portion. In comparison to a configuration in which the hole is formed in an area that overlaps only the crossing portion of the traces, a distance from an opening edge of the hole in the organic insulating film to the crossing portion of the traces is larger. Therefore, the moisture contained in the organic insulating film is less likely to affect the crossing portion of the traces. Furthermore, even if a position at which the hole is formed in the organic insulating film is shifted due to a production matter, the misalignment can be compensated. Therefore, the organic insulating film is less likely to overlap the crossing portion and the hole is more likely to be formed in the area that overlaps the crossing portion of the traces. According to the configuration, the ion migration is less likely to occur at the crossing portions of the traces and thus the operation reliability of the circuit further improves.

(2) At least one of the first trace and the second trace may include a plurality of traces such that crossing portions are arranged at intervals. The hole of the organic insulating film may be formed in an area that covers at least a plurality of the crossing portions. Because the opening edges of the hole collectively surround the crossing portions arranged at intervals, the organic insulating film does not exist among the crossing portions. Therefore, even if the moisture is contained in the organic insulating film, the moisture is less likely to affect the crossing portions. Furthermore, even if the hole is formed in the organic insulating film at a shifted position due to a production matter and portions of the opening edges of the hole overlap the crossing portions, the overlaps are small. According to the configuration, the ion migration is less likely to occur at the crossing portions of the traces. Therefore, the operation reliability of the circuit further improves.

(3) At least one of the first trace and the second trace may include a plurality of traces such that at least three crossing portions are arranged at intervals. The hole of the organic insulating film may include at least a first hole and a second hole. The first hole may be formed in an area that covers at least two crossing portions arranged at the interval that is relatively small and the second hole may be formed in an area that covers at least two crossing portions arranged at the interval that is relatively large and not overlapping the first hole. Because the opening edges of the first hole in the organic insulating film collectively surround two crossing portions that are at the interval that is relatively small, the organic insulating film does not exist between the crossing portions. Even if the moisture is contained in the organic insulating film, the moisture is less likely to affect the crossing portions arranged at the interval that is relatively small. Furthermore, even if the hole is formed in the organic insulating film at a shifted position due to a production matter and portions of the opening edges of the first hole overlap the crossing portions arranged at the arrangement interval that is relatively small, the overlaps are small. According to the configuration, the ion migration is less likely to occur at the crossing portions arranged at the interval that is relatively small. Therefore, the reliability of the circuit further improves. Furthermore, because the organic insulating film includes the second holes each formed in the area that overlaps the crossing portions arranged at the interval that is relatively large, and so as not to overlap the first hole, the organic insulating film exists between the crossing portions, the arrangement interval of which is relatively large. According to the configuration, the organic insulating film is less likely to be excessively removed and thus the functions of the organic insulating film for flattening and protecting the traces are less likely to decrease.

(4) A counter substrate opposed to the substrate, liquid crystals sandwiched between the substrate and the counter substrate, and a sealing member provided between the substrate and the counter substrate, surrounding the liquid crystals, and sealing the liquid crystals may be included. The circuit is arranged closer to the sealing member than to the display area. The liquid crystals that are sandwiched between the substrate and the counter substrate are sealed with the sealing member that surrounds the liquid crystals. Because the circuit is arranged closer to the sealing member than the display area, if the moisture passes through the sealing member, the circuit is subject to the moisture. As described above, the organic insulating film includes the hole formed in the area that overlaps the crossing portions of the first traces and the second traces. Therefore, even if the moisture that has passed the sealing member is absorbed by the organic insulating film, the moisture is less likely to affect the crossing portions of the traces and thus the ion migration is less likely to occur at the crossing portions. According to the configuration, the malfunction of the circuit is less likely to occur.

(5) A first interlayer insulating film arranged between the organic insulating film and the second trace and in an area that overlaps at least the hole may be included. Because the crossing portions of the second trace which cross the first trace are covered with the first interlayer insulating film. Therefore, waterproof performance (moisture resistance) at the crossing portions improves. According to the configuration, the ion migration is less likely to occur at the crossing portions of the traces and thus the operation reliability of the circuit further improves.

(6) A transparent electrode film arranged over the organic insulating film in an area that overlaps at least the hole may be included. Because the crossing portions of the second trace which cross the first trace are covered with the second transparent electrode film in addition to the first interlayer film, the waterproof performance at the crossing portions further improves. According to the configuration, the ion migration is further less likely to occur at the crossing portions of the traces and thus the operation reliability of the circuit further improves.

(7) The transparent electrode film may include a first transparent insulating film and a second transparent insulating film. The first transparent insulating film is in a lower layer and the second transparent insulating film is in an upper layer. A second interlayer insulating film arranged between the first transparent electrode film and the second transparent electrode film and in an area that overlaps at least the hole may be included. Because the crossing portions of the second trace which cross the first trace are covered with the first transparent electrode film, the second interlayer insulating film, and the second transparent electrode film in addition to the first interlayer insulating film, the waterproof performance at the crossing portions further improves. According to the configuration, the ion migration is further less likely to occur at the crossing portions of the traces and thus the operation reliability of the circuit further improves.

(8) A protective film arranged between the second trace and the insulating film and in an area that overlaps at least the hole may be included. In addition to the insulating film, the protective film is arranged between the crossing portions of the first trace and the second trace. Therefore, the short circuit due to the ion migration is further less likely to occur at the crossing portions and thus the operation reliability of the circuit further improves.

(9) The first trace and the second trace contain at least copper. In comparison to a configuration that contains aluminum, the first trace and the second trace that contain copper have higher electric conductivity but they are subject to corrosion due to the moisture. As described earlier, the organic insulating film includes the hole in the area that overlaps the crossing portions of the first trace and the second trace. Therefore, the moisture contained in the organic insulating film is less likely to affect the crossing portions of the traces and thus the ion migration is less likely to occur at the crossing portions of the traces. According to the configuration, the operation reliability of the circuit is maintained at a high level while the traces have preferable electric conductivities.

(10) A thin film transistor using an oxide semiconductor for a semiconductor film thereof may be included. The circuit may include the semiconductor film arranged between the second trace and the insulating film. The oxide semiconductor, from which the semiconductor film is formed, has higher electron mobility in comparison to an amorphous semiconductor. Therefore, when circuit components are formed from the semiconductor film for the circuit, the circuit components can have various functions. This configuration is preferable for adding various functions to the circuit.

(11) The oxide semiconductor may contain indium (In), gallium (Ga), zinc (Zn), and oxygen (O). This configuration is preferable for adding various functions to the circuit.

Advantageous Effect of the Invention

According to the technology described herein, the operation reliability improves.

MODE FOR CARRYING OUT THE INVENTION

First Embodiment

Figure 1:
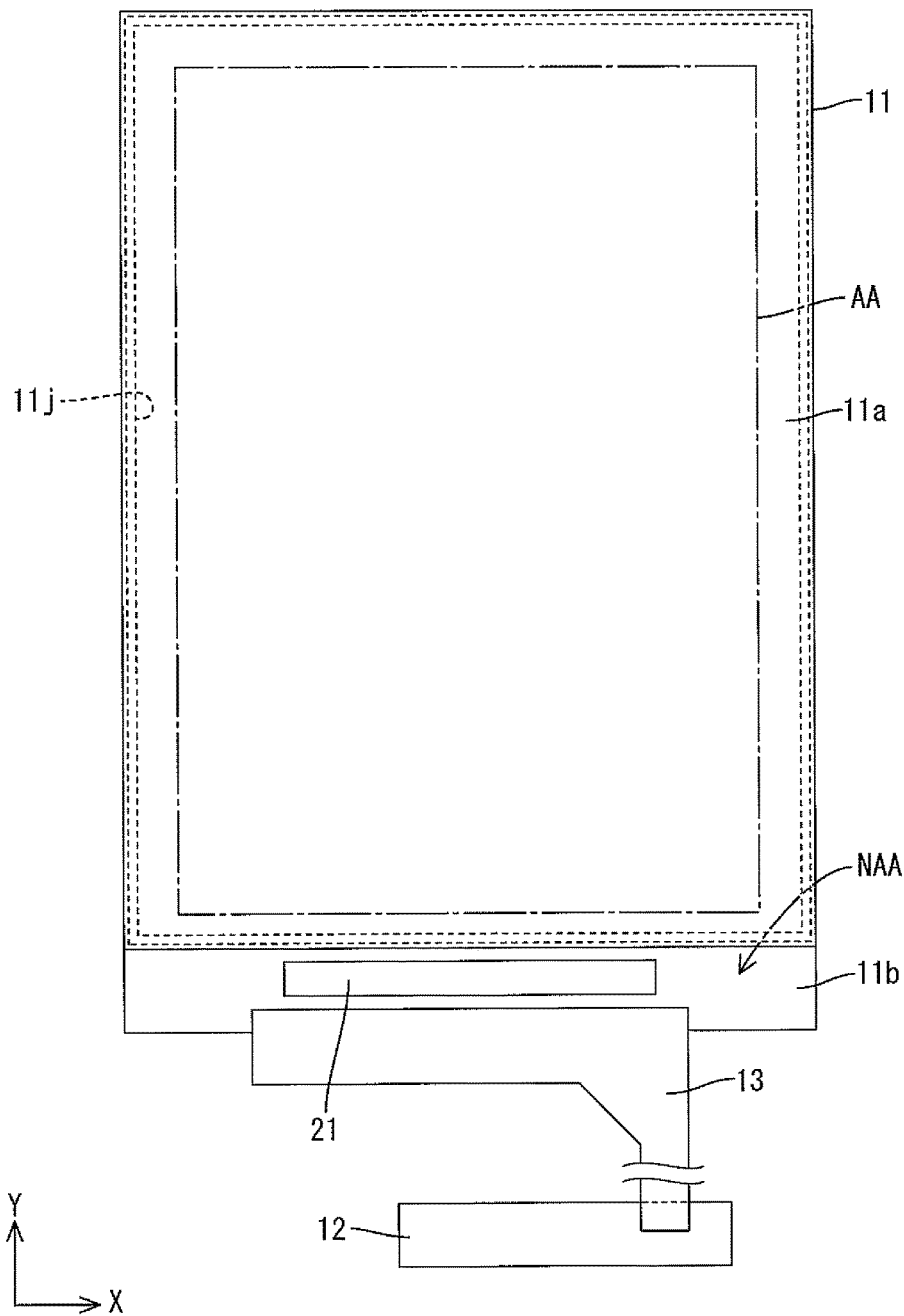
FIG. 1 is a schematic plan view illustrating connection among a liquid crystal panel on which a driver is mounted, a flexible board, and a control circuit board according to a first embodiment of the present invention.

A first embodiment will be described with reference to FIGS. 1 to 11. X-axes, Y-axes, and Z-axes may be present in the drawings. The axes in each drawing correspond to the respective axes in other drawings. The Y-axis direction corresponds to a vertical direction in FIGS. 2 to 4. An upper side in FIGS. 2 to 4 corresponds to a front side of the liquid crystal display device 10. A lower side in FIGS. 2 to 4 corresponds to a rear side of the liquid crystal display device 10.

Figure 2:
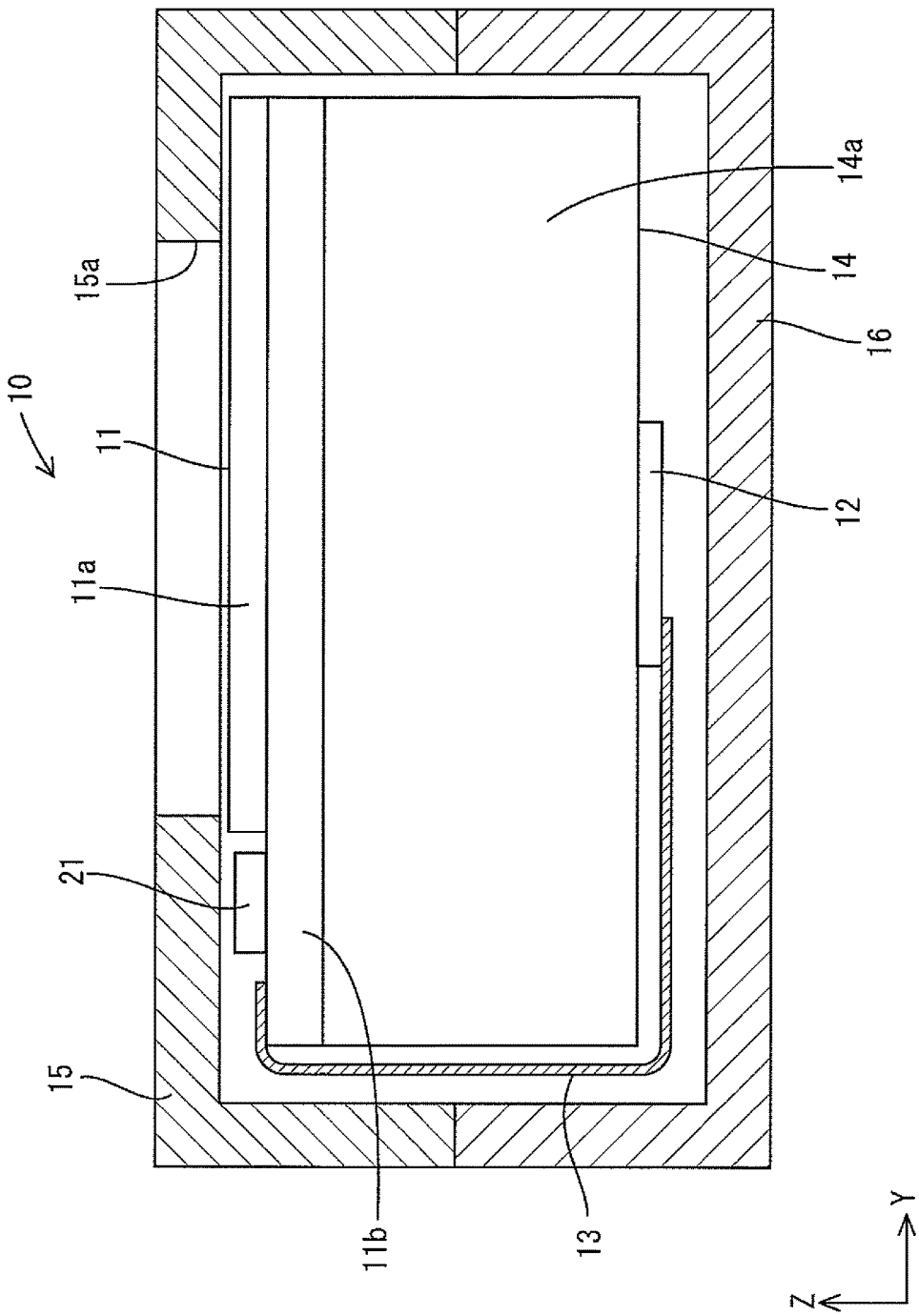
FIG. 2 is a schematic cross-sectional view illustrating a cross-sectional configuration along a long-side direction of a liquid crystal display device.

As illustrated in FIGS. 1 and 2, the liquid crystal display device 10 includes a liquid crystal panel (a display device, a display panel) 11, a control circuit board (an external signal supply) 12, a driver (a panel driver) 21, a flexible printed circuit board (an external connecting member) 13, and a backlight unit (a lighting unit) 14. The liquid crystal panel 11 includes a display area AA and non-display areas NAA. The display area AA is configured to display images and arranged in an inner portion of the liquid crystal panel 11. The non-display area NAA is arranged in an outer portion of the liquid crystal panel 11 so as to surround the display area AA. The driver is for driving the liquid crystal panel 11. The control circuit board 12 is for supplying various input signals from the outside to the driver 21. The flexible circuit board 13 is for electrically connecting the liquid crystal panel 11 to the external control circuit board 12. The backlight unit 14 is an external light source for supplying light to the liquid crystal panel 11. The liquid crystal display device 10 further includes exterior components 15 and 16 used in a pair of front and rear. The exterior component 15 in front includes a hole 15a so that images displayed in the display area AA of the liquid crystal panel 11 are viewable from the outside. The liquid crystal display device 10 according to this embodiment is for various kinds of electronic devices (not illustrated) including mobile phones (including smartphones), notebook computers (including tablet computers), handheld terminals (including electronic book readers and PDAs), digital photo frames, portable video game players, and electronic papers. Therefore, a screen size of the liquid crystal panel 11 of the liquid crystal display device 10 is in a range from some inches to ten and some inches, that is, the size commonly categorized as small size or small-to-mid size.

The backlight unit 14 will be described. As illustrated in FIG. 2, the backlight unit 14 includes a chassis 14a, light sources that are not illustrated, and an optical member that are not illustrated. The chassis 14a has a box-like shape with an opening on the front side (a liquid crystal panel 11 side). The light sources (e.g., cold cathode tubes, LEDs, and organic ELs) are disposed inside the chassis 14a. The optical member is disposed over the opening of the chassis 14a. The optical member has a function for converting light from the light sources into planar light.

Figure 5:
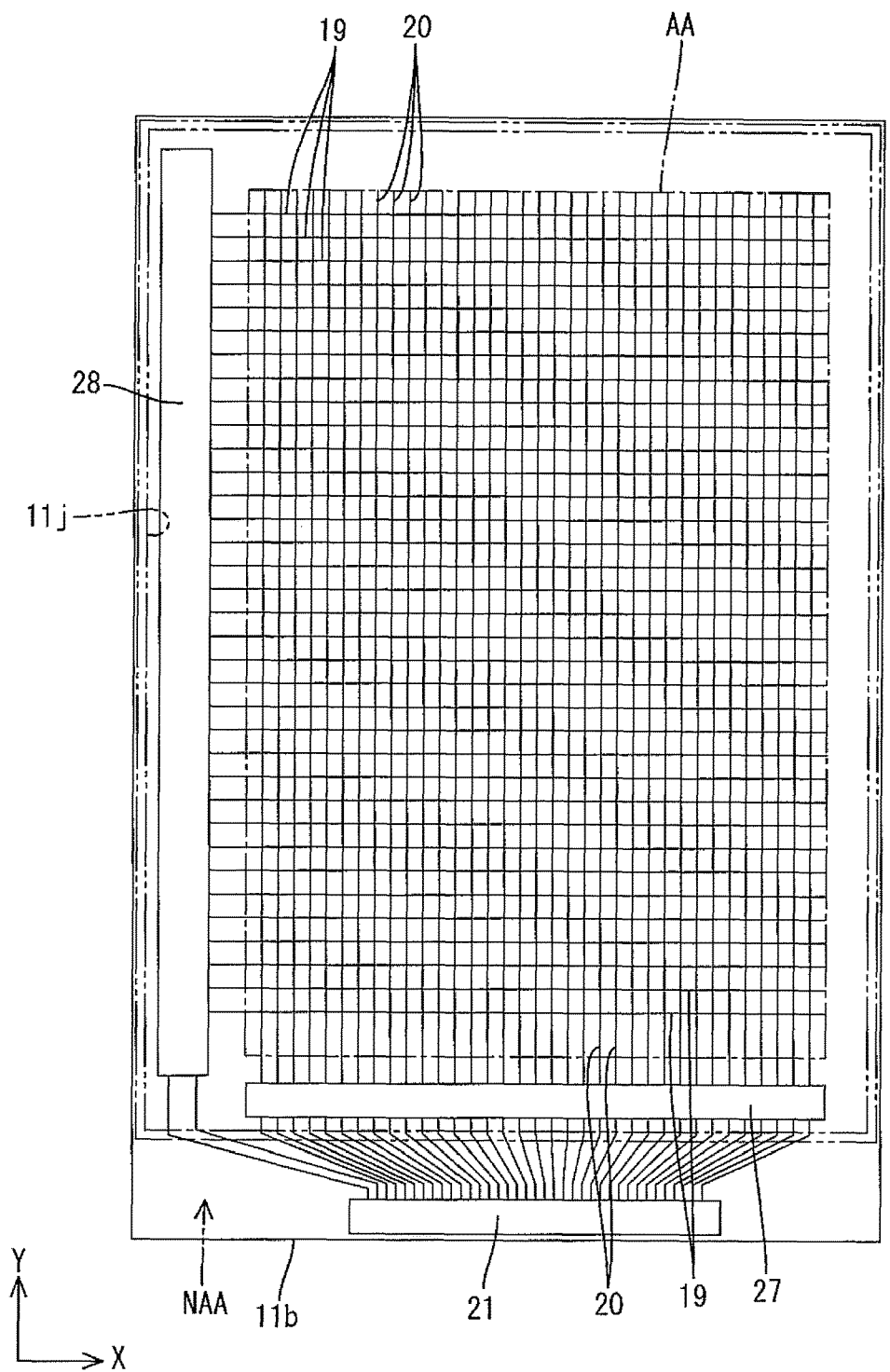
FIG. 5 is a plan view schematically illustrating a wiring configuration of the array substrate that is a component of the liquid crystal panel.
Figure 6:
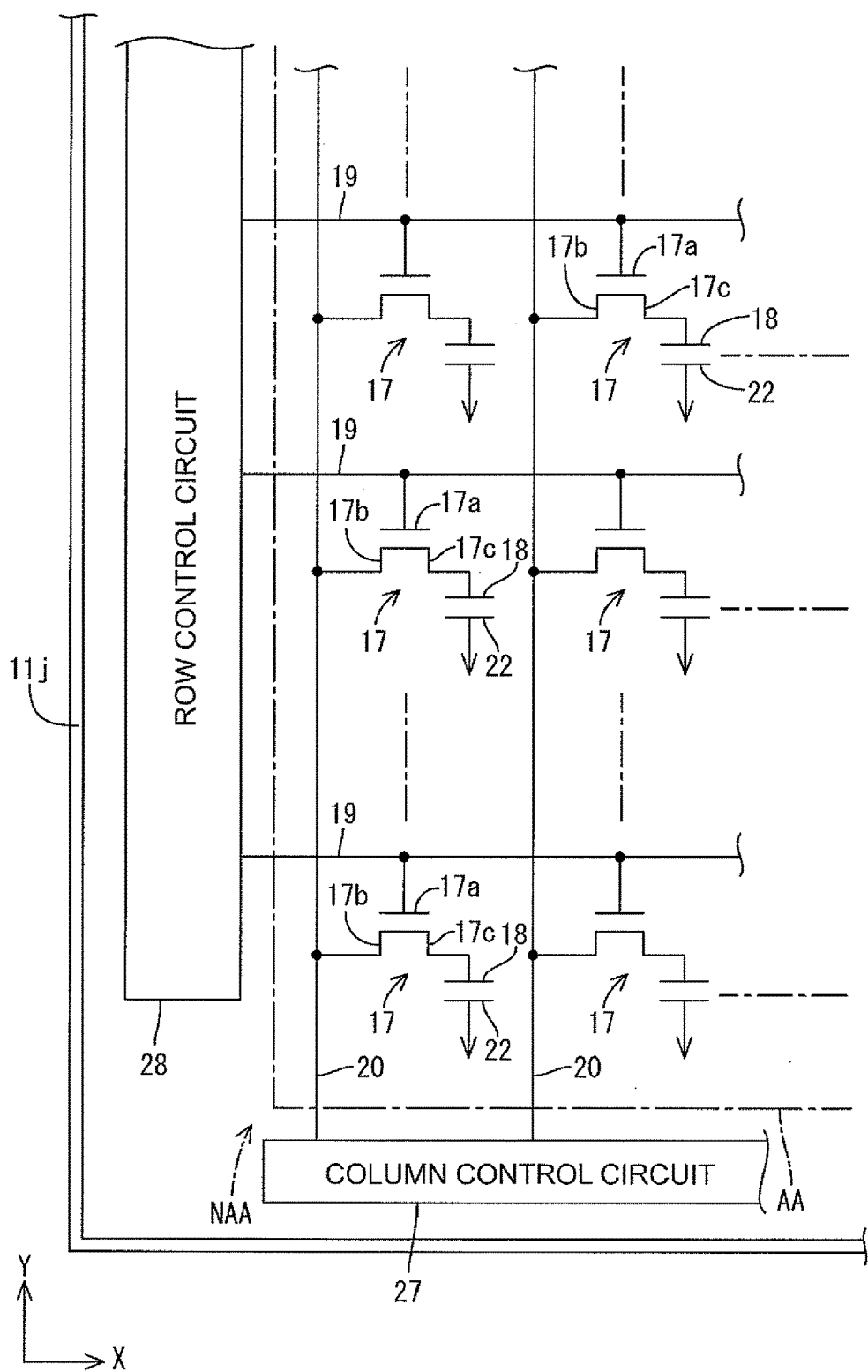
FIG. 6 is a plan view illustrating a wiring configuration for connecting a row control circuit and a column control circuit arranged in a non-display area to TFTs arranged in the display area.

Next, the liquid crystal panel 11 will be described. As illustrated in FIG. 1, the liquid crystal panel 11 has a vertically-long quadrilateral (or rectangular) overall shape. The display area (an active area) AA is arranged off-centered to one of edges at an end of a long dimension of the liquid crystal panel 11 (on the upper side in FIG. 1). The driver 21 and the flexible circuit board 13 are mounted to a portion of the liquid crystal panel 11 closer to an edge at the other end of the long dimension of the liquid crystal panel 11 (on the lower side in FIG. 1). Areas of the liquid crystal panel 11 outside the display area AA are the non-display areas (non-active areas) NAA in which images area not displayed. The non-display areas NAA include a frame-shaped area and an edge area. The frame-shape area surrounds the display area AA (a frame portion of the CF substrate 11a, which will be described later). The edge area is a reserved area closer to the other edge of the long dimension of the liquid crystal panel 11 (a portion of the array substrate 11b that does not overlap the CF substrate 11a, which will be described later). The reserved area includes a mounting area (an attachment area) to which the driver 21 and the flexible circuit board 13 are mounted. A width (or a frame width) of three sections of the frame-shaped non-display area of the liquid crystal panel 11 other than the mounting area for the driver 21 and the flexible circuit board 13 (non-mounting area end portions), more specifically, a linear distance from an outer edge of a glass substrate GS to an outer edge of the display area AA is equal to or smaller than 1.9 mm, more preferably, equal to or smaller than 1.3 mm. Namely, the liquid crystal panel 11 has a narrow frame structure including a significantly narrow frame. A short-side direction of the liquid crystal panel 11 corresponds to the X-axis direction in each drawing and a long-side direction of the liquid crystal panel 11 corresponds to the Y-axis direction in each drawing. In FIGS. 1, 5 and 6, a boxed chain line slightly smaller than the CF substrate 11a indicates an outer boundary of the display area AA and the areas outside the chain line are the non-display areas NAA.

Next, components connected to the liquid crystal panel 11 will be described. As illustrated in FIGS. 1 and 2, the control circuit board 12 is mounted to the back surface of the chassis 14a of the backlight unit 14 (an outer surface far from the liquid crystal panel 11) with screws. The control circuit board 12 includes a substrate made of paper phenol of glass epoxy resin and electronic components for supplying various kinds of input signals to the driver 21 are mounted on the substrate. Furthermore, traces routed in predefine pattern (electrically conducting paths), which are not illustrated, are formed on the substrate. One of ends (one end) of the flexible circuit board 13 is electrically and mechanically connected to the control circuit board 12 via an anisotropic conductive film (ACF), which is not illustrated.

As illustrated in FIG. 2, the flexible circuit board (an FPC board) 13 includes a base made of synthetic resin having insulating properties and flexibility (e.g., polyimide resin) and multiple traces (not illustrated) formed on the base. As described earlier, one of ends of the flexible circuit board 13 at an end of a length direction thereof is connected to the control circuit board 12 disposed on the back surface of the chassis 14a. The other end of the flexible circuit board 13 (another end) is connected to the array board 11b of the liquid crystal panel 11. Therefore, the flexible circuit board 13 is folded in the liquid crystal display device 10 such that a cross-sectional shape is substantially U shape. The traces are exposed to the outside at the ends of the flexible circuit board 13 at the ends of the length direction and provides as terminals (not illustrated). The terminals are electrically connected to the control circuit board 12 and the liquid crystal panel 11. According to the configuration, the input signals supplied by the control circuit board 12 are transmitted to the liquid crystal panel 11.

As illustrated in FIG. 1, the driver 21 is an LSI chip including a drive circuit therein. The driver 21 is configured to operate based on signals supplied by the control circuit board 12 that is a signal source for processing the input signals supplied by the control circuit board 12 that is a signal source, generate output signals, and transmit the output signals to the display area AA of the liquid crystal panel 11. The driver 21 has a horizontally-long rectangular shape in a plan view (a longitudinal shape along the short edge of the liquid crystal panel 11) and is directly mounted on the liquid crystal panel 11 (the array substrate 11b, which will be described later) in the non-display area AA, that is, through chip-on-glass (COG) mounting. A long-side direction of the driver 21 corresponds to the X-axis direction (the short-side direction of the liquid crystal panel 11) and a short-side direction thereof corresponds to the Y-axis direction (the long-side direction of the liquid crystal panel 11).

Figure 3:
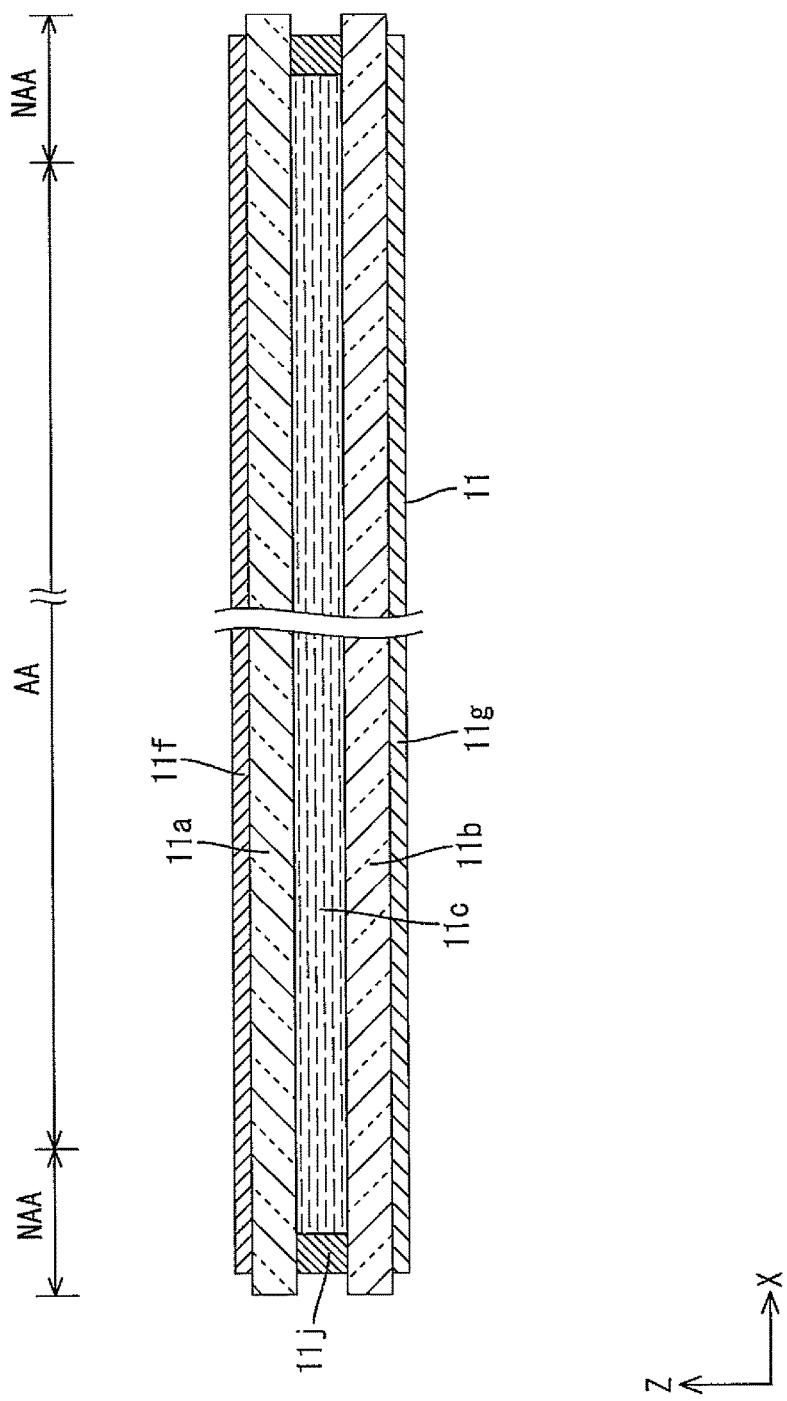
FIG. 3 is a schematic cross-sectional view illustrating a cross-sectional configuration of an entire liquid crystal panel.

The liquid crystal panel 11 will be described once again. As illustrated in FIG. 3, the liquid crystal panel 11 includes at least a pair of substrates 11a and 11b, a liquid crystal layer (liquid crystals) 11c, a sealing member 11j. The liquid crystal layer 11c between the substrates 11a and 11b and includes liquid crystal molecules that are substances having optical characteristics that change according to application of electric field. The sealing member 11j between the substrates 11a and 11b seals the liquid crystal layer 11c while a size of a gap between the boards 11a and 11b is maintained at the thickness of the liquid crystal layer 11c. One of the substrates 11a and 11b at the front is the CF substrate (a counter substrate) 11a and one at the rear is the array substrate (a substrate) 11b. The sealing member 11j is disposed in the non-display area NAA of the liquid crystal panel 11. The sealing member 11j has a vertically-long frame-like shape along the non-display area NAA in a plan view (in a direction normal to a plate surface of the array board 11b) (FIG. 2). Portions of the sealing member 11j disposed on three edge portions of the liquid crystal panel 11 (non-mounting edge portions) other than the mounting area for the driver 21 and the flexible circuit board 13 are located at the outermost of the non-display area NAA (FIG. 2). Polarizing plates 11f and 11g are attached to outer surfaces of the substrates 11a and 11b, respectively.

Figure 4:
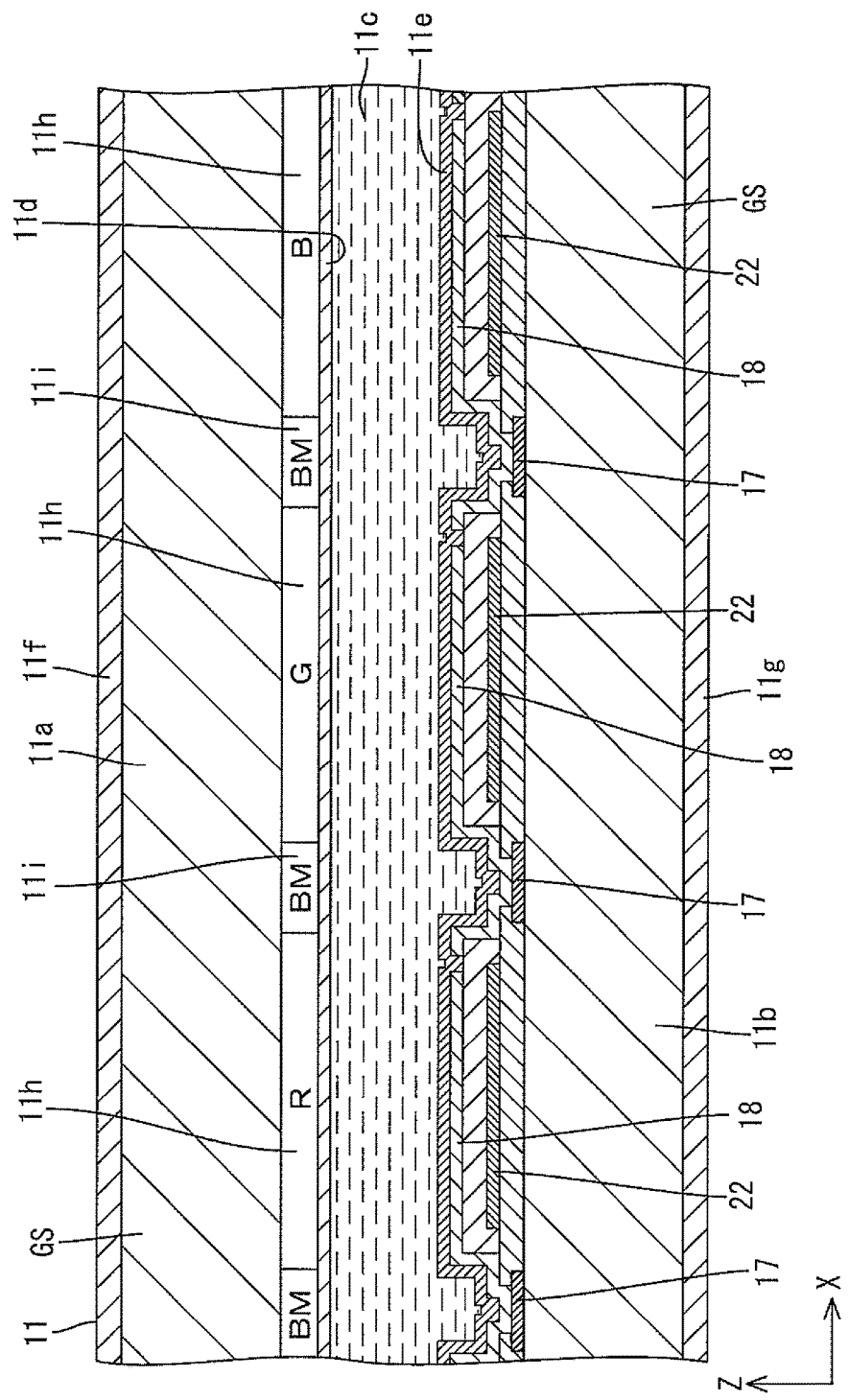
FIG. 4 is a schematic cross-sectional view illustrating a cross-sectional configuration of a display area of the liquid crystal panel.

The liquid crystal panel 11 according to this embodiment operates in fringe field switching (FFS) mode that is an operation mode further improved from an in-plane switching (IPS) mode. As illustrated in FIG. 4, the liquid crystal panel 11 includes pixel electrodes (second transparent electrodes) 18 and a common electrode (a first transparent electrode) 22, which will be described later, formed on the array substrate 11b that is one of the substrates 11a and 11b. The pixel electrodes 18 and the common electrode 22 are formed in different layers. The CF substrate 11a and the array substrate 11b include glass substrates GS that are substantially transparent (having high light transmissivity) and various kinds of films formed in layers on the glass substrates GS. As illustrated in FIGS. 1 and 2, the CF substrate 11a has a short dimension substantially equal to that of the array substrate 11b and a long dimension smaller than that of the array substrate 11b. The CF substrate 11a is bonded to the array substrate 11b with one of edges at an end of the long-side direction (on the upper side in FIG. 1) aligned with that of the array substrate 11b. A predefined portion of the array board 11b adjacent to the other edge at the other end of the long-side direction (on the lower side in FIG. 1) does not overlap the CF substrate 11a, that is, front and back plate surfaces of the array substrate 11b are exposed to the outside. The mounting area for the driver 21 and the flexible circuit board 13 is provided in this portion. Alignment films 11d and 11e for alignment of the liquid crystal molecules included in the liquid crystal layer 11c are formed on inner surfaces of the substrates 11a and 11b.

Figure 8:
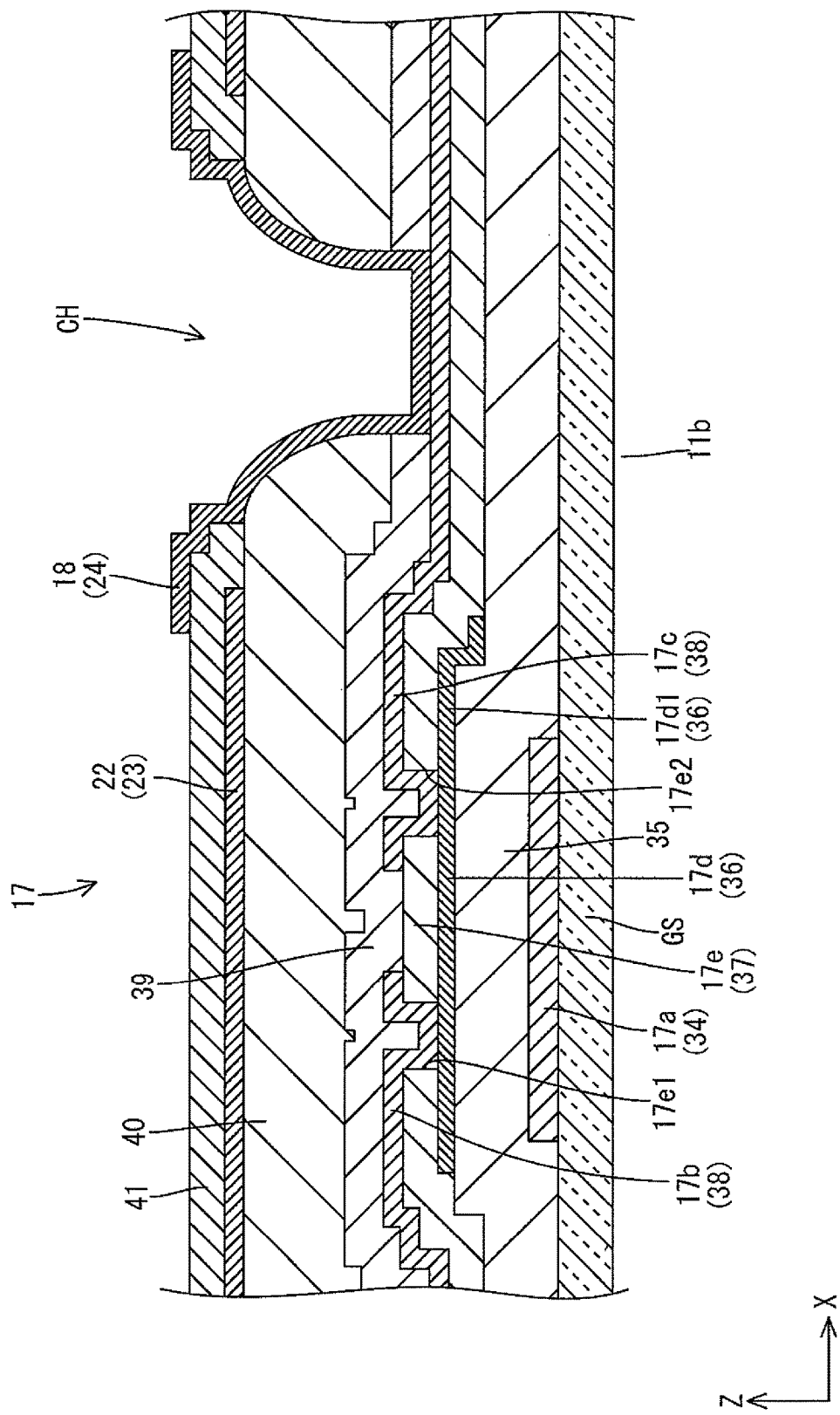
FIG. 8 is a cross-sectional view along line vii-vii in FIG. 7.

Various kinds of films formed in layers on the inner surface of the array substrate 11b (on the liquid crystal layer 11c side, a surface opposed to the CF substrate 11a) using a known photolithography method will be described. As illustrated in FIG. 8, on the array substrate 11b, a first metal film (a gate metal film) 34, a gate insulating film (an insulating film) 35, a semiconductor film 36, a protective film (an etching stopper film, an ES film) 37, a second metal film (a source metal film) 38, a first interlayer insulating film 39, an organic insulating film 40, a first transparent electrode film 23, a second interlayer insulating film 41, a second transparent electrode film 24, and the alignment film lie are formed in layers in this sequence from the lower layer side (the glass substrate GS side).

The first metal film 34 is a multilayered film of titanium (Ti) and copper (Cu). In comparison to a multilayered configuration of titanium and aluminum (Al), the first metal film has lower wiring resistance and proper electric conductivity. The gate insulating film 35 is layered over at least the first metal film 34. The gate insulating film 35 is made of silicon oxide ($SiO_2$), which is an inorganic material. The semiconductor film 36 is layered over the gate insulating film 35. The semiconductor film 36 is a thin film using an oxide semiconductor. The oxide semiconductor of the semiconductor film 36 is an In—Ga—Zn—O semiconductor (indium gallium zinc oxide) which contains indium (In), gallium (Ga), zinc (Zn), and oxygen (O). The In—Ga—Zn—O semiconductor is a ternary oxide of indium (In), gallium (Ga), and zinc (Zn) and a ratio (a composition ratio) of In, Ga, and Zn is not limited to a specific ratio. For example, the ratio may be: In:Ga:Zn=2:2:1, In:Ga:Zn=1:1:1, or In:Ga:Zn=1:1:2. This embodiment includes the In—Ga—Zn—O semiconductor containing In, Ga, and Zn in the ratio of 1:1:1.

The protective film 37 is layered over at least the semiconductor film 36 and made of silicon oxide ($SiO_2$), which is an inorganic material. The second metal film 38 is layered over the protective film 37. The second metal film 38 is a multilayered film of titanium (Ti) and copper (Cu). In comparison to a multilayered structure of titanium and aluminum (Al), the second metal film has lower wiring resistance and proper electric conductivity. The first interlayer insulating film 39 is layered over at least the second metal film 38 and made of silicon oxide ($SiO_2$), which is an inorganic material. The organic insulating film 40 is layered over the first interlayer insulating film 39 and made of acrylic resin (e.g., polymethylmethacrylate resin (PMMA)), which is an organic resin material. The organic resin material of the organic insulating film 40 has photosensitivity. Therefore, in a production process of the array substrate 11b, the organic insulating film 40 is patterned using a known photolithography method. The first transparent electrode film 23 is layered over the organic insulating film 40 and made of transparent electrode material such as indium tin oxide (ITO) and zinc oxide (ZnO). The second interlayer insulating film 41 is layered over at least the first transparent electrode film 23 and made of silicon nitride ($SiN_x$), which is an inorganic material. The second transparent electrode film 24 is layered over the second interlayer insulating film 41 and made of transparent electrode material such as indium tin oxide (ITO) and zinc oxide (ZnO). The alignment film 11e is layered over at least the second transparent electrode film 24 so as to face the liquid crystal layer 11c.

The alignment film 11e is a photo-alignment film made of polyimide to which a beam of light in a specific wavelength range (e.g., ultraviolet ray) is applied in a production process and configured so that the liquid crystal molecules can be aligned along a direction in which the beam of light is applied. The organic insulating film 40 among the insulating films 37 and 39 to 41 has a thickness larger than those of the inorganic insulating films 37, 39 and 41. The organic insulating film 40 functions as a planarization film. The gate insulating film 35, the protective film 37, the first interlayer insulating film 39, and the second interlayer insulating film 41 among the insulating films 37 and 39 to 41 except for the organic insulating film 40 are inorganic insulating films made of inorganic material having thicknesses smaller than that of the organic insulating film 40. The insulating films 37 and 39 to 41 are formed on the array substrate 11b for about entire area as solid patterns (with openings in some areas). The first metal film 34, the semiconductor film 36, and the second metal film 38 are formed in predefined patterns in the display area AA and the non-display areas NAA of the array substrate 11b.

Figure 7:
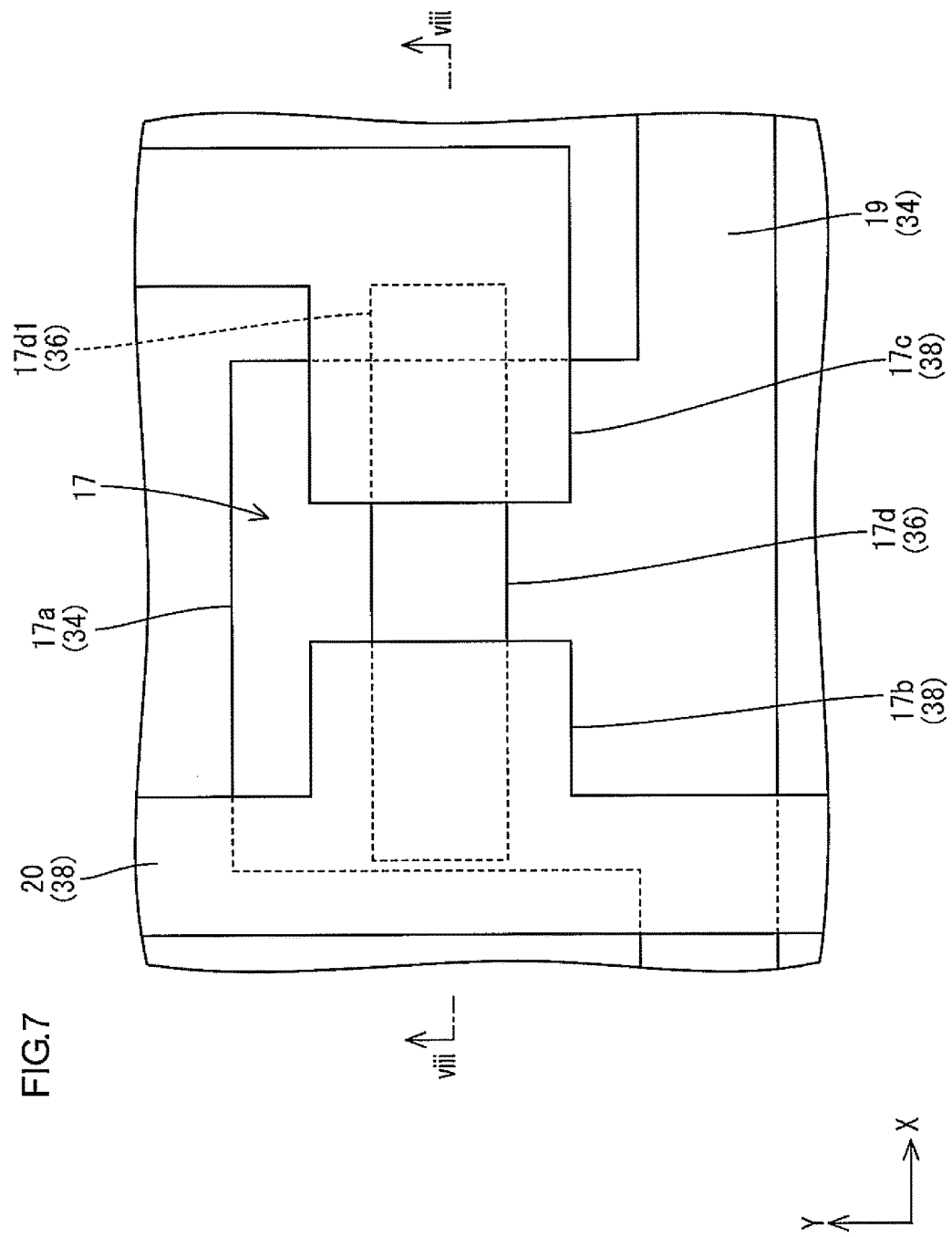
FIG. 7 is a plan view illustrating a planar configuration of the TFT.

Next, the components in the display area AA will be described in detail. As illustrated in FIGS. 6 and 7, in the display area AA of the array substrate 11b, display area TFTs (thin film transistors) 17, which are switching components, for the pixel electrodes 18 are arranged in a matrix. Gate lines (scanning lines, row control lines) 19 and source lines (column control lines, data lines) 20 are formed in grid patterns so as to surround the display area TFTs and the pixel electrodes 18. Namely, the display area TFTs and the pixel electrodes 18 are arranged at crossing portions of the gate lines 19 and the source lines 20 formed in grid patterns so as to form a matrix. The gate lines 19 are formed from the first metal film 34 and the source lines are formed from the second metal film 38. The gate insulating film 35 and the protective film 37 are arranged at crossing portions of the gate lines 19 and the source lines 20. The gate lines 19 and the source lines 20 are connected to the gate electrodes 17a and the source electrodes of the respective display area TFTs. The pixel electrodes 18 are connected to the drain electrodes 17c of the respective display area TFTs (FIG. 8). As illustrated in FIG. 7, the gate electrodes 17a are branches that branch off from the gate lines 19, which linearly extend along the X-axis direction, and project along the Y-axis direction. The source electrodes 17b are branches that branch off from the source lines 20, which linearly extend along the Y-axis direction, and project along X-axis direction.

As illustrated in FIG. 8, each display area TFT 17 includes the gate electrode 17a, a channel 17d, a protective portion 17e, the source electrode 17b, and the drain electrode 17c. The gate electrode 17a is formed from the first metal film 34. The channel 17d is formed from the semiconductor film 36 and overlaps the gate electrode 17a in a plan view. The protective portion 17e is formed from the protective film 37 and includes two channel holes 17e1 and 17e2 that are through holes at positions overlapping the channel 17d in a plan view. The source electrode 17b is formed from the second metal film 38 and connected to the channel 17d through the channel hole 17e1 of the channel holes 17e1 and 17e2. The drain electrode 17c is formed from the second metal film 38 and connected to the channel 17d through the other channel hole 17e2 of the channel holes 17e1 and 17e2. The channel 17d extends along the X-axis direction and bridges the source electrode 17b and the drain electrode 17c to allow charge transfer between the electrodes 17b and 17c. The source electrode 17b and the drain electrode 17c are opposed to each other in a direction in which the channel 17d extends (the X-axis direction) with a predefined gap therebetween.

As illustrated in FIG. 7, the gate electrode 17a is configured so as to branch off from the gate line 19. An area in which the gate electrode 17a overlaps about an entire area of the source electrode in a plan view and a portion of the drain electrode 17c (adjacent to a portion connected to the channel 17d) in a plan view. In comparison to a configuration in which an area in which the gate electrode is formed overlaps about an entire area of the drain electrode 17c in a plan view, a parasitic capacitance among the gate electrode 17a and the source electrode 17b, the drain electrode 17c, the channel 17d (hereinafter referred to as the Cgd capacitance) can be reduced and thus a percentage of the Cgd capacitance in a total capacitance of the display electrode decreases. Therefore, the Cgd capacitance is less likely to affect a voltage applied to the pixel electrode 18. This configuration is more preferable for the liquid crystal panel 11 if it is provided with high definition and an area and a total capacitance of the display pixel are reduced. According to the area in which the gate electrode 17a is formed defined as described above, as illustrated in FIGS. 7 and 8, the channel 17d includes an extending portion 17d1. The extending portion 17d1 extends at a position at which the drain electrode 17c is connected in an opposite direction to the source electrode 17b along the X-axis direction (to the right in FIGS. 7 and 8) and includes an end portion (a portion) which does not overlap the gate electrode 17a in a plan view. The semiconductor film 36 from which the channel 17d is formed is an oxide semiconductor film as described earlier. The oxide semiconductor film has electron mobility 20 to 50 times higher than an amorphous silicon thin film. Therefore, the display area TFT 17 can be easily down sized and an amount of the transmitted light of the pixel electrode 18 can be maximized. It is preferable for increasing the definition and reducing power consumption of the backlight unit 14. Furthermore, in comparison to a configuration in which the channel is made of amorphous silicon, with the channel 17d made of the oxide semiconductor, higher turn-off characteristics of the display area TFT 17 are achieved and an off-leak current is about one hundredth, which is significantly small. Therefore, a voltage holding rate of the pixel electrode 18 is high. It is effective for reducing the power consumption of the liquid crystal panel 11. In the display area TFT 17 including such an oxide semiconductor film, the gate electrode 17a is arranged in the lowermost layer and the channel 17d is layered over the gate electrode 17a via the gate insulating film 35. Namely, the TFT 17 is an inverted staggered type having a layer structure similar to a TFT that includes a regular amorphous silicon thin film.

The pixel electrode 18 is formed from the second transparent electrode film 24. The pixel electrode 18 is formed in an area defined by the gate lines 19 and the source lines 20. The pixel electrode 18 has a vertically-long rectangular overall shape in a plan view and a comb-like shape with vertically-long slits that are not illustrated. As illustrated in FIG. 8, the pixel electrode 18 is formed on the second interlayer insulating film 41. The second interlayer insulating film 41 is arranged between the pixel electrode 18 and the common electrode 22, which will be described later. Contact holes CH are formed in the first interlayer insulating film 39, the organic insulating film 40, and the second interlayer insulating film 41 under the pixel electrode 18 at positions at which they overlap the drain electrode 17c so as to extend through from the top to the bottom. The pixel electrode 18 is connected to the drain electrode 17c through the contact holes CH. When a voltage is applied to the gate electrode 17a of the display area TFT 17, current flows between the source electrode 17b and the drain electrode 17c via the channel 17d and a predefined voltage is applied to the pixel electrode 18. The contact holes CH are arranged at a position that does not overlap the gate electrode 17a and the channel 17d that is formed from the semiconductor film 36 in a plan view.

The common electrode 22 is formed in a substantially solid pattern from the first transparent electrode film 23. The common electrode 22 is formed on the array substrate 11b in at least the display area AA. As illustrated in FIG. 8, the common electrode 22 is arranged between the organic insulating film 40 and the second interlayer insulating film 41. A common potential (a reference potential) is applied to the common electrode 22 through a common line that is not illustrated. Therefore, as described earlier, by controlling a potential applied to the pixel electrode 18 by the display area TFT 17, a predefined potential difference is created between the electrodes 18 and 22. When the potential difference is created between the electrodes 18 and 22, a fringe electric field (a lateral electric field) including a component in the direction normal to the plate surface of the array substrate 11b in addition to a component in a direction along the plate surface of the array substrate 11b is applied to the liquid crystal layer 11c through the slits of the pixel electrode 18. Not only the alignment of the liquid crystal molecules included in the liquid crystal layer 11c and existing in the slits but the alignment of the liquid crystal molecules included in the liquid crystal layer 11c and existing on the pixel electrode 18 can be properly altered. According to the configuration, an opening rate of the liquid crystal panel 11 increases and a sufficient amount of transmitted light is achieved. Therefore, high viewing angle performance is achieved. A capacitance line (not illustrated) may be formed on the array substrate 11b. The capacitive line may be parallel to the gate line 19 and cross the pixel electrode 18 so as to overlap via the gate insulating film 35, the protective film 37, the first interlayer insulating film 39, the organic insulating film 40, and the second interlayer insulating film 41.

Next, components on the CF substrate 11a in the display area AA will be described in detail. As illustrated in FIG. 4, color filters 11h are formed on the CF substrate 11a. The color filters 11h include red (R), green (G), and blue (B) color portions arranged in a matrix so as to overlap the pixel electrodes 18 in a plan view. A light blocking layer (a black matrix) 11i is formed among the color portions of the color filters 11h to reduce color mixture. The light blocking layer 11i is arranged so as to overlap the gate lines 19 and the source lines 20 that are described earlier in a plan view. The alignment film 11d for aligning the liquid crystal molecules in the liquid crystal layer 11c is formed on the color filters 11h and the light blocking layer 11i. The alignment film 11d is made of polyimide. In the production process, the alignment film 11d is configured by applying light in a specific wavelength range (e.g., an ultraviolet ray) to be a photo alignment film that enables the alignment of the liquid crystal molecules along the direction in which the light is applied. In the liquid crystal panel 11, the red (R), the green (G), and the blue (B) color portions and three pixel electrodes 18 opposed to three colors of the color portions form one display pixel, which is a unit of display. The display pixel includes a red pixel including the R color portion, a green pixel including the G color portion, and a blue pixel including the B color portion. The display pixels in each color are repeatedly arranged on the plate surface of the liquid crystal panel 11 along the row direction (the X-axis direction) so as to form a group of pixels. Groups of pixels are arranged along the column direction (the Y-axis direction) (FIGS. 4 and 5).

Next, components on the array substrate 11b in the non-display area NAA (outside the display area AA) will be described in detail. As illustrated in FIG. 5, the column control circuit 27 is arranged in a portion of the array substrate 11b in the non-display area adjacent to the short edge of the display area AA and the row control circuit (a circuit) 28 is arranged in a portion of the array substrate 11b in the non-display area adjacent to the long edge of the display area AA. The column control circuit 27 and the row control circuit 28 are configured to control for supplying the output signals from the driver 21 to the display area TFTs. The column control circuit 27 and the row control circuit 28 are monolithic circuits formed on the array substrates 11b with the semiconductor film 36 used as a base similar to the display area TFTs. The column control circuit 27 and the row control circuit 28 include control circuits and circuit components for controlling the supply of the output signals to the display area TFTs. The circuit components of the control circuits include non-display area TFTs (non-display area thin film transistors) which are not illustrated using the semiconductor film 36 for channels. As illustrated in FIGS. 5 and 6, the column control circuit 27 and the row control circuit 28 are arranged closer to the middle of the non-display area NAA than the sealing member 11j, that is, closer to the display area AA. The column control circuit 27 and the row control circuit 28 are arranged closer to the sealing member 11j than the display area TFTs 17. In FIG. 5, the sealing member 11j is indicated by a two-dashed chain line. In FIG. 6, the sealing member 11j is indicated by a solid line. The column control circuit 27 and the row control circuit 28 are patterned on the array substrate 11b through a known photo lithography method simultaneously with the display area TFTs 17 patterned in the production process of the array substrate 11b.

As illustrated in FIG. 5, the column control circuit 27 is arranged adjacent to the short edge of the display area AA on the lower side in FIG. 5, that is, between the display area AA and the driver 21 with respect to the Y-axis direction. The column control circuit 27 is formed in a horizontally-long rectangular area that extends in the X-axis direction. As illustrated in FIGS. 5 and 6, the column control circuit 27 is connected to the source lines 20 arranged in the display area AA. The column control circuit 27 includes a switching circuit (an RGB switching circuit) for distributing image signals included in the output signals from the driver 21 to the source lines 20. Specifically, the source lines 20 are arranged on the array substrate 11b along the X-axis direction and parallel to one another in the display area AA. The source lines 20 are connected to the display area TFTs 17 for the red (R), the green (G), and blue (B) display pixels. The column control circuit 27 is configured to distribute the image signals from the driver 21 to the source lines for R, G, and B using the switching circuit. The column control circuit 27 may include an auxiliary circuit such as a level-shifter circuit and an ESD protection circuit.

As illustrated in FIG. 5, the row control circuit 28 is arranged adjacent to the long edge of the display area AA on the left side in FIG. 5. The row control circuit 28 is formed in a vertically-long rectangular area that extends in the Y-axis direction. As illustrated in FIGS. 5 and 6, the row control circuit 28 is connected to the gate lines 19 arranged in the display area AA. The row control circuit 28 includes a scanning circuit for scanning the gate lines in sequence with the scanning signals included in the output signals from the driver 21 supplied thereto at predefined timing. Specifically, the gate lines 19 are arranged on the array substrate 11b along the Y-axis direction and parallel to one another in the display area. The row control circuit 28 is configured to scan the gate lines 19 using a scanning circuit to supply control signals (scan signals) from the driver 21 to the gate lines 19 in the display area AA in sequence from the gate line 19 at the uppermost in FIG. 5 to the gate line 19 at the lowermost. The scanning circuit included in the row control circuit 28 includes a buffer circuit (not illustrated) connected to the gate lines 19 and configured to amplify the scan signals and to output them to the gate lines 19. The row control circuit 28 may include an auxiliary circuit such as a level-shifter circuit and an ESD protection circuit. The column control circuit 27 and the row control circuit 28 are connected to the driver 21 via connecting lines that are formed on the array substrate 11b. The connecting lines are not illustrated.

Figure 9:
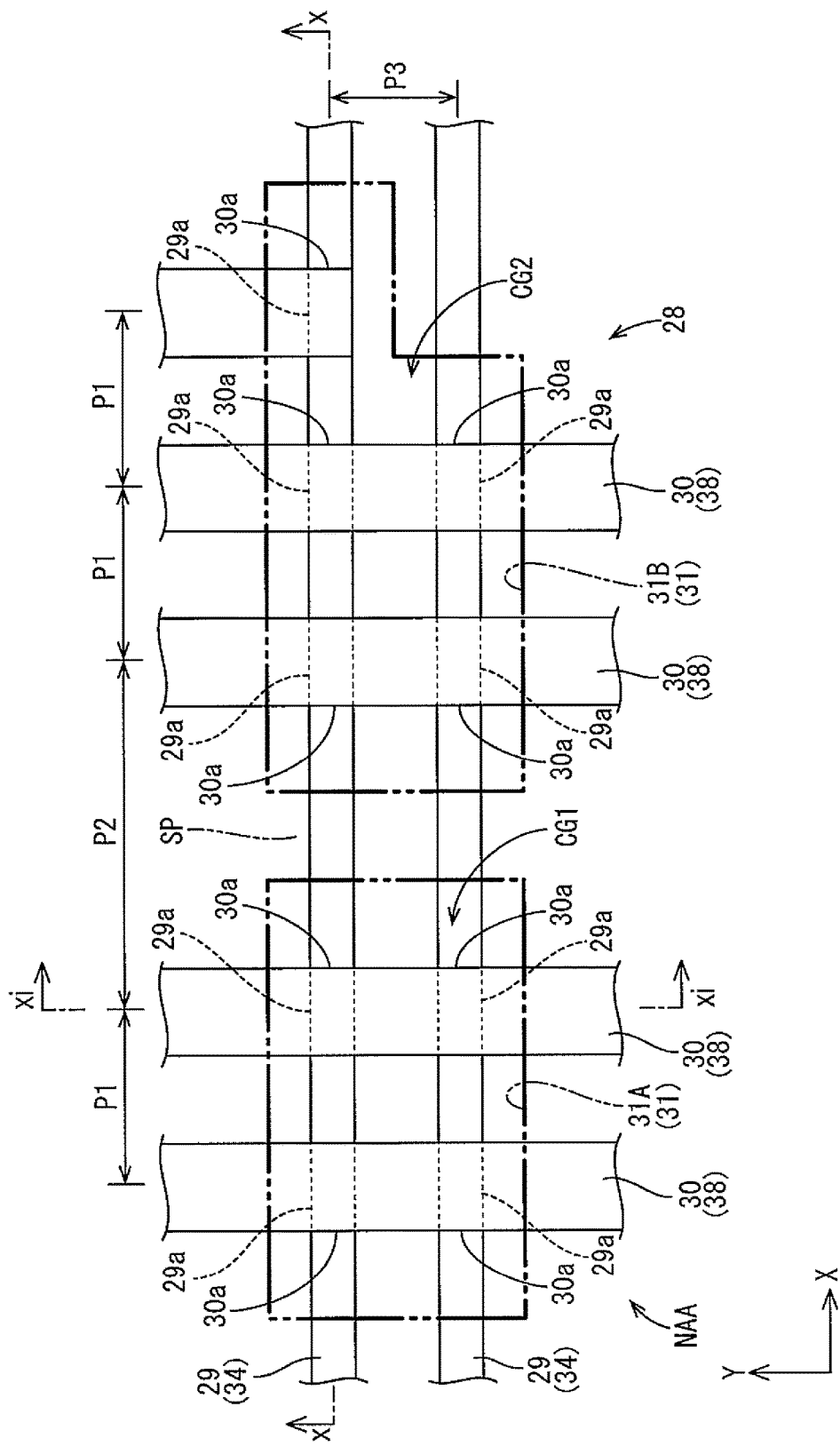
FIG. 9 is a plan view illustrating a layout including first traces and a second trace in the row control circuit and a hole in an organic insulating film.

Next, a wiring layout in a portion of the row control circuit 28 will be described. As illustrated in FIG. 9, the row control circuit 28 includes first traces 29 and second traces 30. The second traces 30 are arranged over the first traces 29 so as to cross the first traces 29. The first traces 29 are arranged inside the row control circuit 28 in the non-display area NAA so as to linearly extend in the X-axis direction similar to the gate lines 19 (see FIGS. 10 and 11). The first traces 29 are formed from the first metal film 34. The first traces 29 are parallel to one another (two traces are illustrated in FIG. 9) with a predefined arrangement interval P3 away from each other in the Y-axis direction. The second traces 30 arranged inside the row control circuit 28 in the non-display area NAA so as to linearly extend in the Y-axis direction similar to the source lines 20 (see FIGS. 10 and 11). The second traces 30 are formed from the second metal film 38. The first traces 29 and the second traces 30 cross so as to be perpendicular to one another. The second traces 30 are parallel to one another (five traces are illustrated in FIG. 5) with a predefined arrangement interval P1 or P2 away from each other in the X-axis direction. The arrangement intervals P1 and P2 among the second traces 30 are two different settings. The arrangement interval P1 between the second traces 30 on the left side in FIG. 9 is about equal to the arrangement intervals P1 among the second traces 30 on the right side in FIG. 9. The arrangement interval P2 between the second trace 30 that is the second from the left edge and the second trace 30 that is the third from the left edge is wider (or larger) than the arrangement interval P1. The arrangement interval P1 between the second traces 30, which is narrower (or smaller), is defined close to the arrangement interval P3 between the first traces 29. A difference between the arrangement intervals P1 and P3 (|P1−P3|) is smaller than a difference between the arrangement interval P1 between the second traces 30, which is smaller, and the arrangement interval P2 between the second traces 30, which is wider (or larger). The second traces 30 except for the second trace 30 at the rightmost in FIG. 9 cross the first traces 29. The second trace 30 at the rightmost in FIG. 9 crosses only the first trace 29 at the uppermost in FIG. 9.

Figure 10:
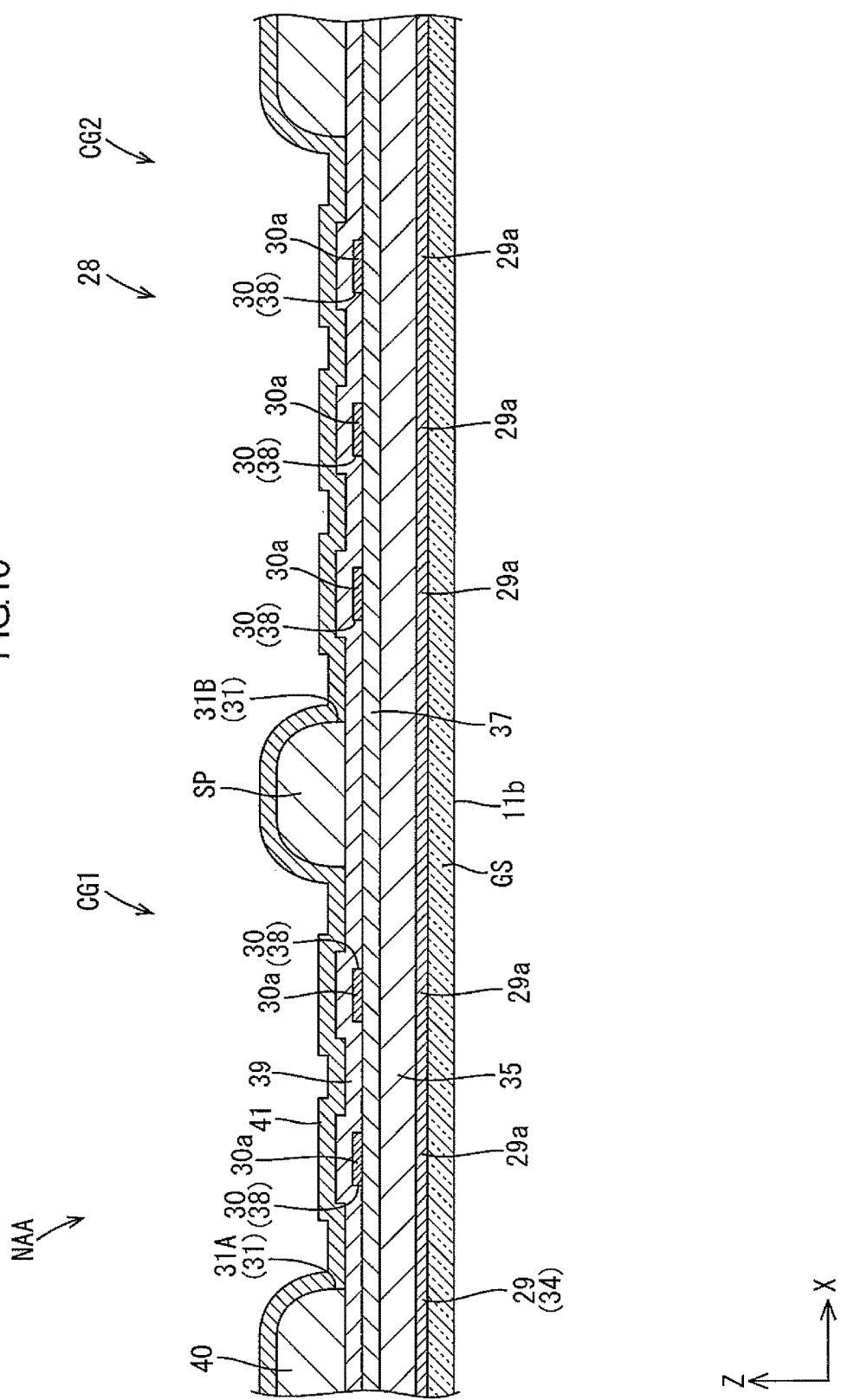
FIG. 10 is a cross-sectional view along line x-x in FIG. 9.
Figure 11:
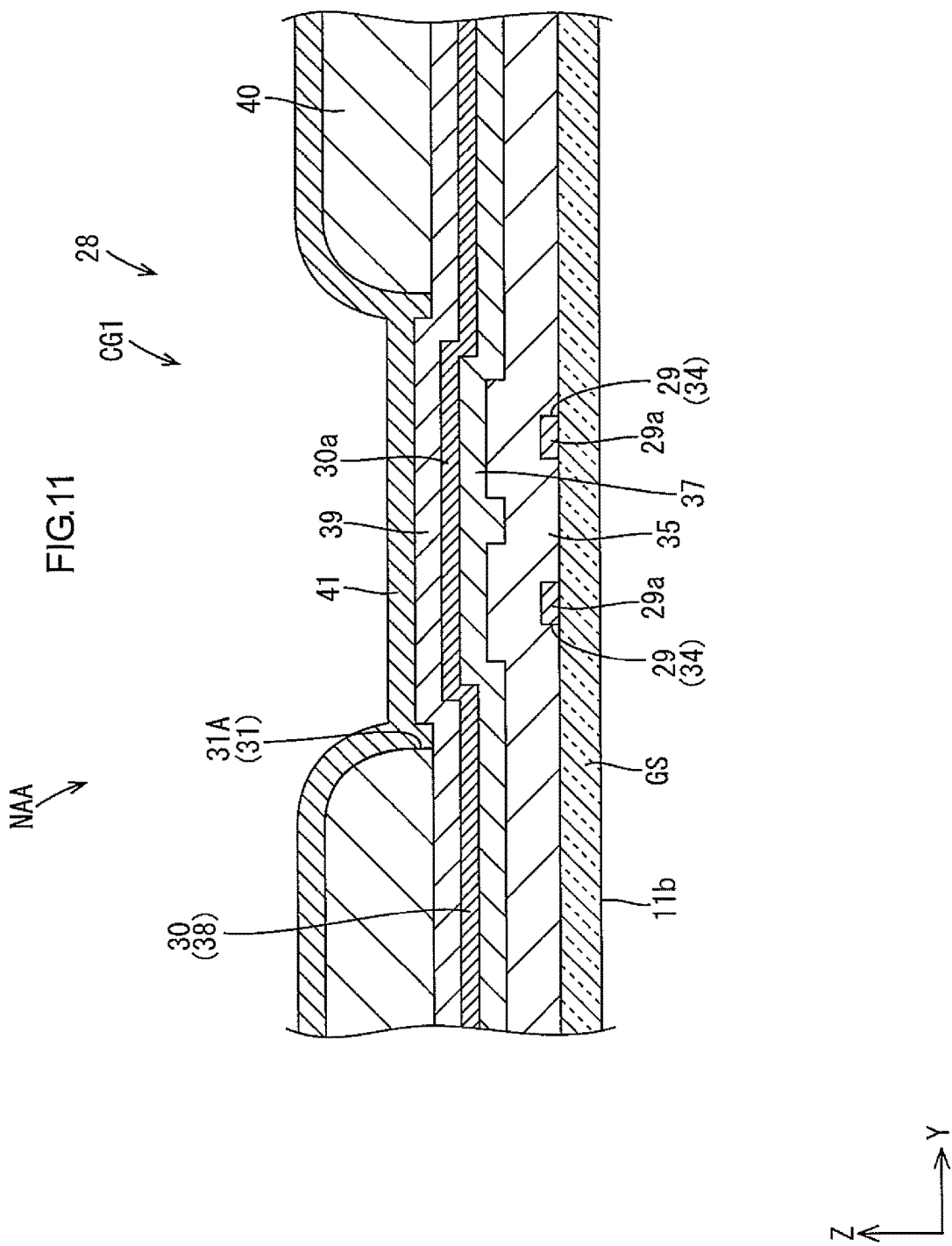
FIG. 11 is a cross-sectional view along line xi-xi in FIG. 9.

As illustrated in FIG. 9, crossing portions 29a and 30a of the first traces 29 and the second traces 30 which cross one another are arranged in a matrix with the predefined arrangement intervals P1 to P3. Specifically, the crossing portions 29a and 30a are arranged at the arrangement intervals P1 and 2 similar to the second traces 30 with respect to the X-axis direction (the direction in which the first traces 29 extend, the direction in which the second traces 30 are arranged) and at the arrangement intervals P3 similar to the first traces 29 with respect to the Y-axis direction (the direction in which the second traces 30 extend, the direction in which the first traces 29 are arranged). Namely, the crossing portions 29a and 30a arranged along the X-axis direction are arranged at two different arrangement intervals P1 and P2. The crossing portions 29a and 30a arranged in a matrix are divided into a group including four crossing portions 29a and four crossing portions 30a in a left area in FIG. 9 (hereinafter referred to as a first crossing portion group CG1) and a group including five crossing portions 29a and five crossing portions 30a in a right area in FIG. 9 (hereinafter referred to as a second crossing portion group CG2) with the arrangement interval P2, which is a relatively large. As illustrated in FIGS. 10 and 11, the gate insulating film 35 and the protective film 37 are arranged between the crossing portions 29a of the first traces 29 and the crossing portions 30a of the second traces 30 with respect to the Z-axis direction (the direction normal to the plate surface of the array substrate 11b) and thus the crossing portions 29a are insulated from the crossing portions 30a. The first interlayer insulating film 39, the organic insulating film 40, and the second interlayer insulating film 41 are layered in this sequence over the second traces 30. FIGS. 9 to 11 illustrate the wiring layout in portions of the row control circuit 28 and wiring layouts in other portions of the row control circuit 28 will be described in detail in the modifications of the first embodiment section that will be provided later.

When the traces 29 and 30 are conducting, electrical fields are produced around the crossing portions 29a and 30a of the first traces 29 and the second traces 30. The portion of the array substrate 11b in the non-display area NAA is arranged on the outer side so as to surround the display area AA on the inner side. Therefore, the row control circuit 28 arranged in the non-display area NAA is more likely to be subject to the moisture that exists outside the row control circuit 28 in comparison to the display area TFTs 17 in the display area AA. In the row control circuit 28, the organic insulating film 40 is layered over the second traces 30. The organic insulating film 40 tends to absorb moisture. If the moisture contained in the organic insulating film 40 is released and the crossing portions 29a and 30a of the traces 29 and 30 are exposed to the moisture, metal ions may be produced around the crossing portions 29a and 30a of the traces 29 and 30 resulting from the moisture. As a result, the metal ions may move under the influence of the electric field, that is, an ion migration (electrochemical migration) may occur. If the ion migration occurs, a short circuit may occur between the crossing portions 29a and 30a. Especially, the liquid crystal panel 11 in this embodiment has the narrow frame and thus the non-display area NAA and the area in which the row control circuit 28 is arranged are narrowed. If the definition is further improved, the distribution density of the traces 29 and 30 may increase. Therefore, the ion migration is more likely to occur at the crossing portions 29a and 30a of the traces 29 and 30.

As illustrated in FIG. 9, the organic insulating film 40 over the second traces 30 includes holes 31 at least in areas that overlap the crossing portions 29a and 30a of the first traces 29 and the second traces 30. Because such holes 31 are formed in the organic insulating film 40, the organic insulating film 40 does not overlap the crossing portions 29a and 30a of the traces 29 and 30 in the areas above the crossing portions 29a and 30a. Even if the organic insulating film 40 contains moisture and the moisture is released therefrom, the moisture is less likely to reach the crossing portions 29a and 30a of the traces 29 and 30. Therefore, the ion migrations is less likely to occur at the crossing portions 29a and 30a of the traces 29 and 30 and thus short circuits are less likely to occur among the crossing portions 29a and 30 of the traces 29 and 30. A malfunction of the row control circuit 28 is less likely to occur, that is, operation reliability improves. This is preferable especially in the liquid crystal panel 11 with the frame that is narrowed or with the definition that is improved. The holes 31 may be formed in a step in which the contact holes CH for the display area TFTs 17 in the display area AA are formed in the organic insulating film 40 in the production process of the array substrate 11b. Specifically, a photo mask used for patterning the organic insulating film 40 by the photo lithography method in the above process includes different patterns. The patterns include a pattern for exposing or blocking light to portions of the organic insulating film 40 in which the contact holes CH are to be formed in the display area AA and a pattern for exposing or blocking light to portions of the organic insulating film 40 in which the holes 31 are to be formed in the non-display area NAA. Next, the holes 31 will be described in detail. In FIG. 9, areas in which the holes 31 are formed, which are viewed in plan (viewed in the direction normal to the plate surface of the array substrate 11b), are indicated by two-dashed chain lines.

As illustrated in FIG. 9, the holes 31 include first holes 31A and second holes 31B. Each first hole 31A is formed in an area that overlaps the first crossing portion group CG1 and each second hole 31B is formed in an area that overlaps the second crossing portion group CG2. The first crossing portion group CG1 and the second crossing portion group CG2 includes the crossing portions 29a and 30a, respectively. The intervals of the crossing portions 29a and 30a with respect to the X-axis direction are relatively small. Namely, the first hole 31A and the second hole 31B of the holes 31 are formed in the areas that cover the crossing portions 29a and 30a arranged at the intervals P1 that are relatively small with respect to the X-axis direction. Among the crossing portions 29a and 30a arranged at the relatively large interval P2 with respect to the X-axis direction, the first hole 31A overlaps the crossing portions 29a and 30a that do not overlap the second hole 31B (the crossing portions 29a and 30a at the second from the left in FIG. 9). Furthermore, the first hole 31A overlaps the crossing portions 29a and 30a that are arranged adjacent to the above crossing portions 29a and 30a with the relatively small interval P1. Among the crossing portions 29a and 30a arranged at the relatively large interval P2 with respect to the X-axis direction, the second hole 31B overlaps the crossing portions 29a and 30a that do not overlap the first hole 31A (the crossing portions 29a and 30a at the third from the left in FIG. 9). Furthermore, the second hole 31B overlaps the crossing portions 29a and 30a that are arranged adjacent to the above crossing portions 29a and 30a with the relatively small intervals P1. The organic insulating film 40 includes a separating portion SP that separates the first hole 31A from the second hole 31B. The separating portion SP that separates the first hole 31A from the second hole 31B is arranged between the crossing portions 29a and 30a arranged at the relatively large interval P2 with respect to the X-axis direction. Namely, the organic insulating film 40 exists between the crossing portions 29a and 30a arranged at the relatively large interval P2 with respect to the X-axis direction. In comparison to a configuration in which all the crossing portions 29a and 30a are collectively surrounded by edges of a hole, the organic insulating film 40 is less likely to excessively removed and thus functions of the organic insulating film 40 for flattening and protecting the traces 29 and 30 are less likely to decrease.

Specifically, as illustrated in FIGS. 9 to 11, the first hole 31A is formed in an area that includes four crossing portions 29a and four crossing portions 30a of the first crossing portion group CG1. The edges of the first hole 31A collectively surrounds the four crossing portions 29a and the four crossing portions 30a of the first crossing portion group CG1. When viewed in plan, in areas among the crossing portions 29a and 30a of the first crossing portion group CG1, the organic insulating film 40 does not exist. According to the configuration, even if moisture is contained in the organic insulating film 40, the moisture is less likely to affect the crossing portions 29a and 30a of the first crossing portion group CG1. Furthermore, even if a position at which the first hole 31A is formed in the organic insulating film 40 is shifted with respect to the X-axis direction or the Y-axis direction due to a production matter, for example, even if portions of the edges of the first hole 31A overlap any of the crossing portions 29a and 30a, the overlaps are small. Therefore, the ion migration is less likely to occur at the crossing portions 29a and 30a of the first crossing portion group CG1 and the operation reliability of the row control circuit 28 further improves.

Furthermore, as illustrated in FIGS. 9 to 11, the first hole 31A is larger than the area that overlaps the crossing portions 29a and 30a of the first crossing portion group CG1. Namely, the edges of the first hole 31A are arranged outer than the first crossing portion group CG1 such that they do not cross (or do not overlap) outer edges of the crossing portions 29a and 30a of the first crossing portion group CG1 in a plan view. In other words, a plan-view area in which the first hole 31A is formed is slightly larger than the first crossing portion group CG1 and extends outside the first crossing portion group CG1. In comparison to a configuration in which an area in which the first hole is formed is within an area that overlaps the crossing portions 29a and 30a of the first crossing portion group CG1, distances between the edges of the first hole 31A to the respective crossing portions 29a and 30a of the first crossing portion group CG1 are larger. Therefore, the moisture contained in the organic insulating film 40 is less likely to affect the crossing portions 29a and 30a of the first crossing portion group CG1. Furthermore, even if a position at which the first hole 31A is formed in the organic insulating film 40 is shifted with respect to the X-axis direction or the Y-axis direction due to a production matter, the misalignment can be compensated. Therefore, the organic insulating film 40 is less likely to overlap the crossing portions 29a and 30a of the first crossing portion group CG1 and the first hole 31A is more likely to be formed in the area that overlaps the crossing portions 29a and 30a of the first crossing portion group CG1. According to the configuration, the ion migration is less likely to occur at the crossing portions 29a and 30a of the first crossing portion group CG1 and thus the operation reliability of the row control circuit 28 further improves. The first hole 31A has a horizontally-long rectangular shape in a plan view.

Specifically, as illustrated in FIGS. 9 to 11, the second hole 31B is formed in an area in which five crossing portions 29a and five crossing portions 30a of the second crossing portion group CG2 are formed. The edges of the second hole 31B collectively surround the five crossing portions 29a and the five crossing portions 30a of the second crossing portion group CG2. When viewed in plan, the organic insulating film 40 does not exist in areas among the crossing portions 29a and 30a of the second crossing portion group CG2. Therefore, even if the moisture is contained in the organic insulating film 40, the moisture is less likely to affect the crossing portions 29a and 30a of the second crossing portion group CG2. Furthermore, even if a position at which the second hole 31B is formed in the organic insulating film 40 is shifted with respect to the X-axis direction or the Y-axis direction due to a production matter, for example, even if portions of the edges of the second hole 31B overlap any of the crossing portions 29a and 30a, the overlaps are small. Therefore, the ion migration is less likely to occur at the crossing portions 29a and 30a of the second crossing portion group CG2 and the operation reliability of the row control circuit 28 further improves.

Furthermore, as illustrated in FIGS. 9 to 11, the second hole 31B is larger than the area that overlap the crossing portions 29a and 30a of the second crossing portion group CG2. Namely, the edges of the second hole 31B are arranged outer than the second crossing portion group CG2 such that they do not cross (or do not overlap) outer edges of the crossing portions 29a and 30a of the second crossing portion group CG2 in a plan view. In other words, a plan-view area in which the second hole 31B is formed is slightly larger than the second crossing portion group CG2 and extends outside the second crossing portion group CG2. In comparison to a configuration including an area in which the second hole is formed is within an area that overlaps the crossing portions 29a and 30a of the second crossing portion group CG2, distances between the edges of the second hole 31B to the respective crossing portions 29a and 30a of the second crossing portion group CG2 are larger. Therefore, the moisture contained in the organic insulating film 40 is less likely to affect the crossing portions 29a and 30a of the second crossing portion group CG2. Furthermore, even if a position at which the second hole 31B is formed in the organic insulating film 40 is shifted with respect to the X-axis direction or the Y-axis direction due to a production matter, the misalignment can be compensated. Therefore, the organic insulating film 40 is less likely to overlap the crossing portions 29a and 30a of the second crossing portion group CG2 and the second hole 31B is more likely to be formed in the area that overlaps the crossing portions 29a and 30a of the second crossing portion group CG2. According to the configuration, the ion migration is less likely to occur at the crossing portions 29a and 30a of the second crossing portion group CG2 and thus the operation reliability of the row control circuit 28 further improves. The second hole 31B has a shape that is formed as if a corner of a horizontally-long rectangular portion is cut when viewed in plan.

As illustrated in FIGS. 10 and 11, the protective film 37 is disposed between the crossing portions 30a of the second traces 30 and the gate insulating film 35. Namely, the protective film 37 is disposed between the first crossing portions 29a of the first traces 29 and the second crossing portions 30a of the second traces 30 in addition to the gate insulating film 35. Therefore, short circuits are less likely to occur between the crossing portions 29a and 30a due to metal ions produced through the ion migration. Furthermore, the first interlayer insulating film 39 and the second interlayer insulating film 41 are layered over the crossing portions 30a of the second traces 30. The crossing portions 30a of the second traces 30 are covered with the first interlayer insulating film 39 and the second interlayer insulating film 41. The first interlayer insulating film 39 and the second interlayer insulating film 41 are solid fills formed in areas that overlap the holes 31A and 31B and areas that do not overlap the holes 31A and 31B. Therefore, waterproof performance at the crossing portions 30a of the second traces 30 further improves. According to the configuration, the ion migration is less likely to occur at the crossing portions 29a and 30a of the traces 29 and 30. Therefore, the operation reliability of the row control circuit 28 further improves.

The gate insulating film 35 and the protective film 37 may be electrically connected to each other via contact holes formed in the gate insulating film 35 and the protective film 37 the crossing portions 29a and 30a of the first traces 29 and the second traces 30 in portions of the row control circuit 28 other than those illustrated in figures of this embodiment. Furthermore, the first transparent electrode film 23 and the second transparent electrode film 24 may be connected to the crossing portions 29a and 30a that are connected to each other via contact holes formed in the first interlayer insulating film 39 and the second interlayer insulating film 41 so as to communicate with the holes 31. According to the configuration, electric charges on the pixel electrodes 18 formed from the second transparent electrode film 24 can be released to the common electrode 22 or the traces 29 and 30.

As described above, the liquid crystal panel (a display device) 11 according to this embodiment includes the array substrate (a substrate) 11b, the row control circuit (a circuit) 28, the first traces 29, the second traces 30, the gate insulating film (an insulating film) 35, and the organic insulating film 40. The array substrate 11b includes the display area AA and the non-display areas. The display area AA is configured to display images and located on the inner side. The non-display areas NAA are located at the outer periphery and surround the display area AA. The row control circuit 28 is arranged in the non-display area NAA. The first traces 29 are included in the row control circuit 28. The second traces 30 are included in the row control circuit 28 and arranged over the first traces 29 so as to cross the first traces 29. The gate insulating film 35 is arranged between the first traces 29 and the second traces 30. The organic insulating film 40 is made of organic resin and arranged over the second traces 30. The organic insulating film 40 includes the holes 31 formed in the areas that overlap the crossing portions 29a and 30a of the first traces 29 and the second traces 30.

In the row control circuit 28, the first traces 29 and the second traces that are arranged over the first traces 29 via the gate insulating film 35 are arranged so as to cross one another. Therefore, the electric files may be created around the crossing portions 29a and 30a when the traces 29 and 30 are conducted. On the array substrate 11b, the non-display areas NAA are located at the outer periphery and surround the display area AA on the inner side. The row control circuit 28 arranged in the non-display area AA is more likely to be subject to the moisture at the outside thereof in comparison to the display area AA. In the row control circuit 28, the organic insulating film 40 is arranged over the second traces 30. The organic resin that is a material of the organic insulating film 40 tends to absorb moisture. Therefore, the metal ions may be produced at the crossing portions 29a and 30a of the traces 29 and 30 due to the moisture contained in the organic insulating film 40. The metal ions may be attracted by the electric fields and move, that is, so-called ion migration (or electrochemical migration) may occur. In some cases, short circuits may occur among the crossing portions 29a and 30a. If the frame of the liquid crystal panel 11 is further narrowed and the non-display areas NAA and the area in which the row control circuit 28 is arranged are reduced or the definition is further improved, the distribution density of the traces 29 and 30 increases. Therefore, the ion migration is more likely to occur at the crossing portions 29*a* and 30*a* of the traces 29 and 30. Because the organic insulating film 40 includes the holes 31 formed in the areas that overlap the crossing portions 29*a* and 30*a* of the first traces 29 and the second traces 30, the moisture contained in the organic insulating film 40 is less likely to affect the crossing portions 29*a* and 30*a* of the traces 29 and 30. Therefore, the ion migration is less likely to occur at the crossing portions 29*a* and 30*a* of the traces 29 and 30 and thus the short circuits are less likely to occur among the crossing portions 29*a* and 30*a*. According to the configuration, a malfunction of the row control circuit 28 is less likely to occur and thus the operation reliability thereof improves. This is preferable for the liquid crystal panel 11 when the frame thereof is further narrowed or the definition thereof is further improved.

In the organic insulating film 40, the area of each hole 31 is larger than at least the area that overlaps the crossing portions 29 and 30*a*. In comparison to a configuration in which each hole 31 is formed in an area that overlaps the crossing portions 29*a* and 30*a* of the traces 29 and 30, distances among the crossing portions 29*a* and 30*a* of the traces 29 and 30 are long. Therefore, the moisture contained in the organic insulating film 40 is less likely to affect the crossing portions 29*a* and 30*a* of the traces 29 and 30. Furthermore, even if a position in which the hole 31 is formed in the organic insulating film 40 is shifted due to a production matter, the misalignment can be compensated. Therefore, the organic insulating film 40 is less likely to overlap the crossing portions 29*a* and 30*a* and the hole 31 is more likely to be formed in the area that overlaps the crossing portions 29*a* and 30*a* of the traces 29 and 30. According to the configuration, the ion migration is less likely to occur at the crossing portions 29*a* and 30*a* of the traces 29 and 30 and thus the operation reliability of the row control circuit 28 further improves.

At least one of the first trace 29 and the second trace 30 includes multiple traces such that the crossing portions 29*a* and 30*a* are arranged at arrangement intervals (intervals) P1 to P3. The organic insulating film 40 includes the holes 31 each formed in the area over at least some crossing portions 29*a* and 30*a*. Because the opening edges of the hole 31 collectively surround the crossing portions 29*a* and 30*a* arranged at intervals, the organic insulating film 40 does not exist between among the crossing portions 29*a* and 30*a*. Therefore, even if the moisture is contained in the organic insulating film 40, the moisture is less likely to affect the crossing portions 29*a* and 30*a*. Furthermore, even if the hole 31 is formed in the organic insulating film 40 at a shifted position due to a production matter and portions of the opening edges of the hole 31 overlap the crossing portions 29*a* and 30*a*, the overlaps are small. According to the configuration, the ion migration is less likely to occur at the crossing portions 29*a* and 30*a* of the traces 29 and 30. Therefore, the reliability of the row control circuit 28 further improves.

At least one of the first trace 29 and the second trace 30 includes multiple traces such that at least three crossing portions 29*a* and three crossing portions 30*a* are arranged at different arrangement intervals P1 to P3. The organic insulating film 40 includes the holes 31 that include the first holes 31A and the second holes 31B. Each first hole 31A is formed in the area over two crossing portions 29*a* and two crossing portions 30*a*, the arrangement interval P1 of which is relatively small. The second hole 31B is formed in the area that overlap the crossing portions 29*a* and 30*a* that are at the interval P2, which is relatively large, and so as not to overlap the first hole 31A. Because the opening edges of the first hole 31A in the organic insulating film 40 collectively surround two crossing portions 29*a* and two crossing portions 30*a* that are at the arrangement interval P1, which is relatively small, the organic film 40 does not exist among the crossing portions 29*a* and 30*a*. Even if the moisture is contained in the organic insulating film 40, the moisture is less likely to affect the crossing portions 29*a* and 30*a* that are at the arrangement interval P1, which is relatively small. Furthermore, even if the hole 31 is formed in the organic insulating film 40 at a shifted position due to a production matter and portions of the opening edges of the first hole 31A overlap the crossing portions 29*a* and 30*a* that are at the arrangement interval P1, which is relatively small, the overlaps are small. According to the configuration, the ion migration is less likely to occur at the crossing portions 29*a* and 30*a* that are at the arrangement interval P1, which is relatively small. Therefore, the reliability of the row control circuit 28 further improves. Furthermore, because the organic insulating film 40 includes the second holes 31B each formed in the area that overlap the crossing portions 29*a* and 30*a* that are at the interval P2, which is relatively large, and so as not to overlap the first hole 31A, the organic insulating film 40 exists among the crossing portions 29*a* and 30*a*, the arrangement interval P1 of which is relatively large. According to the configuration, the organic insulating film 40 is less likely to be excessively removed and thus the functions of the organic insulating film 40 for flattening and protecting the traces 29 and 30 are less likely to decrease.

The CF substrate (a counter substrate) 11*a* that is opposed to the array substrate 11*b*, the liquid crystal layer (liquid crystals) 11*c*, and the sealing member 11*j* are included. The liquid crystal layer 11*c* is sandwiched between the array substrate 11*b* and the CF substrate 11*a*. The sealing member 11*j* is arranged between the array substrate 11*b* and the CF substrate 11*a* so as to surround the liquid crystal layer 11*c* and to seal the liquid crystal layer 11*c*. The row control circuit 28 is arranged closer to the sealing member 11*j* than the display area AA. The liquid crystal layer 11*c* that is sandwiched between the array substrate 11*b* and the CF substrate 11*a* is sealed with the sealing member 11*j* that is arranged between the array substrate 11*b* and the CF substrate 11*a* so as to surround the liquid crystal layer 11*c*. Because the row control circuit 28 is arranged closer to the sealing member 11*j* than the display area AA, if the moisture passes through the sealing member 11*j*, the row control circuit 28 is subject to the moisture. As described above, the organic insulating film 40 includes the holes 31 each formed in the area that overlaps the crossing portions 29*a* and 30*a* of the first traces 29 and the second traces 30. Therefore, even if the moisture that has passed the sealing member 11*j* is absorbed by the organic insulating film 40, the moisture is less likely to affect the crossing portions 29*a* and 30*a* of the traces 29 and 30 and thus the ion migration is less likely to occur at the crossing portions 29*a* and 30*a*. According to the configuration, the malfunction of the row control circuit 28 is less likely to occur.

The first interlayer insulating film 39 that is arranged between the organic insulating film 40 and the second traces 30 and in the area that overlaps at least holes 31 is included. Because the crossing portions of the second traces 30 which cross the first traces 29 are covered with the first interlayer insulating film 39. Therefore, waterproof performance (moisture resistance) at the crossing portions 30*a* improves. According to the configuration, the ion migration is less likely to occur at the crossing portions 29a and 30a of the traces 29 and 30 and thus the operation reliability of the row control circuit 28 further improves.

The protective film 37 that is arranged between the second traces 30 and the gate insulating film 35 and in the area that overlaps at least the holes 31 is included. In addition to the gate insulating film 35, the protective film 37 is arranged between the crossing portions 29a and 30a of the first traces 29 and the second traces 30. Therefore, the short circuits due to the ion migration are further less likely to occur at the crossing portions 29a and 30a and thus the operation reliability of the row control circuit 28 further improves.

The first traces 29 and the second traces 30 contain at least copper. In comparison to a configuration that contains aluminum, the first traces 29 and the second traces 30 that contain copper have higher electric conductivity but they are subject to corrosion due to the moisture. As described earlier, the organic insulating film 40 includes the holes 31 in the areas that overlap the crossing portions 29a and 30a of the first traces 29 and the second traces 30. Therefore, the moisture contained in the organic insulating film 40 is less likely to affect the crossing portions 29a and 30a of the traces 29 and 30 and thus the ion migration is less likely to occur at the crossing portions 29a and 30a of the traces 29 and 30. According to the configuration, the operation reliability of the row control circuit 28 is maintained at a high level while the traces 29 and 30 have preferable electric conductivities.

In the display area AA, the display area TFTs (thin film transistors) 17 that include the semiconductor film 36 made from the oxide semiconductor are provided. In the row control circuit 28, the semiconductor film 36 is provided between the second traces 30 and the gate insulating film 35. The oxide semiconductor, from which the semiconductor film 36 is made, has higher electron mobility in comparison to an amorphous semiconductor. Therefore, when circuit components are formed from the semiconductor film 36 for the row control circuit 28, the circuit components can have various functions. This configuration is preferable for adding various functions to the row control circuit 28.

The oxide semiconductor contains indium (In), gallium (Ga), zinc (Zn), and oxygen (O). This configuration is preferable for adding various functions to the row control circuit 28.

In the above description of the first embodiment, the wiring structure of a portion of the row control circuit 28 is provided as an example. Other portions of the row control circuit 28 include wiring structures different from the first embodiment. The wiring structures in the other portions of the row control circuit 28 will be described in descriptions of first to seventh modifications below. Components of each of the modifications similar to those of the first embodiment will be indicted by the same symbols as the symbols of the components of the first embodiment and may not be described.

First Modification of the First Embodiment

Figure 12:
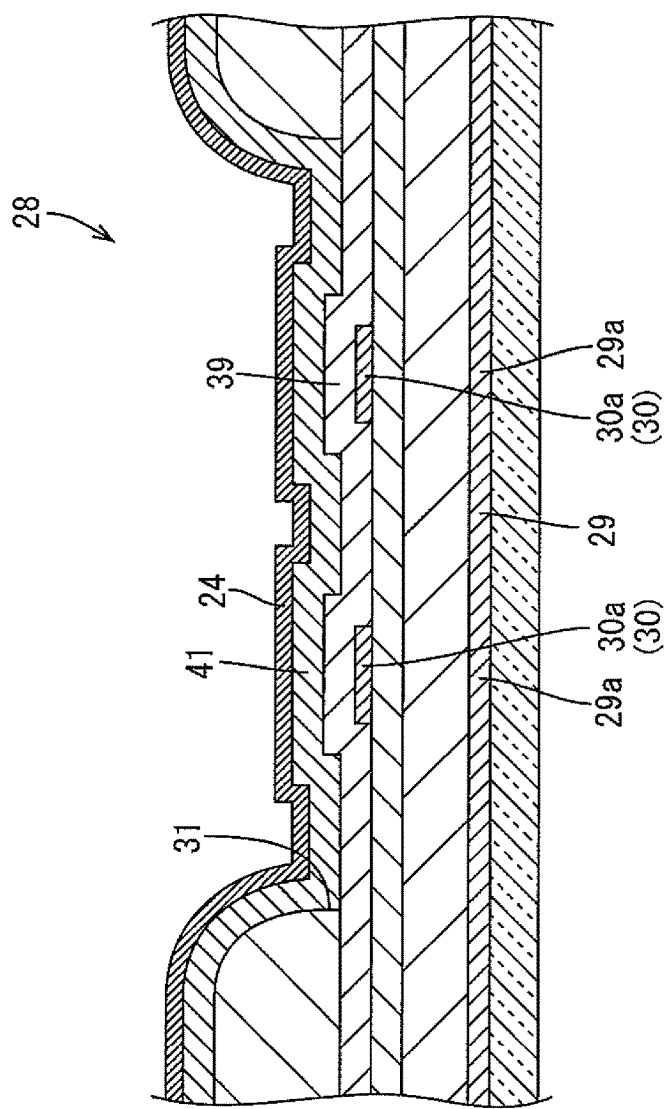
FIG. 12 is a plan view illustrating a layout including a first trace and second traces in a row control circuit and a hole in an organic insulating film according to a first modification of the first embodiment.

A first modification of the first embodiment will be described with reference to FIG. 12. As illustrated in FIG. 12, the second transparent electrode film 24 is layered over the first interlayer insulating film 39 and the second interlayer insulating film 41 that are layered over the crossing portions 30a that cross the first traces 29. Namely, the crossing portions 30a of the second traces 30 are covered with the second transparent electrode film 24 in addition to the first interlayer insulating film 39 and the second interlayer insulating film 41. The second transparent electrode film 24 is a solid fill formed in areas that overlap the holes 31 and areas that do not overlap the holes 31. Therefore, waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

According to the modification as described above, the second transparent electrode film (a transparent electrode film) 24 that is layered over the organic insulating film 40 and in the areas that overlap at least the holes 31 is included. Because the crossing portions 29a and 30a of the second traces 30 which cross the first traces 29 are covered with the second transparent electrode film 24 in addition to the first interlayer insulating film 39, the waterproof performance at the crossing portions 29a and 30a further improves. According to the configuration, the ion migration is further less likely to occur at the crossing portions 29a and 30a of the traces 29a and 30a and thus the operation reliability of the row control circuit 28 further improves.

Second Modification of the First Embodiment

Figure 13:
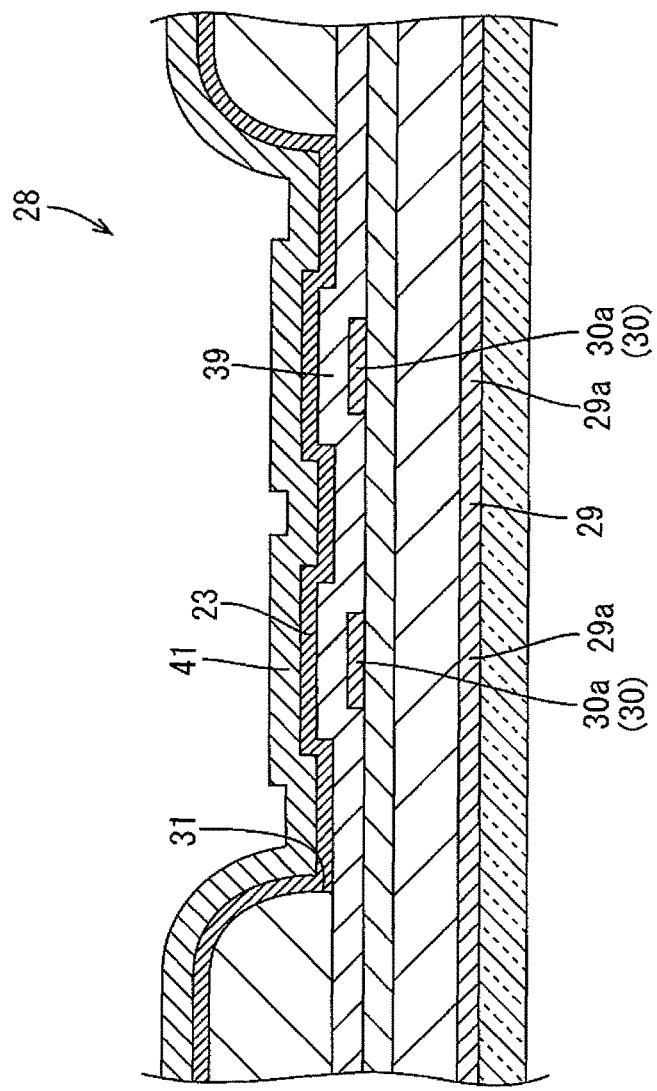
FIG. 13 is a plan view illustrating a layout including a first trace and second traces in a row control circuit and a hole in an organic insulating film according to a second modification of the first embodiment.

A second modification of the first embodiment will be described with reference to FIG. 13. As illustrated in FIG. 13, in the second modification, the first transparent electrode film 23 is disposed between the first interlayer insulating film 39 and the second interlayer insulating film 41 that are layered over the crossing portions 30a of the second traces 30 which cross the first trace 29. Namely, the crossing portions 30a of the second traces 30 are covered with the first transparent electrode film 23 in addition to the first interlayer insulating film 39 and the second interlayer insulating film 41. The first transparent electrode film 23 is a solid fill that is formed over the areas that overlap the holes 31 and the areas that do not overlap the holes 31. Therefore, the waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

According to the modification as described above, the transparent electrode films 23 and 24 includes the first transparent electrode film 23 that is provided in the lower layer and the second transparent electrode film 24 that is provided in the upper layer. Furthermore, the second interlayer insulating film 41 that is provided between the first transparent electrode film 23 and the second transparent electrode film 24 and formed in the area that overlaps at least the holes 31. The crossing portions 29a and 30a of the second traces 30 which cross the first traces 29 are covered with the first transparent electrode film 23, the second interlayer insulating film 41, and the second transparent electrode film 24 in addition to the first interlayer insulating film 39. Therefore, the waterproof performance at the crossing portions 29a and 30a further improves. According to the configuration, the ion migration is further less likely to occur at the crossing portions 29a and 30a of the traces 29 and 30 and thus the operation reliability of the row control circuit 28 further improves.

Third Modification of the First Embodiment

Figure 14:
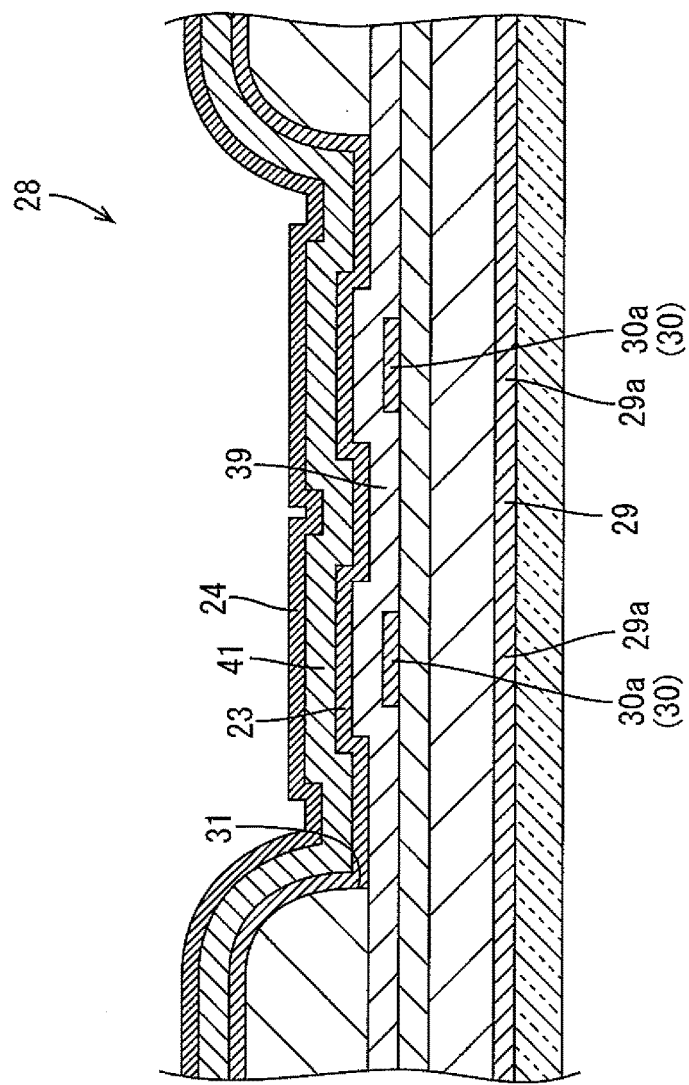
FIG. 14 is a plan view illustrating a layout including a first trace and second traces in a row control circuit and a hole in an organic insulating film according to a third modification of the first embodiment.

A third modification of the first embodiment will be described with reference to FIG. 14. As illustrated in FIG.

14, in the third modification, the first transparent electrode film 23 is provided between the first interlayer insulating film 39 and the second interlayer insulating film 41 that are layered over the crossing portions 30a of the second traces 30 which cross the first traces 29 and the second transparent electrode film 24 is layered over the second interlayer insulating film 41. Namely, the crossing portions 30a of the second traces 30 are covered with the first transparent electrode film 23 and the second transparent electrode film 24 in addition to the first interlayer insulating film 39 and the second interlayer insulating film 41. The first transparent electrode film 23 and the second transparent electrode film 24 are solid fills formed in the areas that overlap the holes 31 and in the areas that do not overlap the holes 31. Therefore, the waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

Fourth Modification of the First Embodiment

Figure 15:
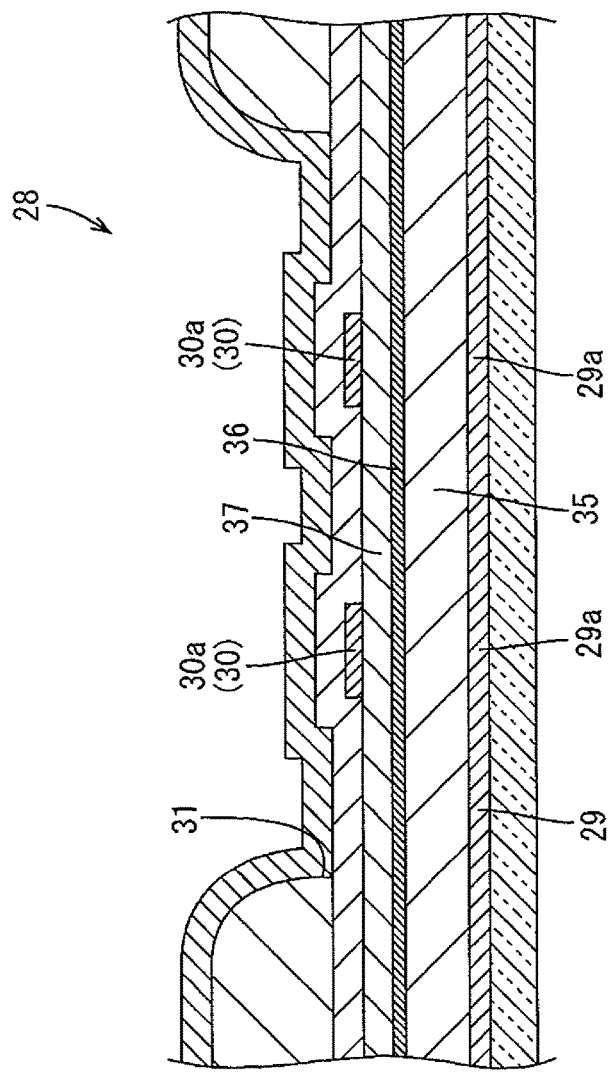
FIG. 15 is a plan view illustrating a layout including a first trace and second traces in a row control circuit and a hole in an organic insulating film according to a fourth modification of the first embodiment.

A fourth modification of the first embodiment will be described with reference to FIG. 15. As illustrated in FIG. 15, in the fourth modification, the semiconductor film 36 is provided between the gate insulating film 35 and the protective film 37 that are provided between the crossing portions 29a and 30a of the traces 29 and 30. Namely, the semiconductor film 36 is provided between the crossing portions 29a of the first traces 29 and the crossing portions 30a of the second traces 30 in addition to the gate insulating film 35 and the protective film 37. According to the configuration, short circuits are less likely to be caused by metal ions due to the ion migration among the crossing portions 29a and 30a and thus the operation reliability of the row control circuit 28 further improves. The semiconductor film 36 is formed in the areas that overlap the holes 31 and in the areas that do not overlap the holes 31.

Fifth Modification of the First Embodiment

Figure 16:
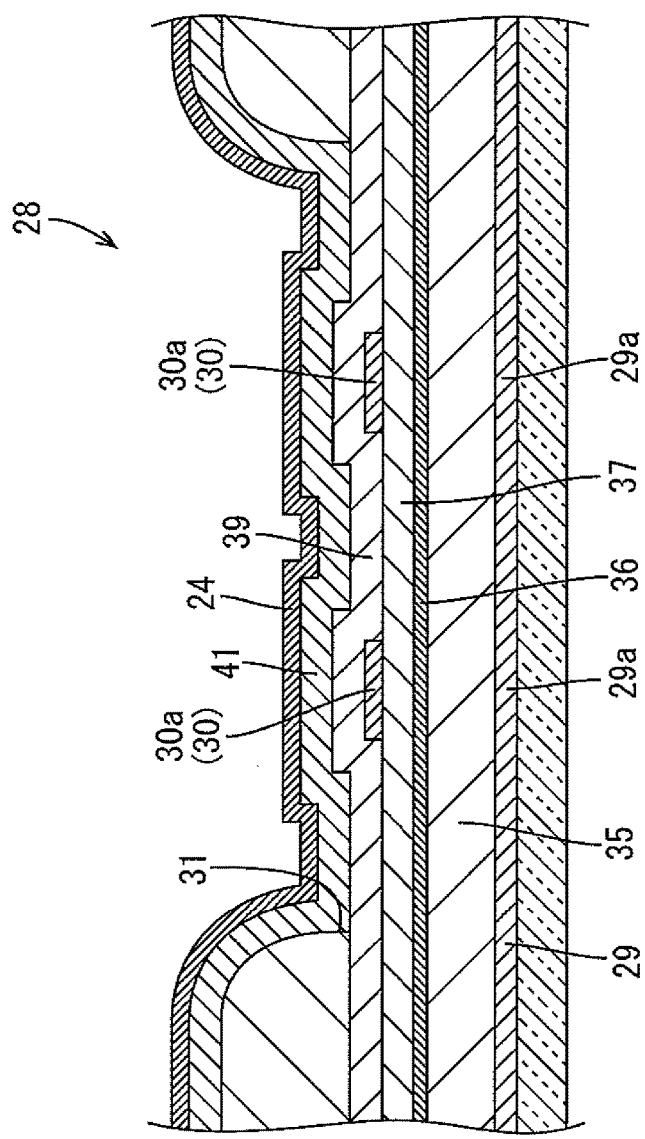
FIG. 16 is a plan view illustrating a layout including a first trace and second traces in a row control circuit and a hole in an organic insulating film according to a fifth modification of the first embodiment.

A fifth modification of the first embodiment will be described with reference to FIG. 16. As illustrated in FIG. 16, in the fifth modification, the semiconductor film 36 is provided between the gate insulating film 35 and the protective film 37 that are provided between the crossing portions 29a and 30a of the traces 29 and 30. Furthermore, the second transparent electrode film 24 is layered over the first interlayer insulating film 39 and the second interlayer insulating film 41 that are layered over the crossing portions 30a of the second traces 30 which cross the first trace 29. Namely, the semiconductor film 36 is provided between the crossing portions 29a of the first traces 29 and the crossing portions 30a of the second traces 30 in addition to the gate insulating film 35 and the protective film 37. Furthermore, the crossing portions 30a of the second traces 30 are covered with the second transparent electrode film 24 in addition to the first insulating film 39 and the second interlayer insulating film 41. With the semiconductor film 36, short circuits due to metal ions produced by the ion migration are less likely to occur between the crossing portions 29a and 30a and thus the operation reliability of the row control circuit 28 further improves. The semiconductor film 36 is a solid fill that is arranged over the areas that overlap the holes 31 and the areas that do not overlap the holes 31. Therefore, the waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

Sixth Modification of the First Embodiment

Figure 17:
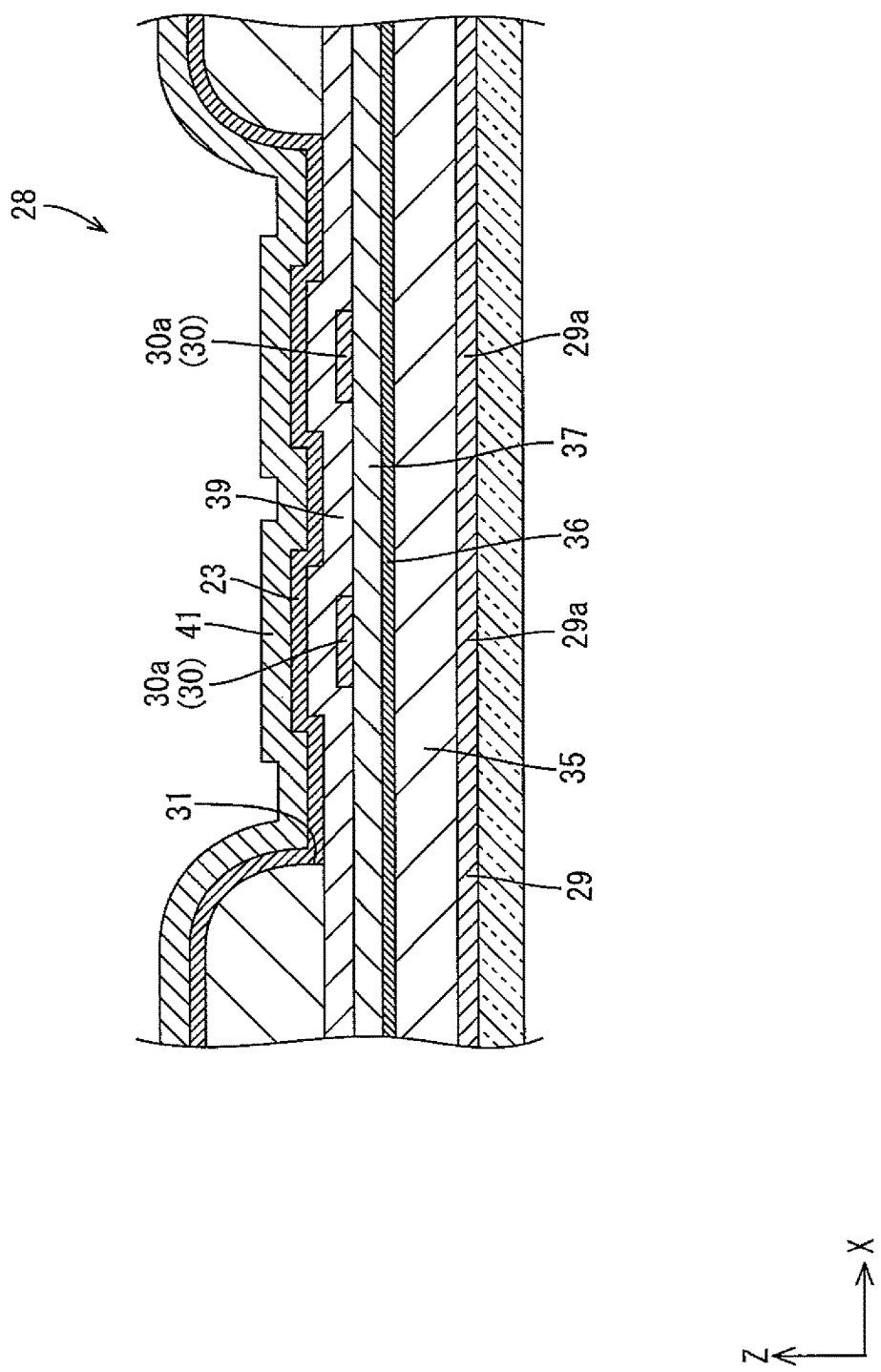
FIG. 17 is a plan view illustrating a layout including a first trace and second traces in a row control circuit and a hole in an organic insulating film according to a sixth modification of the first embodiment.

A sixth modification of the first embodiment will be described with reference to FIG. 17. As illustrated in FIG. 17, in the sixth embodiment, the semiconductor film 36 is provided between the gate insulating film 35 and the protective film 37 that are provided between the crossing portions 29a and 30a of the traces 29 and 30. Furthermore, the first transparent electrode film 23 is provided between the first interlayer insulating film 39 and the second interlayer insulating film 41 that are layered over the crossing portions 30a of the second traces 30 which cross the first traces 29. Namely, the semiconductor film 36 is provided between the crossing portions 29a of the first traces 29 and the crossing portions 30a of the second traces 30 in addition to the gate insulating film 35 and the protective film 37. The crossing portions 30a of the second traces 30 are covered with the first transparent electrode film 23 in addition to the first interlayer insulating film 39 and the second interlayer insulating film 41. With the semiconductor film 36, short circuits due to metal ions produced by the ion migration are less likely to occur between the crossing portions 29a and 30a and thus the operation reliability of the row control circuit 28 further improves. The semiconductor film 36 is arranged over the areas that overlap the holes 31 and the areas that do not overlap the holes 31. The first transparent electrode film 23 is a solid fill that is arranged over the areas that overlap the holes 31 and the areas that do not overlap the holes 31. Therefore, the waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

Seventh Modification of the First Embodiment

Figure 18:
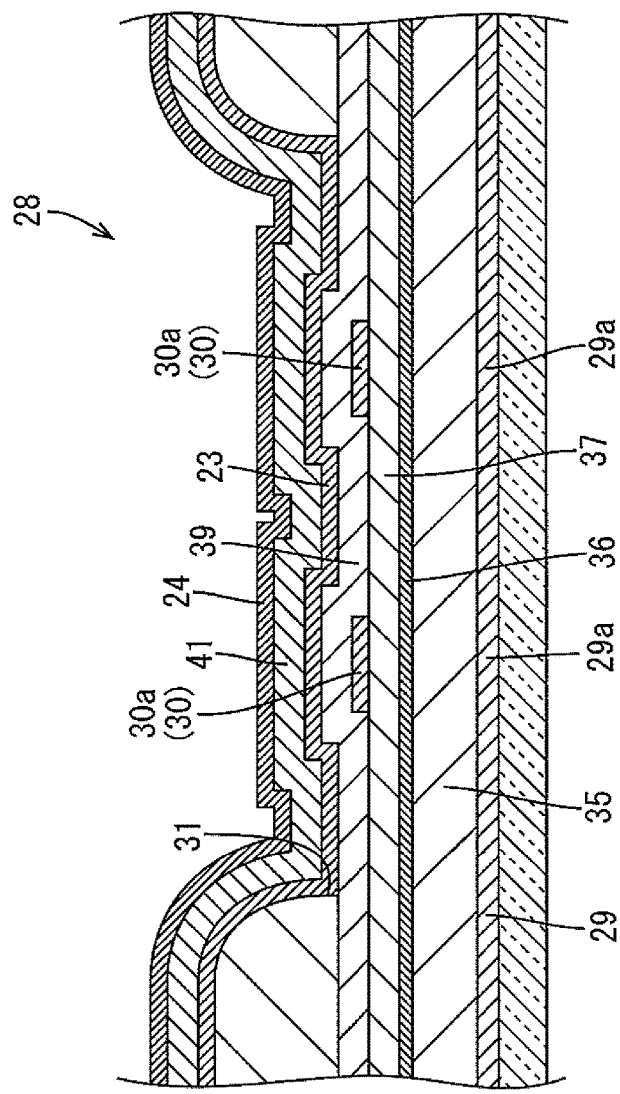
FIG. 18 is a plan view illustrating a layout including a first trace and second traces in a row control circuit and a hole in an organic insulating film according to a seventh modification of the first embodiment.

A seventh modification of the first embodiment will be described with reference to FIG. 18. As illustrated in FIG. 18, in the seventh embodiment, the semiconductor film 36 is provided between the gate insulating film 35 and the protective film 37 that are provided between the crossing portions 29a and 30a of the traces 29 and 30. Furthermore, the first transparent electrode film 23 is provided between the first interlayer insulating film 39 and the second interlayer insulating film 41 that are layered over the crossing portions 30a of the second traces 30 which cross the first traces 29 and the second transparent electrode film 24 is layered over the second interlayer insulating film 41. Namely, the semiconductor film 36 is provided between the crossing portions 29a of the first traces 29 and the crossing portions 30a of the second traces 30 in addition to the gate insulating film 35 and the protective film 37. Furthermore, the crossing portions 30a of the second traces 30 are covered with the first transparent electrode film 23 and the second transparent electrode film 24 in addition to the first interlayer insulating film 39 and the second interlayer insulating film 41. With the semiconductor film 36, short circuits due to metal ions produced by the ion migration are less likely to occur between the crossing portions 29a and 30a and thus the operation reliability of the row control circuit 28 further improves. The semiconductor film 36 is arranged over the areas that overlap the holes 31 and the areas that do not overlap the holes 31. The first transparent electrode film 23 and the second electrode film 24 are solid fills that are arranged over the areas that overlap the holes 31 and the areas that do not overlap the holes 31. Therefore, the waterproof performance (moisture resistance) at the crossing portions 30a of the second traces 30 improves. According to the configuration, the ion migration is less likely to occur at the crossing portions 29a and 30a of the traces 29 and 30 and thus the operation reliability of the row control circuit 28 further improves.

Figure 20:
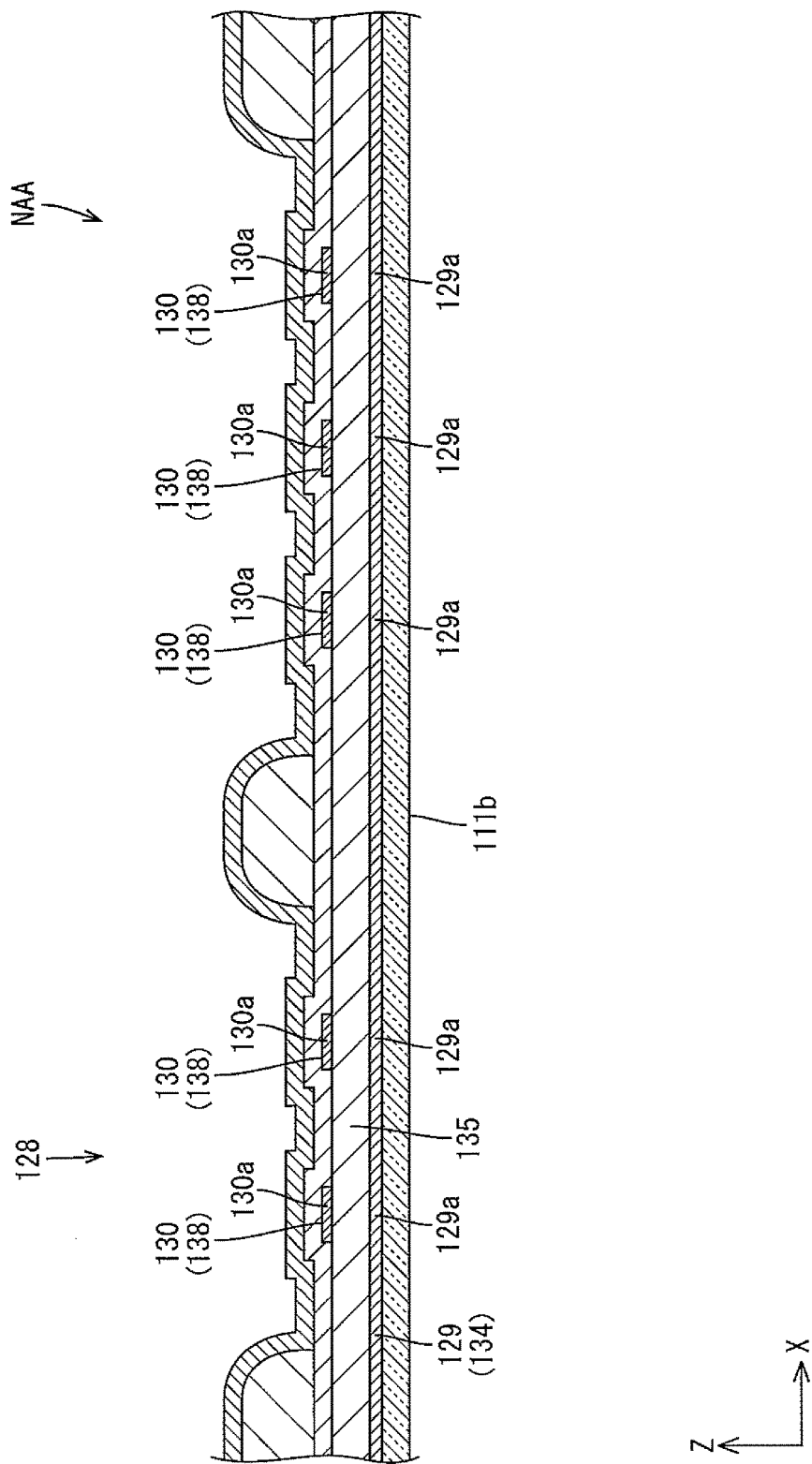
FIG. 20 is a cross-sectional view around crossing portions of a first trace and second traces in a row control circuit arranged in a non-display area of the array substrate in the liquid crystal panel along the X-axis direction.
Figure 21:
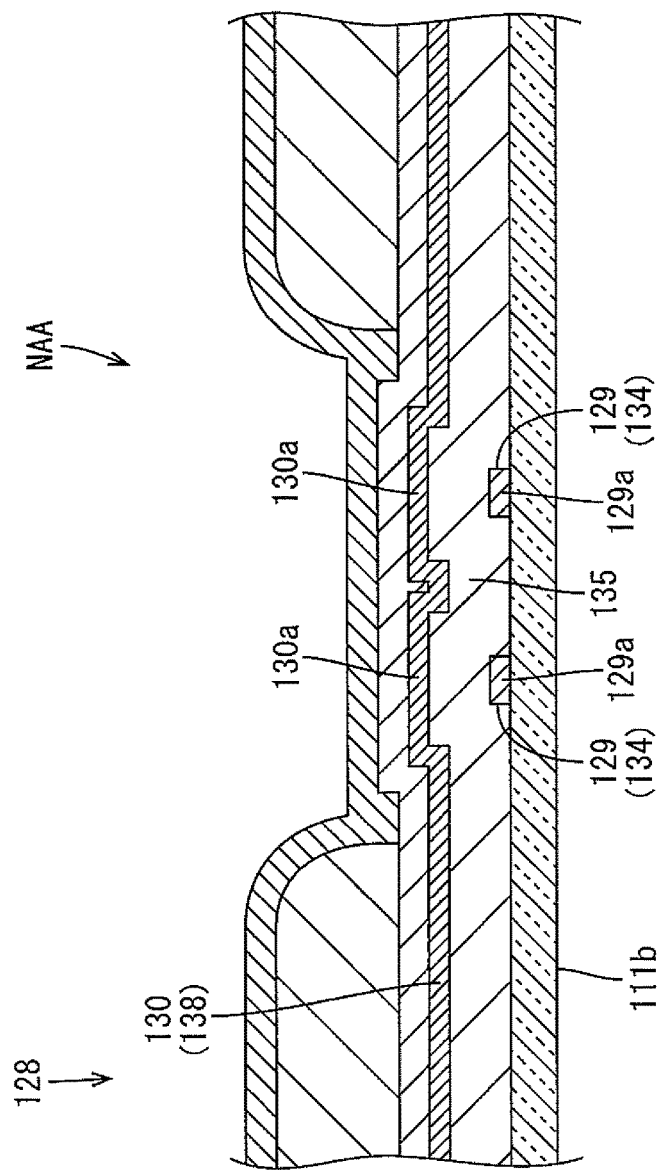
FIG. 21 is a cross-sectional view around crossing portions of the first traces and the second trace in the row control circuit arranged in the non-display area of the array substrate in the liquid crystal panel along the Y-axis direction.

A second embodiment of the present invention will be described with reference to FIGS. 19 to 21. The second embodiment does not include the protective film 37 included in the first embodiment. Configurations, functions, and effects similar to those of the first embodiment will not be described.

Figure 19:
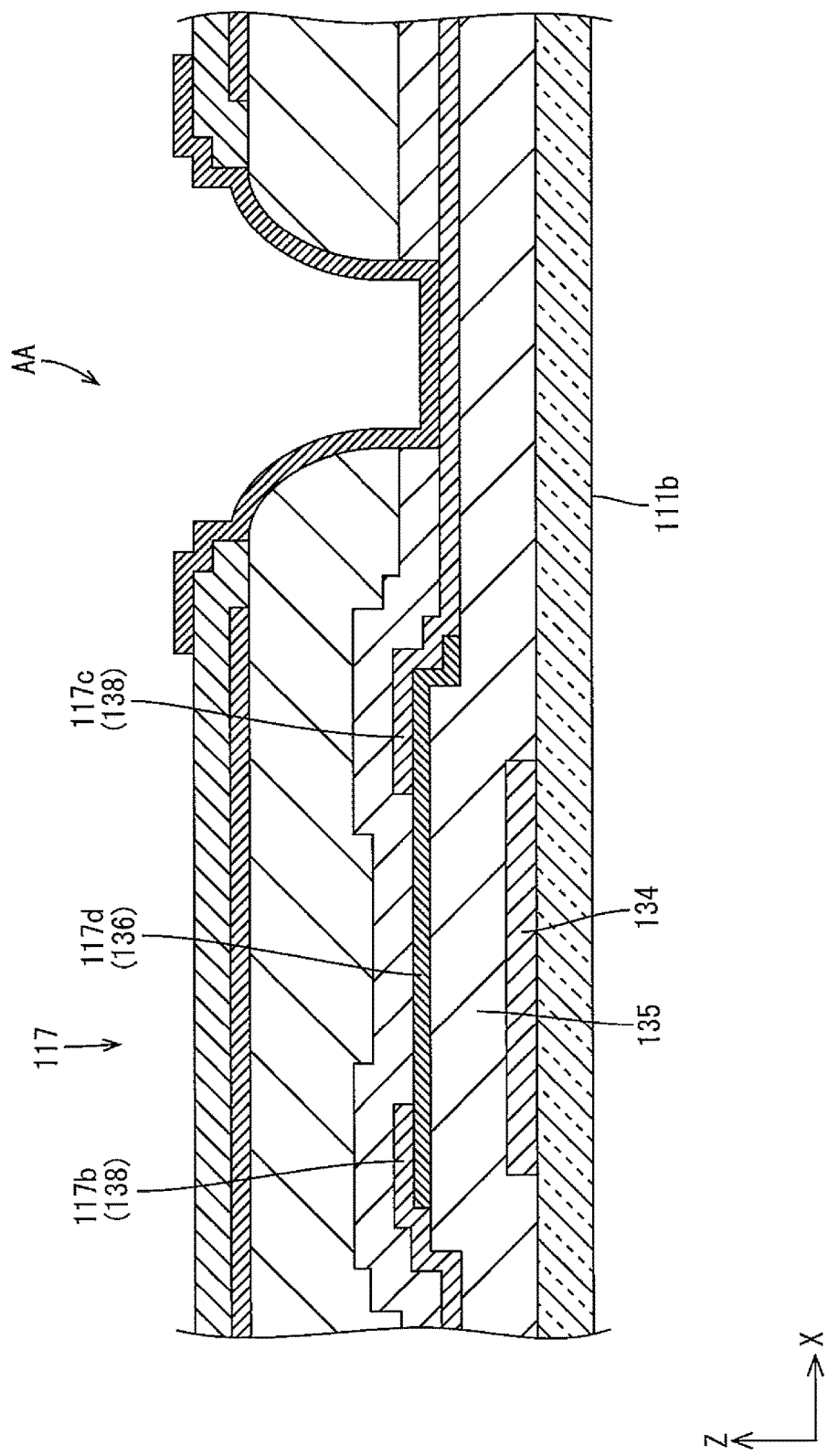
FIG. 19 is a cross-sectional view illustrating a cross-sectional configuration of a TFT arranged in a display area of an array substrate in a liquid crystal panel according to a second embodiment of the present invention.

As illustrated in FIG. 19, an array substrate 111b according to this embodiment does not include the protective film included in the first embodiment (see FIG. 8) between a semiconductor film 136 and a second metal film 138. In a portion of the array substrate 111b in the display area AA, ends of source electrodes 117b formed from a second metal film 138 and included in display area TFTs 117 and ends of drain electrodes 117c formed from the second metal film 138 and included in the display area TFTs 117 are directly layered over (without the protective film 37) ends of channels 117d formed from the semiconductor film 136 and connected with one another. As illustrated in FIGS. 20 and 21, in portions of the array substrate 111b in the non-display areas NAA, only a gate insulating film 135 is provided between crossing portions 129a and 130a of first traces 129 formed from a first metal film 134 and included in a row control circuit 128 and second traces 130 formed from the second metal film 138 and included in the row control circuit 128.

According to the embodiment, a process of patterning of the protective film 37 by the photolithography method is not required. Therefore, the tact time can be reduced and the production cost can be reduced through simplification of a production facility. FIGS. 19 to 21 illustrate wiring configurations in portions of the row control circuit 128.

In the above description of the second embodiment, the wiring configurations in portions of the row control circuit 128 are illustrated as an example. Different wire configurations exist in other portions of the row control circuit 128. The wiring configurations in the other portions of the row control circuit 128 will be described in descriptions of first to seventh modifications below. Components of the modifications similar to those of the second embodiment will be indicated by the symbols same as those of the second embodiment and will not be illustrated or described.

First Modification of the Second Embodiment

Figure 22:
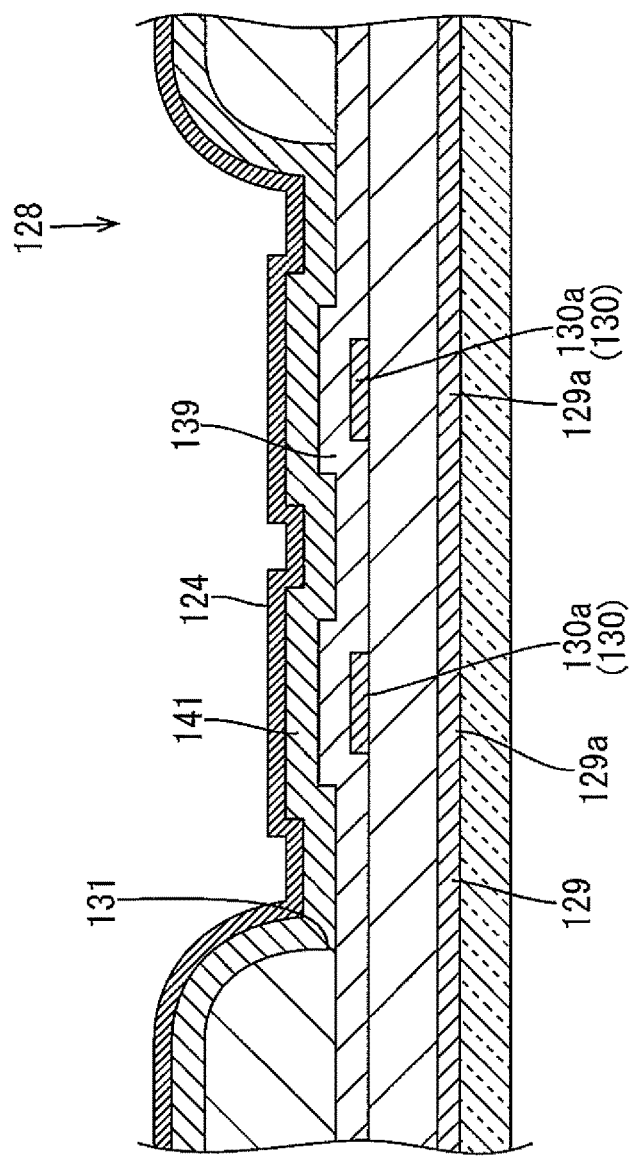
FIG. 22 is a plan view illustrating a layout including a first trace and second traces in a row control circuit and a hole in an organic insulating film according to a first modification of the second embodiment.

A first modification of the second embodiment will be described with reference to FIG. 22. As illustrated in FIG. 22, in the first modification, a second transparent electrode film 124 is layered over a first interlayer insulating film 139 and a second interlayer insulating film 141 that are layered over the crossing portions 130a of the second traces 130 which cross the first traces 129. Namely, the crossing portions 130a of the second traces 130 are covered with the second transparent electrode film 124 in addition to the first interlayer insulating film 139 and the second interlayer insulating film 141. The second transparent electrode film 124 is a solid fill that is arranged over areas that overlap holes 131 and areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Second Modification of the Second Embodiment

Figure 23:
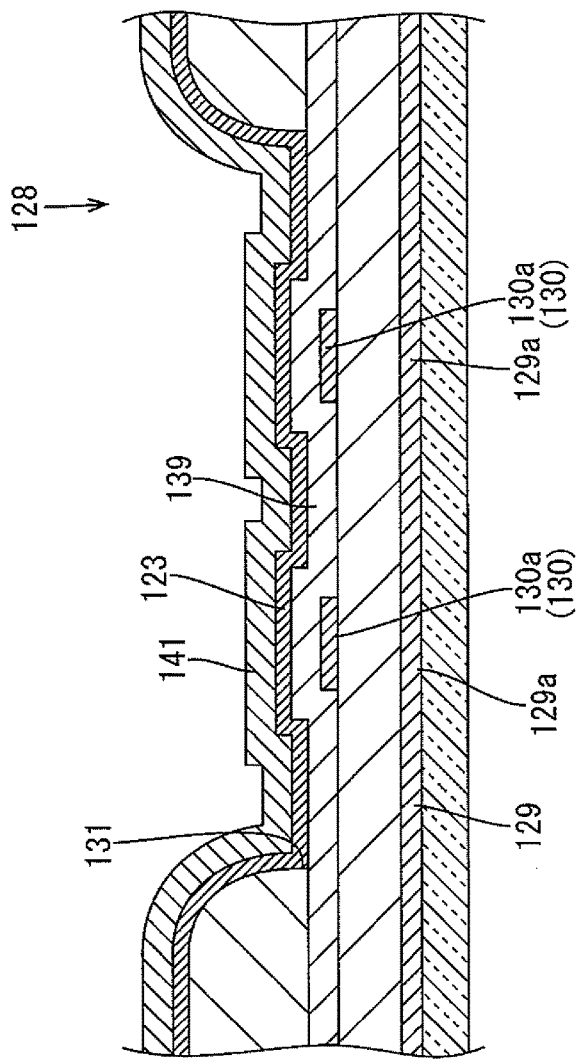
FIG. 23 is a plan view illustrating a layout including a first trace and second traces in a row control circuit and a hole in an organic insulating film according to a second modification of the second embodiment.

A second modification of the second embodiment will be described with reference to FIG. 23. As illustrated in FIG. 23, the first transparent electrode film 123 is provided between the first interlayer insulating film 139 and the second interlayer insulating film 141 that are layered over the crossing portions 130a of the second traces 130 which cross the first traces 129. Namely, the crossing portions 130a of the second traces 130 are covered with the first transparent electrode film 123 in addition to the first interlayer insulating film 139 and the second interlayer insulating film 141. The first transparent electrode film 123 is a solid fill that is arranged over the areas that overlap the holes 131 and the areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Third Modification of the Second Embodiment

Figure 24:
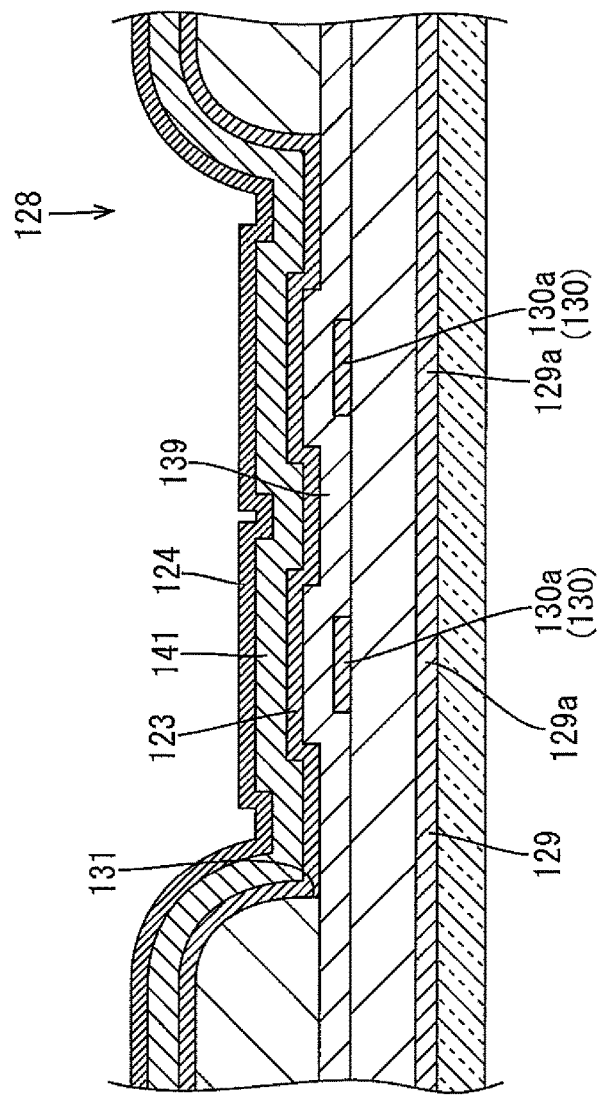
FIG. 24 is a plan view illustrating a layout including a first trace and second traces in a row control circuit and a hole in an organic insulating film according to a third modification of the second embodiment.

A third modification of the second embodiment will be described with reference to FIG. 24. As illustrated in FIG. 24, in the third modification, the first transparent electrode film 123 is provided between the first interlayer insulating film 139 and the second interlayer insulating film 141 that are layered over the crossing portions 130a of the second traces 130 which cross the first traces 129. Furthermore, the second transparent electrode film 124 is layered over the second interlayer insulating film 141. Namely, the crossing portions 130a of the second traces 130 are covered with the first transparent electrode film 123 and the second transparent electrode film 124 in addition to the first interlayer insulating film 139 and the second interlayer insulating film 141. The first transparent electrode film 123 and the second transparent electrode film 124 are solid fills that are arranged over the areas that overlap the holes 131 and the areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Fourth Modification of the Second Embodiment

Figure 25:
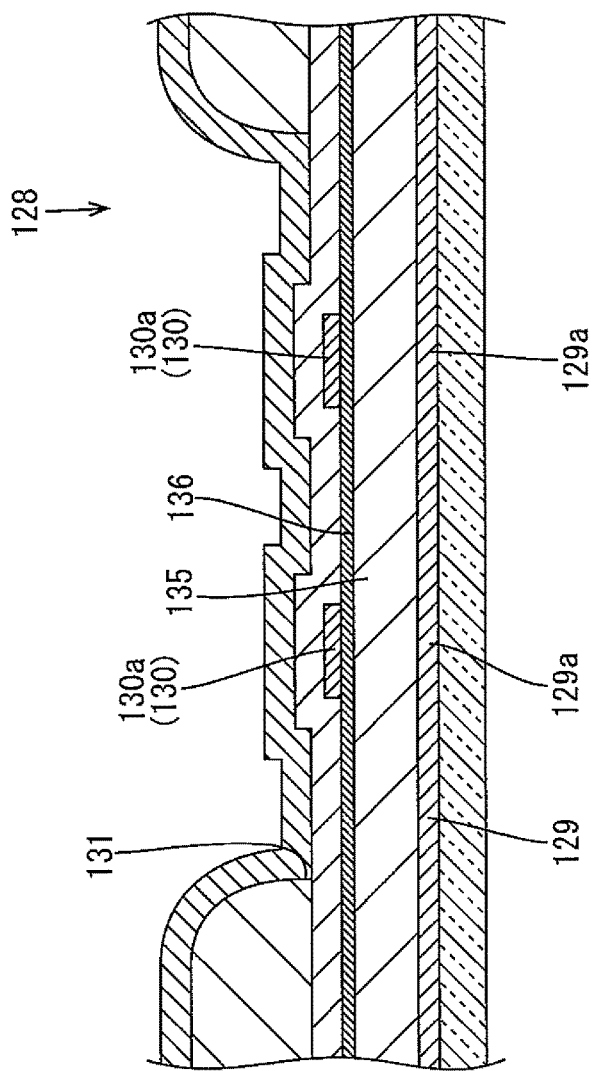
FIG. 25 is a plan view illustrating a layout including a first trace and second traces in a row control circuit and a hole in an organic insulating film according to a fourth modification of the second embodiment.

A fourth modification of the second embodiment will be described with reference to FIG. 25. As illustrated in FIG. 25, in the fourth modification, the semiconductor film 136 is layered over the gate insulating film 135 that is provided between the crossing portions 129a and 130a of the traces 129 and 130. Namely, the semiconductor film 136 is provided between the crossing portions 129a of the first traces 129 and the crossing portions 130a of the second traces 130 in addition to the gate insulating film 135. Therefore, short circuits due to metal ions produced by the ion migration are less likely to occur between the crossing portions 129a and 130a and thus the operation reliability of the row control circuit 128 further improves. The semiconductor film 136 is arranged over the areas that overlap the holes 131 and the areas that do not overlap the holes 131.

Fifth Modification of the Second Embodiment

Figure 26:
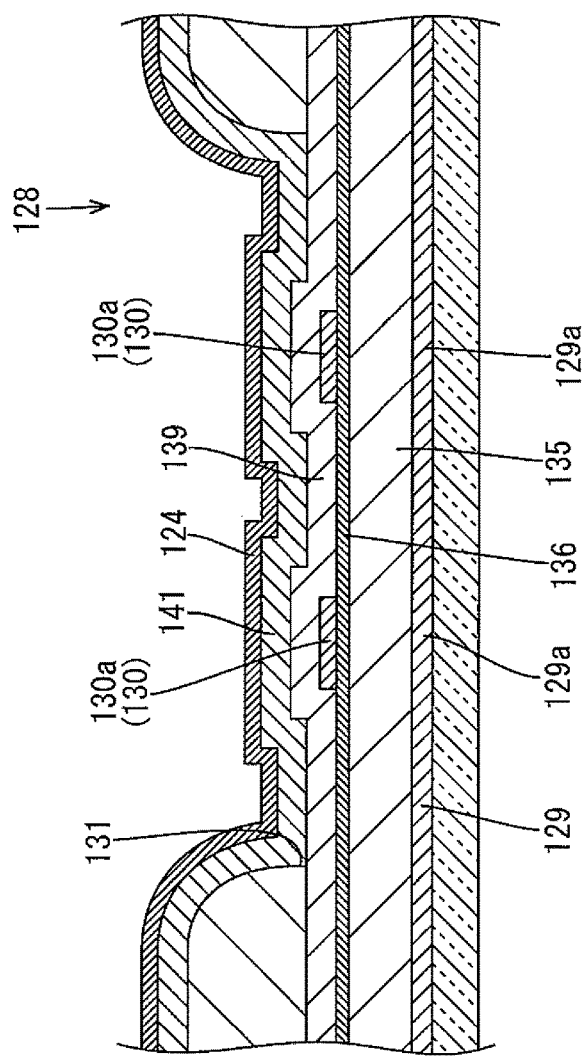
FIG. 26 is a plan view illustrating a layout including a first trace and second traces in a row control circuit and a hole in an organic insulating film according to a fifth modification of the second embodiment.

A fifth modification of the second embodiment will be described with reference to FIG. 26. As illustrated in FIG. 26, in the fifth modification, the semiconductor film 136 is layered over the gate insulating film 135 that is provided between the crossing portions 129a and 130a of the traces 129 and 130. Furthermore, the second transparent electrode film 124 is layered over the first interlayer insulating film 139 and the second interlayer insulating film 141 that are layered over the crossing portions 130a of the second traces 130 which cross the first traces 129. Namely, the semiconductor film 136 is provided between the crossing portions 129a of the first traces 129 and the crossing portions 130a of the second traces 130 in addition to the gate insulating film 135. Furthermore, the crossing portions 130a of the second traces 130 are covered with the second transparent electrode film 124 in addition to the first interlayer insulating film 139 and the second interlayer insulating film 141. With the semiconductor film 136, short circuits due to metal ions produced by the ion migration are less likely to occur between the crossing portions 129a and 130a and thus the operation reliability of the row control circuit 128 further improves. The semiconductor film 136 is a solid fill that is arranged over the areas that overlap the holes 131 and the areas that do not overlap the holes 131. The second transparent electrode film 124 is a solid fill that is arranged over the areas that overlap the holes 131 and the areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Sixth Modification of the Second Embodiment

Figure 27:
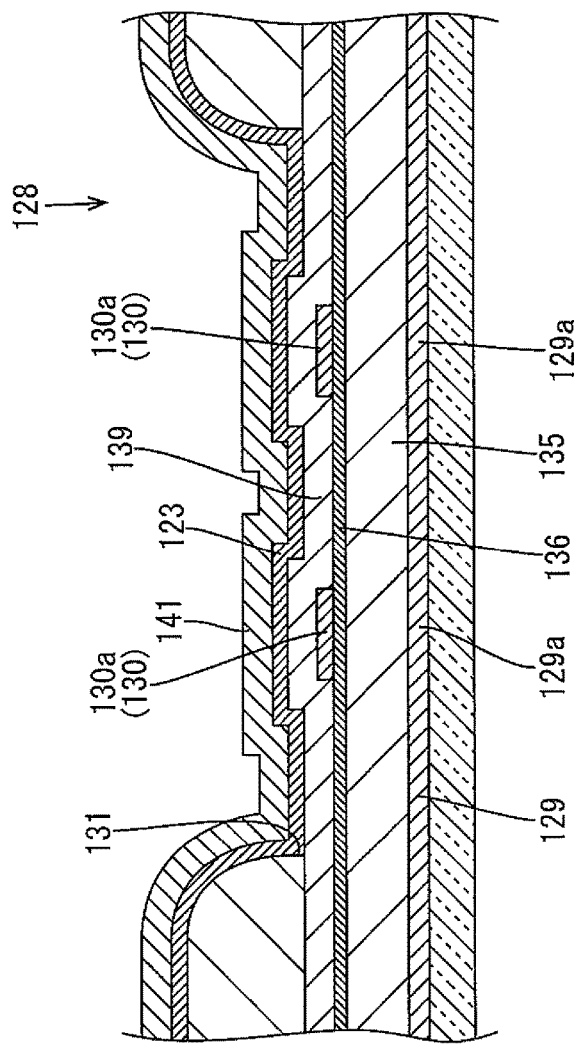
FIG. 27 is a plan view illustrating a layout including a first trace and second traces in a row control circuit and a hole in an organic insulating film according to a sixth modification of the second embodiment.

A sixth modification of the second embodiment will be described with reference to FIG. 27. As illustrated in FIG. 27, in the sixth modification, the semiconductor film 136 is layered over the gate insulating film 135 that is provided between the crossing portions 129a and 130a of the traces 129 and 130. Furthermore, the first transparent electrode film 123 is provided between the first interlayer insulating film 139 and the second interlayer insulating film 141 that are layered over the crossing portions 130a of the second traces 130 which cross the first traces 129. Namely, the semiconductor film 136 is provided between the crossing portions 129a of the first traces 129 and the crossing portions 130a of the second traces 130 in addition to the gate insulating film 135. Furthermore, the crossing portions 130a of the second traces 130 are covered with the first transparent electrode film 123 in addition to the first interlayer insulating film 139 and the second interlayer insulating film 141. With the semiconductor film 136, short circuits due to metal ions produced by the ion migration are less likely to occur between the crossing portions 129a and 130a and thus the operation reliability of the row control circuit 128 further improves. The semiconductor film 136 is a solid fill that is arranged over the areas that overlap the holes 131 and the areas that do not overlap the holes 131. The first transparent electrode film 123 is a solid fill that is arranged over the areas that overlap the holes 131 and the areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Seventh Modification of the Second Embodiment

Figure 28:
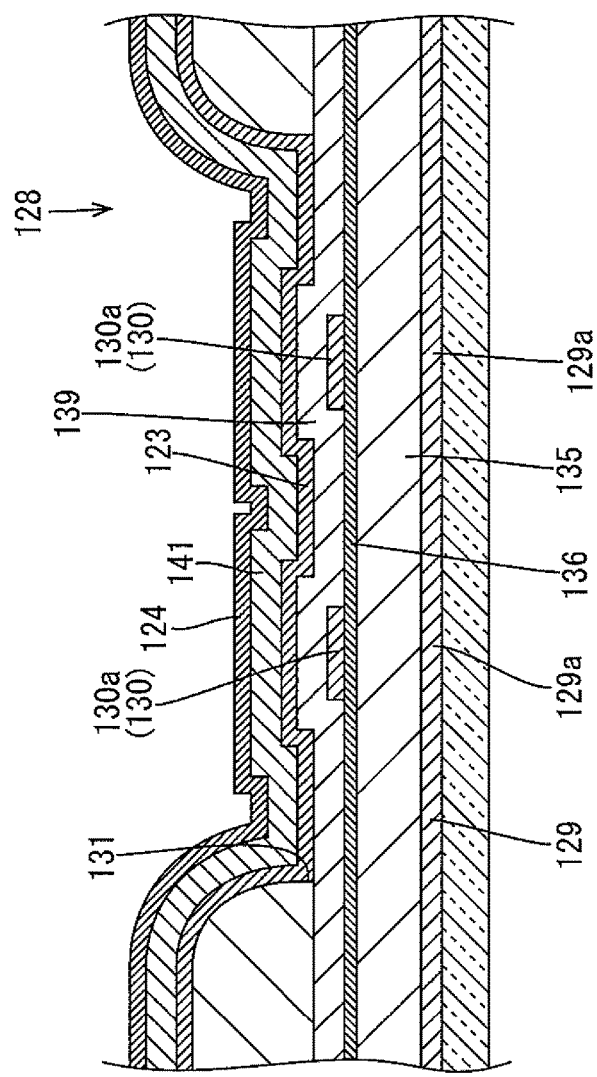
FIG. 28 is a plan view illustrating a layout including a first trace and second traces in a row control circuit and a hole in an organic insulating film according to a seventh modification of the second embodiment.

A seventh modification of the second embodiment will be described with reference to FIG. 28. As illustrated in FIG. 28, in the seventh modification of the second embodiment, the semiconductor film 136 is layered over the gate insulating film 135 that is provided between the crossing portions 129a and 130a of the traces 129 and 130. Furthermore, the first transparent electrode film 123 is provided between the first interlayer insulating film 139 and the second interlayer insulating film 141 that are layered over the crossing portions 130a of the second traces 130 which cross the first traces 129 and the second transparent electrode film 124 is layered over the second interlayer insulating film 141. Namely, the semiconductor film 136 is provided between the crossing portions 129a of the first traces 129 and the crossing portions 130a of the second traces 130 in addition to the gate insulating film 135. Furthermore, the crossing portions 130a of the second traces 130 are covered with the first transparent electrode film 123 and the second transparent electrode film 124 in addition to the first interlayer insulating film 139 and the second interlayer insulating film 141. With the semiconductor film 136, short circuits due to metal ions produced by the ion migration are less likely to occur between the crossing portions 129a and 130a and thus the operation reliability of the row control circuit 128 further improves. The semiconductor film 136 is a solid fill that is arranged over the areas that overlap the holes 131 and the areas that do not overlap the holes 131. The first transparent electrode film 123 and the second transparent electrode film 124 are solid fills that are arranged over the areas that overlap the holes 131 and the areas that do not overlap the holes 131. Therefore, the waterproof performance (moisture resistance) at the crossing portions 130a of the second traces 130 improves. According to the configuration, the ion migration is less likely to occur at the crossing portions 129a and 130a of the traces 129 and 130 and thus the operation reliability of the row control circuit 128 further improves.

Third Embodiment

A third embodiment of the present invention will be described with reference to FIG. 29. This embodiment includes holes 231 formed in areas different from the first embodiment when viewed in plan. Configurations, functions, and effects similar to those of the first embodiment will not be described.

Figure 29:
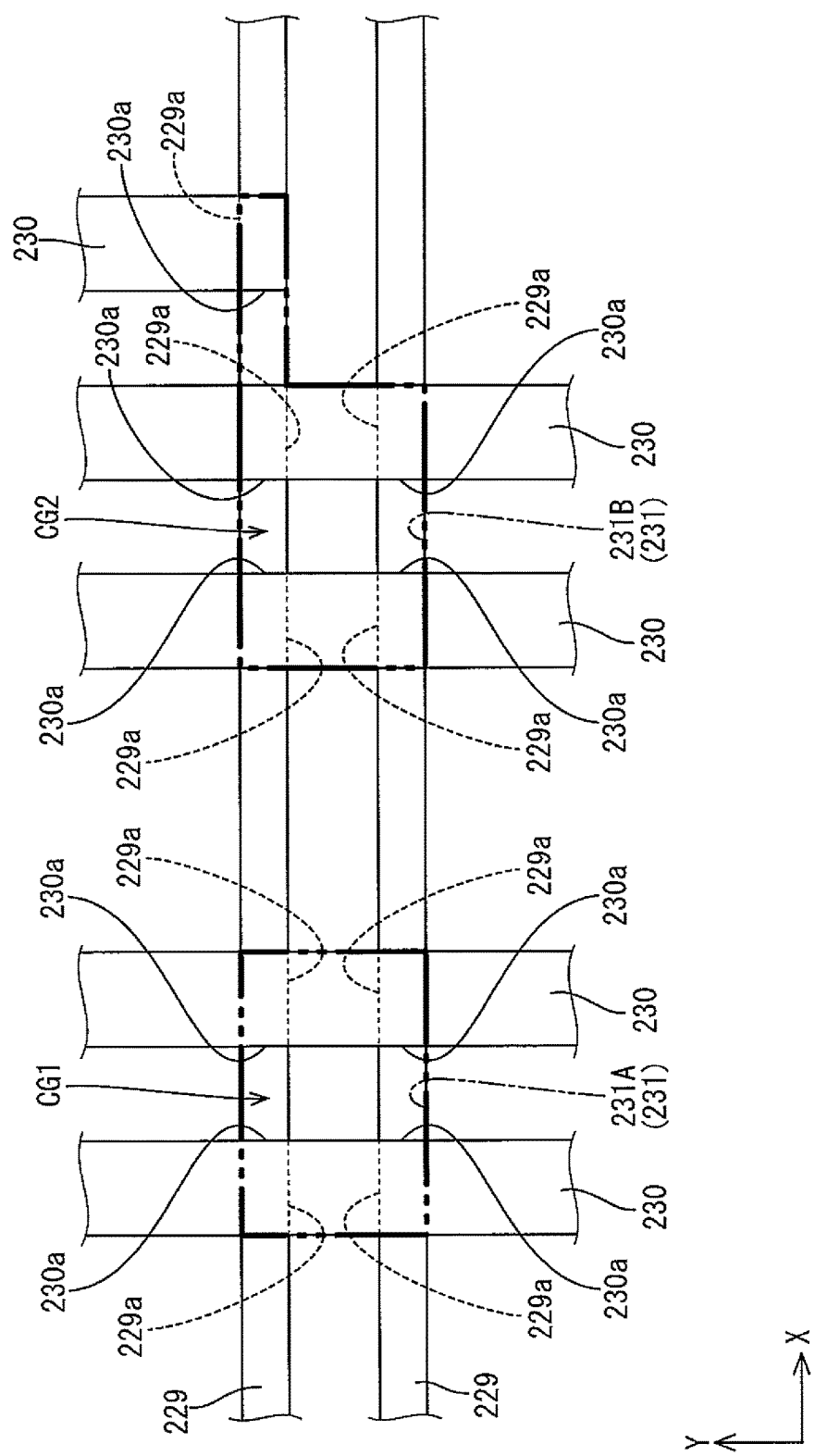
FIG. 29 is a plan view illustrating a layout including first traces and second traces in a row control circuit and holes in an organic insulating film according to a third embodiment of the present invention.

As illustrated in FIG. 29, the areas in which the holes 231 according to this embodiment are formed are smaller than the areas in which the holes 31 of the first embodiment are formed when viewed in plan. Specifically, a first hole 231A included in the holes 231 is formed such that opening edges thereof are on outer edges of crossing portions 229a and 230a included in a first crossing portion group CG1 when viewed in plan. Namely, the first hole 231A is formed in an area that covers multiple (four) crossing portions 229a and 230a included in the first crossing portion group CG1, that is, the opening edges collectively surround the crossing portions 229a and 230a but the area in which the first hole 231A is formed does not extend over areas outside the first crossing portion group CG1. A second hole 231B is formed such that opening edges are on outer edges of the crossing portions 229a and 230a included in a second crossing portion group CG2 when viewed in plan. Namely, the second hole 231G is formed in an area that covers multiple (four) crossing portions 229a and 230a included in the second crossing portion group CG2, that is, the opening edges collectively surround the crossing portions 229a and 230a but the area in which the second hole 231B is formed does not extend over areas outside the second crossing portion group CG2. According to the configuration, the ion migration is properly reduced and thus short circuits are less likely to occur between the crossing portion 229a of first traces 229 and the crossing portions 230a of second traces 230.

Fourth Embodiment

A fourth embodiment of the present invention will be described with reference to FIG. 30. The fourth embodiment includes holes 331 formed in areas different from the first embodiment when viewed in plan. Configurations, functions, and effects similar to those of the first embodiment will not be described.

Figure 30:
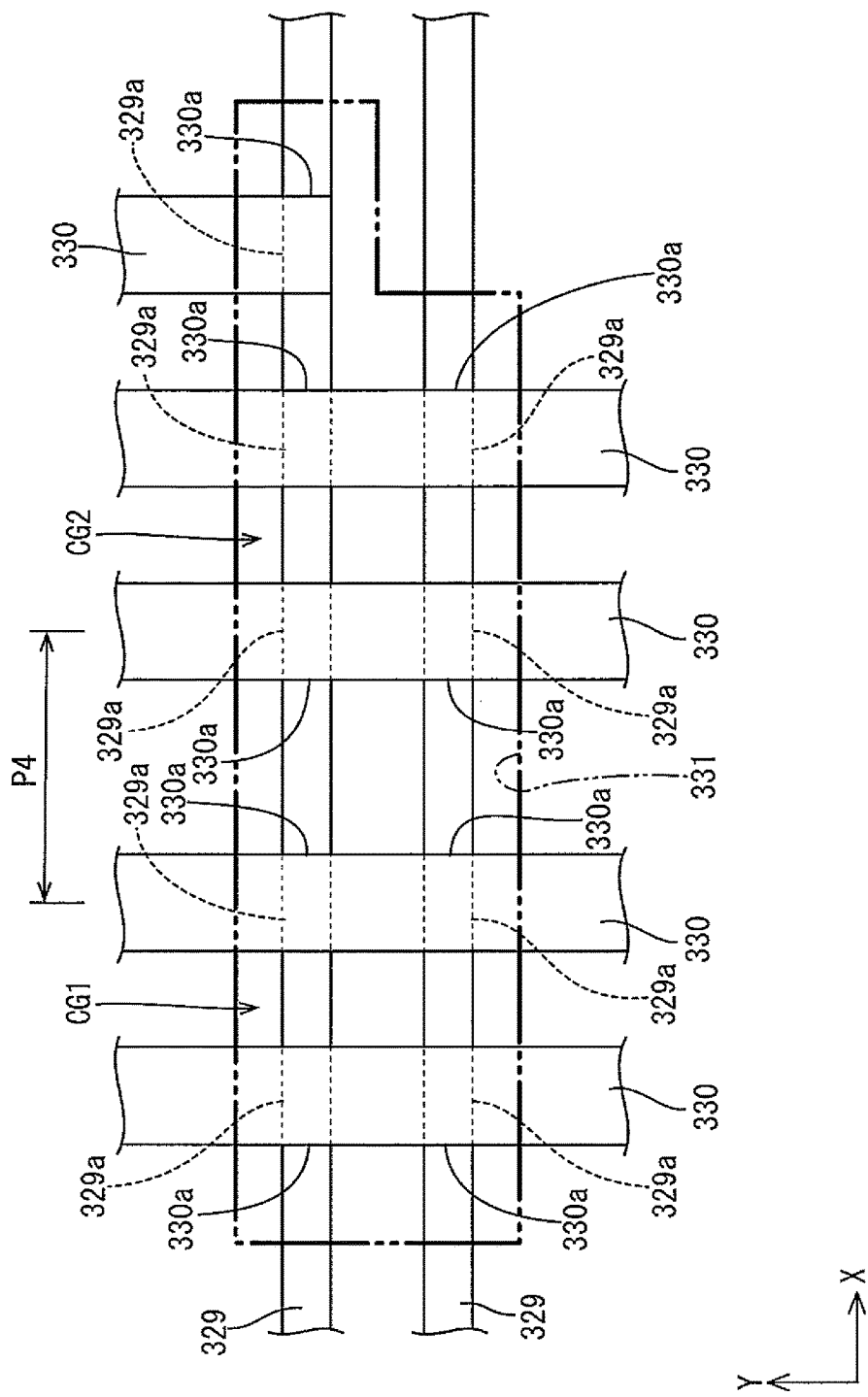
FIG. 30 is a plan view illustrating a layout including first traces and second traces in a row control circuit and a hole in an organic insulating film according to a fourth embodiment of the present invention.

As illustrated in FIG. 30, the areas in which the holes 331 are formed are larger than the areas in which the holes 31 of the first embodiment are formed. Specifically, each of the holes 331 is formed in the area that covers crossing portions 329a and 330a included in a first crossing portion group CG1 and crossing portions 329a and 330a included in a second crossing portion group CG2. Opening edges of the hole 331 collectively surround the crossing portions 329a and 330a included in the first crossing portion group CG1 and the crossing portions 329a and 330a included in the second crossing portion group CG2. An interval between the first crossing portion group CG1 and the second crossing portion group CG2 with respect to the X-axis direction is smaller than the interval P2 between the first crossing portion group CG1 and the second crossing portion group CG2 with respect to the X-axis direction in the first embodiment (see FIG. 9). According to the configuration, if the organic insulating film remains between the first crossing portion group CG1 and the second crossing portion group CG2 with respect to the X-axis direction as in the first embodiment (see FIG. 9), an amount of the remaining organic insulating film is small. Therefore, not only a flattening function and a protecting function of the organic insulating film may not be exerted at proper levels but also moisture from the remaining organic insulating film may be transmitted to the crossing portions 329a and 330a. Because the hole 331 is formed in the area that covers the first crossing portion group CG1 and the second crossing portion group CG2, the transmission of the moisture from the organic insulating film to the crossing portions 329a and 330a is properly reduced. According to the configuration, occurrence of the ion migration can be properly reduced and thus short circuits are less likely to occur between the crossing portions 329a of first traces 329 and the crossing portions 330a of second traces 330.

Fifth Embodiment

A fifth embodiment of the present invention will be described with reference to FIG. 31. This embodiment includes holes 431 formed in areas different from the first embodiment when viewed in plan. Configurations, functions, and effects similar to those of the first embodiment will not be described.

Figure 31:
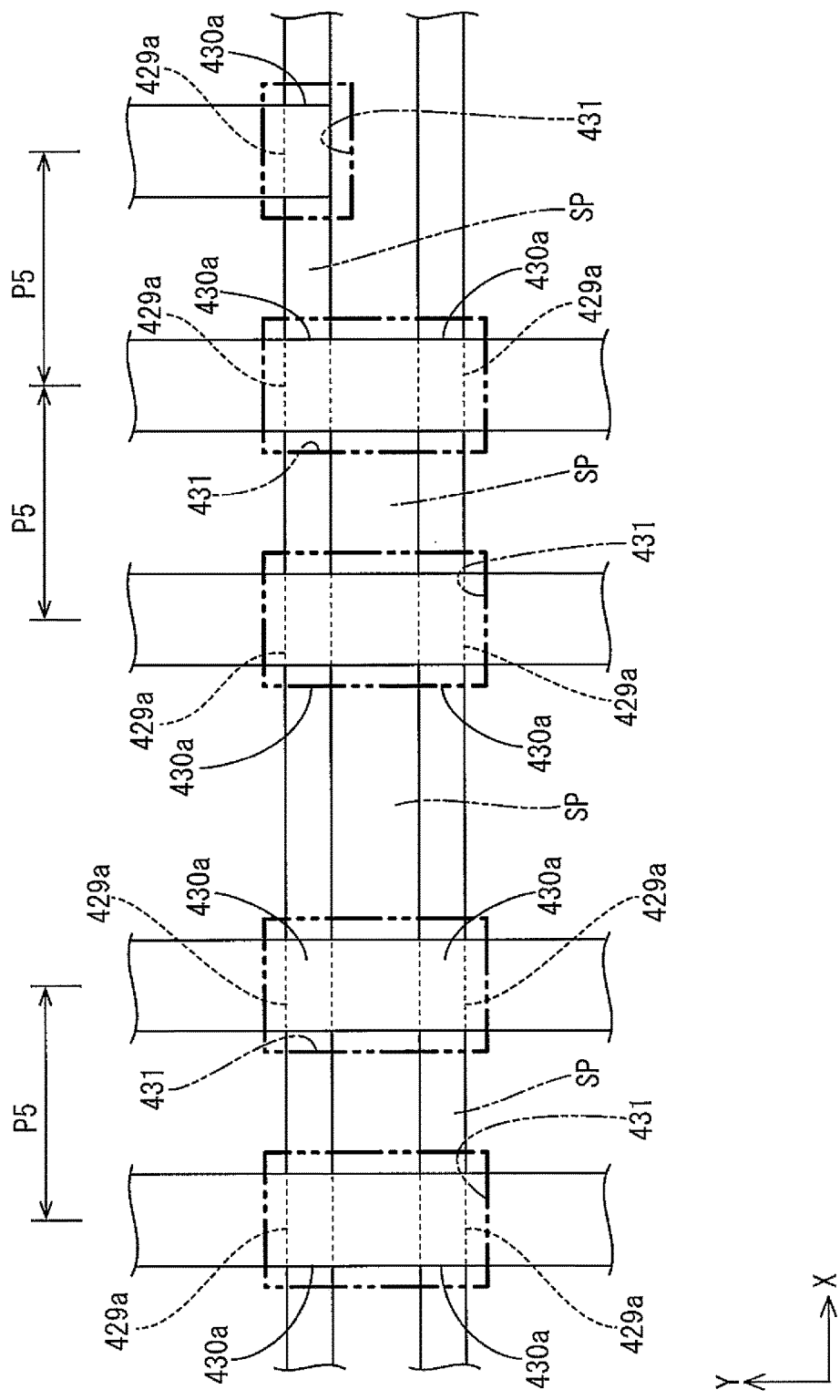
FIG. 31 is a plan view illustrating a layout including first traces and second traces in a row control circuit and holes in an organic insulating film according to a fifth embodiment of the present invention.

As illustrated in FIG. 31, the holes 431 according to this embodiment are provided for every two crossing portions 429a and 430a that are arranged along the X-axis direction. Specifically, each of the holes 431 is formed in the area that covers multiple (two) crossing portions 429a and 430a arranged along the Y-axis direction and the hole 431 is larger than the crossing portions 429a and 430a. The hole 431 at the rightmost in FIG. 31 is larger than one crossing portion 429a and one crossing portion 430a. An organic insulating film includes separating portions SP that separate the holes 431 adjacent to one another with respect to the X-axis direction. The separating portions SP are arranged among the crossing portions 429a and 430a that are arranged in the X-axis direction. A relatively small interval P5 between the crossing portions 429a and 430a in the X-axis direction is larger than the relatively small interval P1 between the crossing portions 29a and 30a in the X-axis direction in the first embodiment described earlier (see FIG. 9). Each hole 31 of the first embodiment is formed in the area that covers multiple crossing portions 29a and 30a that are arranged along the X-axis direction. If this embodiment is configured as such, the organic insulating film is excessively removed and thus the flattening function and the protecting function may be degraded. With the separating portions SP, which are portions of the organic insulating film, remaining among the crossing portions 429a and 430a arranged in the X-axis direction, the flattening function and the protecting function are maintained at proper levels.

Sixth Embodiment

A sixth embodiment of the present invention will be described with reference to FIG. 32. This embodiment includes holes 531 formed in areas different from the first embodiment when viewed in plan. Configurations, functions, and effects similar to those of the first embodiment will not be described.

Figure 32:
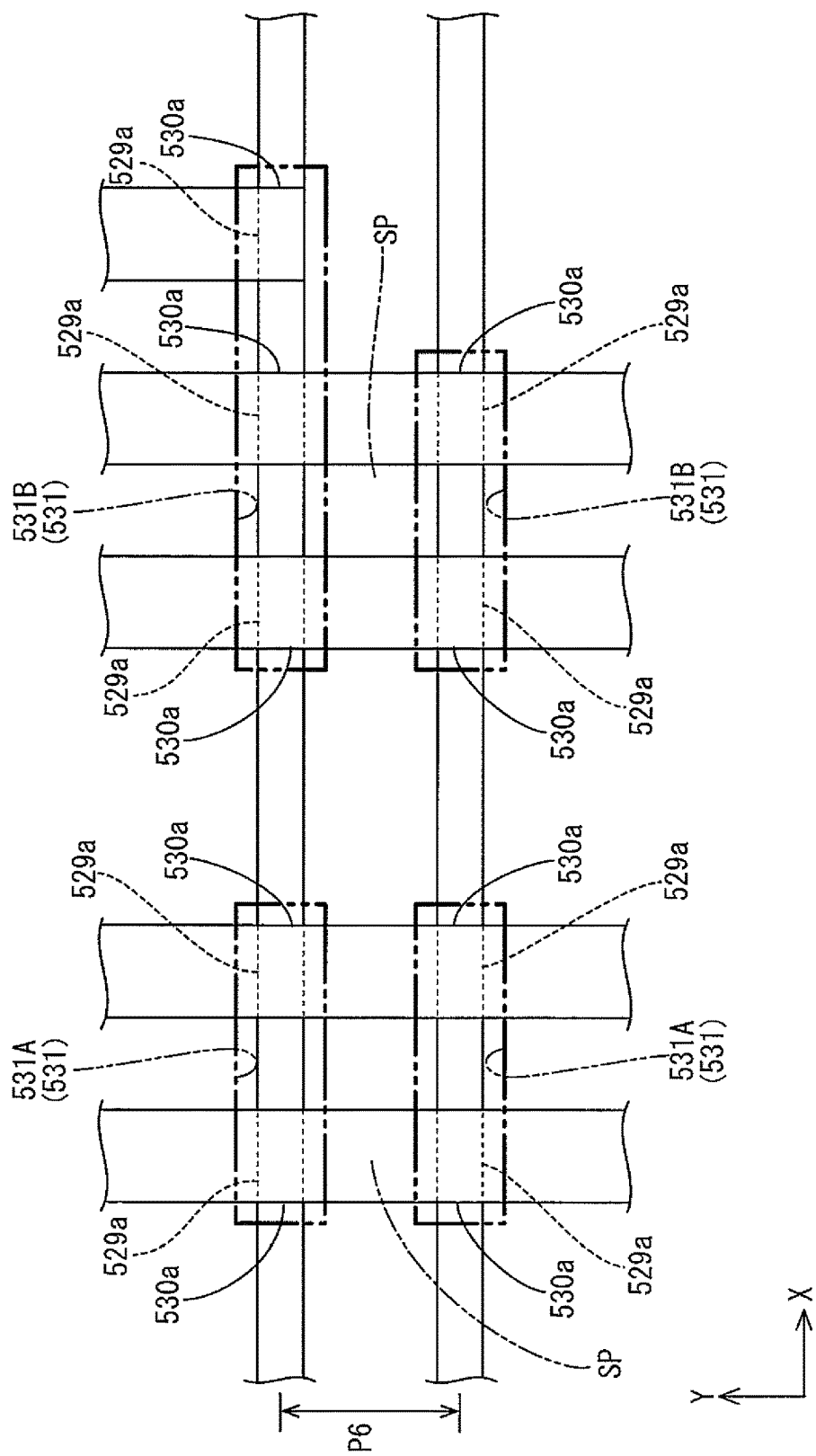
FIG. 32 is a plan view illustrating a layout including first traces and second traces in a row control circuit and holes in an organic insulating film according to a sixth embodiment of the present invention.

As illustrated in FIG. 32, crossing portions 529a and 530a are arranged along the Y-axis direction and first holes 531A and second holes 531B of the holes 531 according to this embodiment are formed every crossing portions 529a and 530a. Specifically, each first hole 531A and each second hole 531B are formed in the area that covers multiple (two or three) crossing portions 529a and 530a arranged along the X-axis direction and are larger than the crossing portions 529a and 530a. An organic insulating film includes separating portions SP that separate the first holes 531A adjacent to one another and the second holes 531B adjacent to one another with respect to the Y-axis direction when viewed in plan. The separating portions SP are arranged among the crossing portions 529a and 530a that are arranged in the Y-axis direction. An interval P6 between the crossing portions 529a and 530a in the Y-axis direction is larger than the interval P3 between the crossing portions 29a and 30a in the Y-axis direction in the first embodiment described earlier (see FIG. 9). Each hole 31 of the first embodiment is formed in the area that covers multiple crossing portions 29a and 30a that are arranged along the Y-axis direction. If this embodiment is configured as such, the organic insulating film is excessively removed and thus the flattening function and the protecting function may be degraded. With the separating portions SP, which are portions of the organic insulating film, remaining among the crossing portions 529a and 530a arranged in the Y-axis direction, the flattening function and the protecting function are maintained at proper levels.

Seventh Embodiment

A seventh embodiment of the present invention will be described with reference to FIG. 33. This embodiment includes holes 631 formed in areas different from the first embodiment when viewed in plan. Configurations, functions, and effects similar to those of the first embodiment will not be described.

Figure 33:
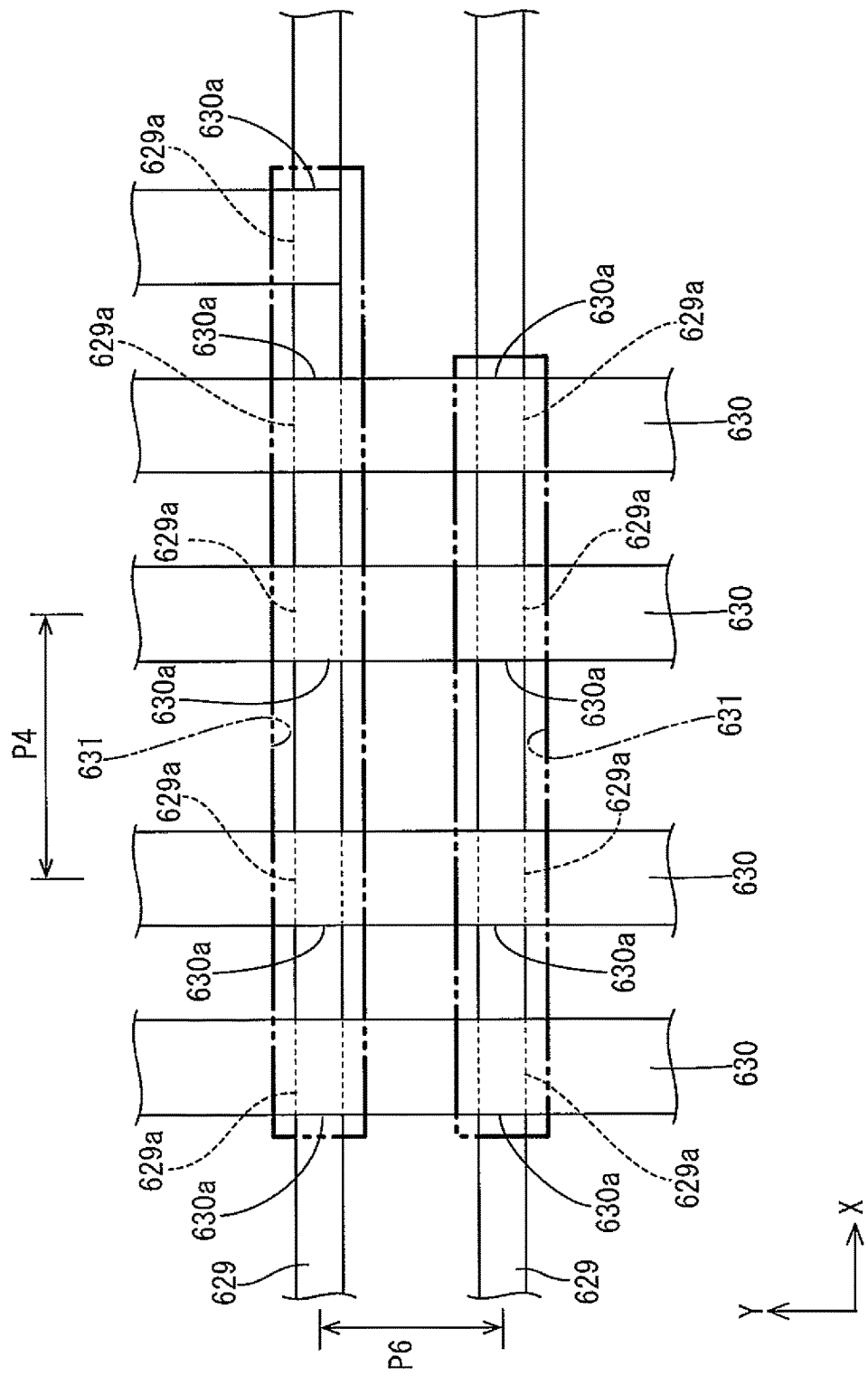
FIG. 33 is a plan view illustrating a layout including first traces and second traces in a row control circuit and holes in an organic insulating film according to a seventh embodiment of the present invention.

As illustrated in FIG. 33, crossing portions 629a and 630a are arranged along the Y-axis direction and the holes 631 according to this embodiment are formed every crossing portions 629a and 630a. Furthermore, each of the holes 631 is formed in the area that covers the crossing portions 629a and 630a included in the first crossing portion group CG1 and the crossing portions 629a and 630a included in the second crossing portion group CG2 with respect to the X-axis direction. Opening edges of each hole 631 collectively surround the crossing portions 629a and 630a included in the first crossing portion group CG1 and the crossing portions 629a and 630a included in the second crossing portion group CG2. The interval P4 between the first crossing portion group CG1 and the second crossing portion group CG2 with respect to the X-axis direction is equal to the interval P4 in the fourth embodiment described earlier (see FIG. 30). According to the configuration, if the organic insulating film remains between the first crossing portion group CG1 and the second crossing portion group CG2 with respect to the X-axis direction as in the first embodiment (see FIG. 9), an amount of the remaining organic insulating film is small. Therefore, not only the flattening function and the protecting function of the organic insulating film may not be exerted at proper levels but also moisture from the remaining organic insulating film may be transmitted to the crossing portions 629a and 630a. Because the hole 631 is formed in the area that covers the first crossing portion group CG1 and the second crossing portion group CG2, the transmission of the moisture from the organic insulating film to the crossing portions 629a and 630a is properly reduced. According to the configuration, occurrence of the ion migration can be properly reduced and thus short circuits are less likely to occur between the crossing portions 629a of first traces 629 and the crossing portions 630a of second traces 630.

Eighth Embodiment

An Eighth embodiment of the present invention will be described with reference to FIG. 34. This embodiment includes holes 731 formed in areas different from the first embodiment when viewed in plan. Configurations, functions, and effects similar to those of the first embodiment will not be described.

Figure 34:
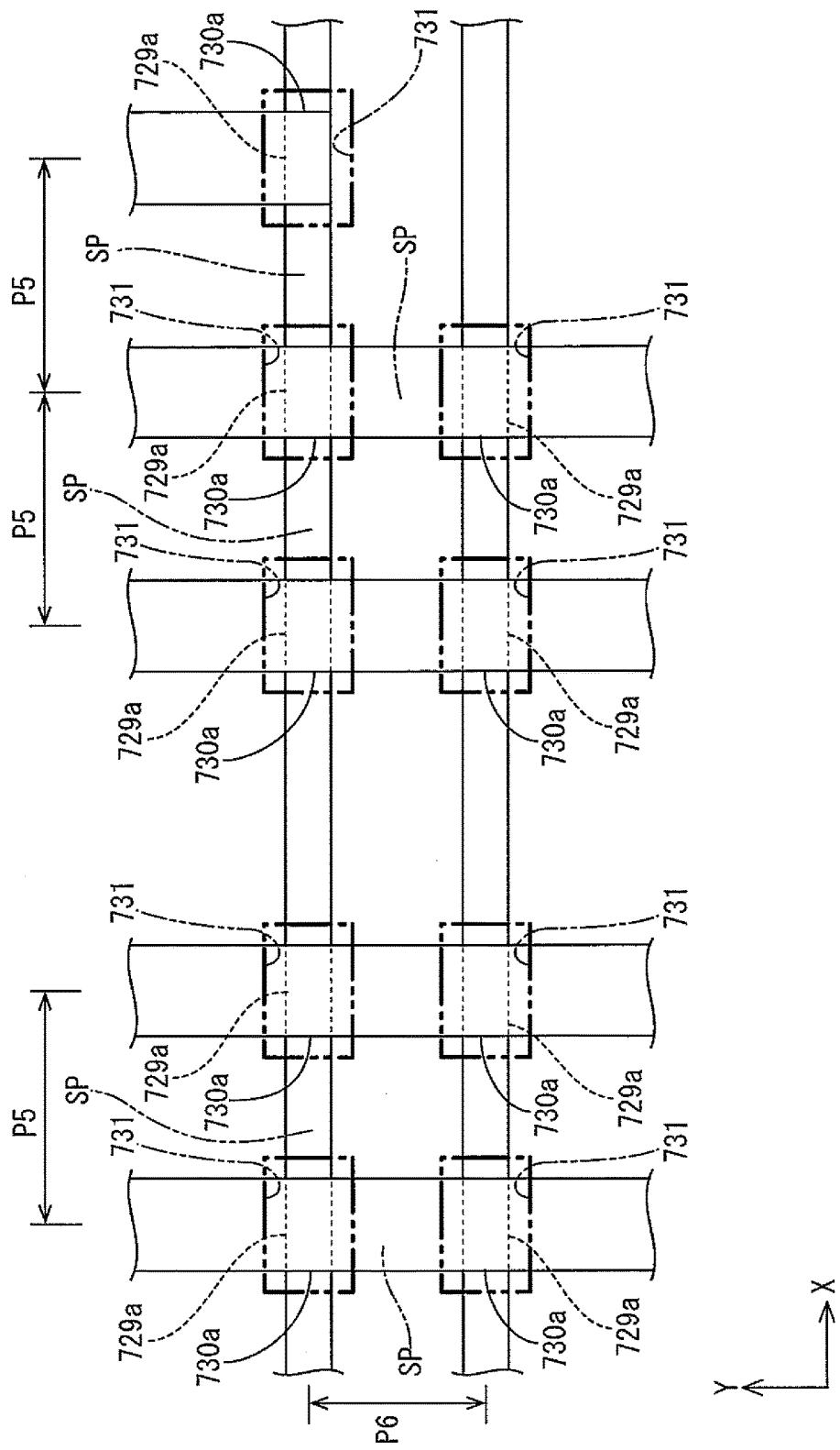
FIG. 34 is a plan view illustrating a layout including first traces and second traces in a row control circuit and holes in an organic insulating film according to an eighth embodiment of the present invention.

As illustrated in FIG. 34, the holes 731 according to this embodiment are formed for every crossing portions 729a and 730a that are arranged along the X-axis direction and Y-axis direction. Specifically, each hole 731 is larger than an area that overlap the crossing portions 729a and 730a. Namely, the hole 731 does not cross over between multiple crossing portions 729a and 730a. An organic insulating film includes separating portions SP that separate the adjacent holes 731 from one another with respect to the X-axis direction and the Y-axis direction when viewed in plan. The separating portions SP are arranged among the crossing portions 729a and 730a that are arranged in the X-axis direction and the Y-axis direction. A relatively small interval P5 between the crossing portions 729a and 730a in the X-axis direction is equal to the interval P5 in the fifth embodiment described earlier (see FIG. 31). An interval P6 between the crossing portions 729a and 730a is equal to the interval P6 in the sixth embodiment described earlier (see FIG. 32). Each hole 31 of the first embodiment is formed in the area that covers multiple crossing portions 29a and 30a that are arranged along the X-axis direction and the Y-axis direction. If this embodiment is configured as such, the organic insulating film is excessively removed and thus the flattening function and the protecting function may be degraded. With the separating portions SP, which are portions of the organic insulating film, remaining among the crossing portions 729a and 730a arranged in the X-axis direction and the Y-axis direction, the flattening function and the protecting function are maintained at proper levels.

Other Embodiments

The present invention is not limited to the embodiments, which have been described using the foregoing descriptions and the drawings. For example, embodiments as described below are also included in the technical scope of the present invention.

(1) The number of the first traces and the second traces and the intervals of the crossing portions (or the first traces or the second traces) with respect to the X-axis direction and the Y-axis direction may be altered from the embodiments described above as appropriate. For example, three or more of the first traces may be arranged along the Y-axis direction or six or more of the second traces or four or less of the second traces may be arranged along the X-axis direction. Furthermore, multiple first traces and only one second trace may be provided or only one first traces and multiple second traces may be provided.

(2) The areas in which the holes are formed when viewed in plan may be altered from the embodiments described above as appropriate. In correspondence with that, the number of the crossing portions inside a single hole (the number of the crossing portions surrounded by the opening edges of the single hole) can be altered as appropriate. For example, each hole may be formed in an area that covers three or more crossing portions arranged in the Y-axis direction or in an area that covers six or more crossing portions arranged in the X-axis direction. The area in which the hole is formed when viewed in plan and the number of the crossing portions within a single hole may be defined with consideration of the intervals of the crossing portions (or the first traces or the second traces).

(3) In each of the above embodiments, the first crossing portion group and the second crossing portion group are adjacent to each other with respect to the X-axis direction. However, the present invention can be applied to a configuration in which three or more first traces are arranged along the Y-axis direction with two different intervals with respect to the Y-axis direction and the first crossing portion group and the second crossing portion group are adjacent to each other with respect to the Y-axis direction. When the configuration of the first embodiment is applied to this configuration, the first hole formed in the area that covers multiple crossing portions included in the first crossing portion group and second hole formed in the area that covers multiple crossing portions included in the second crossing portion group are arranged at a relatively large interval therebetween. Other than that, the configuration in which the first crossing portion group and the second crossing portion group are adjacent to each other with respect to the Y-axis direction may be combined with the configurations of the second to the eighth embodiments as appropriate.

(4) In each of the above embodiments, two crossing portion groups are adjacent to each other with respect to the X-axis direction. The present invention can be applied to a configuration in which three or more first traces and three or more second traces are arranged along the Y-axis direction and the X-axis direction, respectively, with two different intervals with respect to the Y-axis direction and the X-axis direction, two crossing portions are adjacent to each other with respect to the Y-axis direction, two crossing portions are adjacent to each other with respect to the X-axis direction. This configuration may be combined with the configurations of the first to the eighth configurations as appropriate.

(5) In each of the above embodiments, the first interlayer insulating film and the second interlayer insulating film are formed in the areas that overlap at least the holes. However, both or one of the first interlayer insulating film and the second interlayer insulating film may have holes that communicate with the holes in the organic insulating film.

(6) The configurations of the first to the seventh modifications of the first embodiment may be combined with the configurations of the third to the eighth embodiments.

(7) The configurations of the second embodiment and the first to the seventh modifications of the second embodiment may be combined with the configurations of the third to the eighth embodiments.

(8) The configuration of the third embodiment described earlier may be combined with the configurations of the fourth to the eighth embodiments. Especially, when the third embodiment and the eighth embodiment are combined, each hole is formed for every crossing portion and in an area that overlaps each crossing portion.

(9) The wiring structures of the row control circuits arranged on the array substrates in the non-display areas of in the embodiments have been described. Similarly, the present invention can be applied to a wiring structure of the row control circuit arranged on the array substrate in the non-display area. If a circuit other than the row control circuits and the column control circuit is arranged on the array substrate in the non-display area, the present invention can be applied to such a circuit.

(10) The position and the number of the row control circuit(s) on the array substrate may be altered from each of the above embodiments as appropriate. For example, a configuration in which the row control circuit is arranged on the array substrate adjacent to the display area on the right side in FIG. 5 and a configuration in which row control circuits are arranged on the array substrate on the right and the left side of the display area may be included in the scope of the present invention.

(11) The materials of the gate insulating film, the protective film, the first interlayer insulating film, the organic insulating film, and the second interlayer insulating film may be altered from the above embodiments as appropriate. The materials of the transparent electrode films may be altered as appropriate. The base material of the array substrate may be altered from the glass substrate to a synthetic resin substrate.

(12) The gate insulating film in each of the above embodiments is a single layered film. However, films made of different materials may be laminated. For example, the gate insulating film may have a laminated structure including a lower gate insulating film made of silicon nitride (SiNx) and an upper gate insulating film made of silicon oxide (SiO2, that is, a laminated structure with a laminating sequence opposite from that of the first interlayer insulating film.

(13) The In—Ga—Zn—O semiconductor is used for the oxide semiconductor to form the semiconductor film in each of the above embodiments. However, other kinds of oxide semiconductors may be used. For example, a Zn—O semiconductor (ZnO), an In—Zn—O semiconductor (IZO (registered trademark)), a Zn—Ti—O semiconductor (ZTO), a Cd—Ge—O semiconductor, a Cd—Pb—O semiconductor, a CdO (cadmium oxide), a Mg—Zn—O semiconductor, an In—Sn—Zn—O semiconductor (e.g., In2O3—SnO2—ZnO), and an In—Ga—Sn—O semiconductor may be included. Amorphous silicon or polysilicon may be used for the semiconductor film as a material thereof other than the oxide semiconductor. When the polysilicon is used, continuous grain silicon (CG silicon) is preferable.

(14) The first metal film and the second metal film in each of the above embodiments are laminated films of titanium (Ti) and copper (Cu). However, instead of titanium, molybdenum (Mo), molybdenum nitride (MoN), titanium nitride (TiN), tungsten (W), niobium (Nb), molybdenum-titanium alloy (MoTi), or molybdenum-tungsten alloy (MoW) may be used. Other than that, a single-layered metal film made of titanium, copper, or aluminum may be used.

(15) In each of the above embodiments, the liquid crystal panel includes the FFS mode as an operation mode. However, a liquid crystal panel including the IPS (in-plane switching) mode or the VA (vertical alignment) mode as an operation mode may be included in the scope of the present invention. If the liquid crystal panel includes the VA mode as an operation mode, a common electrode (a counter electrode) may be formed on the CF substrate rather than the array substrate.

(16) In each of the above embodiments, the display area on the liquid crystal panel is centered with respect to the short-side direction but off-centered with respect to the long-side direction toward one of the ends. However, a liquid crystal panel including a display area that is centered with respect to the long-side direction but off-centered with to the short-side direction toward one of the ends may be included in the scope of the present invention. Furthermore, a liquid crystal panel including a display area that is off-centered with respect to the long-side direction toward one of the ends and off-centered with respect to the short-side direction toward one of the ends may be included in the scope of the present invention. Furthermore, a liquid crystal panel including a display area that is centered with respect to the long-side direction and the short-side direction may be included in the scope of the present invention.

(17) The driver is mounted directly on the array substrate by the COG method in the above embodiments. However, the driver mounted on the flexible printed circuit board connected to the array board through ACF may be included in the scope of the present invention.

(18) In each of the above embodiments, the column control circuit and the row control circuit are arranged on the array board in the non-display area. However, any of the column control circuit and the row control circuit may be omitted and the function thereof may be performed by the driver.

(19) Each of the embodiments includes the liquid crystal panel having a vertically-long rectangular shape. However, the present invention can be applied to a liquid crystal panel having a horizontally-long rectangular shape or a square shape.

(20) A configuration including the liquid crystal panel in each of the above embodiments and a functional panel such as a touch panel or a parallax barrier panel (switch liquid crystal panel) attached to the liquid crystal panel may be included in the scope of the present invention. Furthermore, a configuration including a touch panel pattern directly formed on a liquid crystal panel may be included in the scope of the present invention.

(21) In each of the above embodiments, the backlight device in the liquid crystal display device is the edge-light type. However, a liquid crystal display device including a direct backlight device may be included in the scope of the present invention.

(22) Each of the above embodiments includes the transmissive type liquid crystal display device including the backlight device as an external light source. However, the present invention can be applied to a reflective liquid crystal display device configured to display images using external light. Such a display device does not require a backlight device. Furthermore, the present invention can be applied to a semi-transmissive type liquid crystal display device.

(23) Each of the above embodiments includes the TFTs as switching components of the liquid crystal display device. However, the present invention can be applied to switching components other than the TFTs (e.g., thin film diodes (TFDs)). Furthermore, the present invention can be applied to a liquid crystal display device configured to display black and white images other than the liquid crystal display device configured to display color images.

(24) In each of the above embodiments, the liquid crystal panel is used for the display panel. The present invention can be applied to a display device including other type of display panel (a PDP (plasma display panel) or an organic EL panel). Such a display device may not require the backlight unit.

(25) In each of the above embodiments, the gate electrodes in the display area TFTs branch off from the gate traces and the channels include the extending portions that do not overlap the gate electrodes when viewed in plan. However, the channel may be configured such that entire areas thereof overlap the gate electrodes that branch off from the gate traces.

(26) The above embodiments include the liquid crystal panels that are classified as small sized or small to middle sized panels. Such liquid crystal panels are used in electronic devices including PDAs, mobile phones, laptop computers, digital photo frames, portable video games, and electronic ink papers. However, the present invention can be applied to liquid crystal panels that are classified as middle sized or large sized (or supersized) panels having screen sizes from 20 inches to 90 inches. Such display panels may be used in electronic devices including television devices, electronic signboards (digital signage), and electronic blackboard.

EXPLANATION OF SYMBOLS

11: liquid crystal panel (display panel), 11a: CF substrate (counter substrate), 11b, 111b: array substrate (substrate), 11c: liquid crystal layer (liquid crystals), 11j: sealing member, 17, 117: display area TFT (thin film transistor), 23: first transparent electrode film (transparent electrode film), 24: second transparent electrode film (transparent electrode film), 28, 128: row control circuit, 29, 129, 229, 329, 629: first trace, 29a, 129a, 229a, 329a, 429a, 529a, 629a, 729a: crossing portion, 31, 231, 331, 431, 531, 631, 731: hole, 31A, 231A, 531A: first hole, 31B, 231B, 531B: second hole, 35, 135: gate insulating film (insulating film), 36, 136: semiconductor film, 37: protective film, 39: first interlayer insulating film, 40: organic insulating film, 41: second interlayer insulating film, AA: display area, NAA: non-display area, P1 to P6: arrangement interval (interval)

The invention claimed is:
1. A display device comprising:
   a substrate comprising a display area and a non-display area, the display area being for displaying images and located in a central portion of the substrate, the non-display area being located in an outer portion of the substrate and surrounding the display area;
   a circuit arranged in the non-display area;
   a first trace is a component of the circuit;
   a second trace is a component of the circuit and arranged over the first trace so as to cross the first trace;
   an insulating film arranged between the first trace and the second trace; and
   an organic insulating film arranged over the second trace and including a hole formed in an area larger than an area overlapping at least crossing portions of the first trace and the second trace, the organic insulating film being made of organic resin.

2. The display device according to claim 1, further comprising:
   a counter substrate opposed to the substrate;
   liquid crystals sandwiched between the substrate and the counter substrate; and
   a sealing member provided between the substrate and the counter substrate, surrounding the liquid crystals, and sealing the liquid crystals, wherein
   the circuit is arranged closer to the sealing member than to the display area.

3. The display device according to claim 1, further comprising a first interlayer insulating film arranged between the organic insulating film and the second trace and in an area that overlaps at least the hole.

4. The display device according to claim 3, further comprising a transparent electrode film arranged over the organic insulating film in an area that overlaps at least the hole.

5. The display device according to claim 4, wherein
   the transparent electrode film includes a first transparent insulating film and a second transparent insulating film, the first transparent insulating film being in a lower layer and the second transparent insulting film being in an upper layer, and
   the display device further comprises a second interlayer insulating film arranged between the first transparent electrode film and the second transparent electrode film and in an area that overlaps at least the hole.

6. The display device according to claim 1, further comprising a protective film arranged between the second trace and the insulating film and in an area that overlaps at least the hole.

7. The display device according to claim 1, wherein the first trace and the second trace contain at least copper.

8. The display device according to claim 1, further comprising a thin film transistor using an oxide semiconductor for a semiconductor film thereof, wherein
   the circuit includes the semiconductor film arranged between the second trace and the insulating film.

9. The display device according to claim 8, wherein the oxide semiconductor contains indium (In), gallium (Ga), zinc (Zn), and oxygen (O).

10. A display device comprising:
    a substrate comprising a display area and a non-display area, the display area being for displaying images and located in a central portion of the substrate, the non-display area being located in an outer portion of the substrate and surrounding the display area;
a circuit arranged in the non-display area;
a first trace is a component of the circuit;
a second trace is a component of the circuit and arranged over the first trace so as to cross the first trace;
an insulating film arranged between the first trace and the second trace; and
an organic insulating film arranged over the second trace and including a hole in an area overlapping at least crossing portions of the first trace and the second trace, the organic insulating film being made of organic resin, wherein
at least one of the first trace and the second trace includes a plurality of traces such that at least three crossing portions are arranged at intervals,
the hole of the organic insulating film includes at least a first hole and a second hole, and
the first hole is defined in an area that covers at least two crossing portions arranged at an interval that is relatively small, and the second hole is defined in an area that covers at least two crossing portions arranged at an interval that is relatively large and not overlapping the first hole.

11. A display device comprising:
a substrate including a display area and a non-display area, the display area being for display images and located in a central portion of the substrate, the non-display area being located in an outer portion of the substrate and surrounding the display area;
a circuit in the non-display area;
a first trace that is a component of the circuit;
a second trace that is a component of the circuit and extends over the first trace so as to cross the first trace;
an insulating film between the first trace and the second trace; and
an organic insulating film extending over the second trace and including a hole in an area overlapping at least crossing portions of the first trace and the second trace, the organic insulating film including an organic resin, wherein
at least one of the first trace and the second trace includes a plurality of traces such that the crossing portions are arranged at intervals, and
the hole of the organic insulting film is defined in an area that covers at least a plurality of the crossing portions.

12. The display device according to claim 11, further comprising:
a counter substrate opposed to the substrate;
liquid crystals sandwiched between the substrate and counter substrate, and
a sealing member between the substrate and the counter substrate, surrounding the liquid crystals, and sealing the liquid crystals, wherein
the circuit is closer to the sealing member than to the display area.

13. The display device according to claim 11, further comprising a first interlayer insulting film between the organic insulating film and the second trace and in an area that overlaps at least the hole.

14. The display device according to claim 13, further comprising a transparent electrode film over the organic insulating film in an area that overlaps at least the hole.

15. The display device according to claim 13, wherein
the transparent electrode film includes a first transparent insulating film and a second transparent insulating film, the first transparent insulating film being in a lower layer and the second transparent insulating film being in an upper layer, and
the display device further comprises a second interlayer insulating film between the first transparent electrode film and the second transparent electrode film and in an area that overlaps at least the hole.

16. The display device according to claim 11, further comprising a protective film between the second trace and the insulating film and in an area that overlaps at least the hole.

17. The display device according to claim 11, wherein the first trace and the second trace include at least copper.

18. The display device according to claim 11, further comprising a thin film transistor including an oxide semiconductor for a semiconductor film thereof, wherein
the circuit includes the semiconductor film between the second trace and the insulating film.

19. The display device according to claim 18, wherein the oxide semiconductor contains indium (In), gallium (Ga), zinc (Zn), and oxygen (O).

* * * * *